US012812867B2

(12) United States Patent
Nakaki et al.

(10) Patent No.: US 12,812,867 B2
(45) Date of Patent: Nov. 24, 2026

(54) MEMORY DEVICE

(71) Applicant: Kioxia Corporation, Tokyo (JP)

(72) Inventors: Hiroshi Nakaki, Yokkaichi Mie (JP); Yasuhiro Uchiyama, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 447 days.

(21) Appl. No.: 18/497,435

(22) Filed: Oct. 30, 2023

(65) Prior Publication Data

US 2024/0064986 A1 Feb. 22, 2024

Related U.S. Application Data

(63) Continuation of application No. PCT/JP2021/019228, filed on May 20, 2021.

(51) Int. Cl.

*H10B 43/35* (2023.01)
*H10B 43/10* (2023.01)
*H10B 43/27* (2023.01)
*H10B 43/40* (2023.01)

(52) U.S. Cl.

CPC ............. *H10B 43/35* (2023.02); *H10B 43/10* (2023.02); *H10B 43/27* (2023.02); *H10B 43/40* (2023.02)

(58) Field of Classification Search

CPC ......... H10B 43/35; H10B 43/27; H10B 43/40
See application file for complete search history.

(56) References Cited

U.S. PATENT DOCUMENTS

2011/0309432 A1 12/2011 Ishihara et al.
2020/0075622 A1* 3/2020 Fujii ...................... H10B 41/35
2020/0303402 A1* 9/2020 Kobayashi ............ H10B 43/10
2020/0402999 A1* 12/2020 Nakaki .................. H10B 43/10

FOREIGN PATENT DOCUMENTS

JP 2012-009512 A 1/2012

* cited by examiner

*Primary Examiner* — Chad M Dicke
*Assistant Examiner* — Valerie N Newton
(74) *Attorney, Agent, or Firm* — Maier & Maier, PLLC

(57) ABSTRACT

According to one embodiment, a memory device includes: a first conductive layer; a first conductive film extending in a first direction above the first conductive layer; a first semiconductor film extending in the first direction between the first conductive layer and the first conductive film and intersecting the first conductive layer; a second semiconductor film that is in contact with the first semiconductor film, extends in the first direction between the first conductive layer and the first conductive film, and faces the first conductive film; a first insulating film provided between the first conductive layer and the first semiconductor film; and a second insulating film provided between the first conductive film and each of the first semiconductor film and the second semiconductor film.

19 Claims, 40 Drawing Sheets

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

MEMORY DEVICE

CROSS-REFERENCE TO RELATED APPLICATIONS

This application is a Continuation Application of PCT Application No. PCT/JP2021/019228, filed May 20, 2021, the entire contents of which are incorporated herein by reference.

FIELD

Embodiments described herein relate generally to a memory device.

BACKGROUND

A NAND flash memory is known as a memory device for storing data in a non-volatile manner. A memory device such as a NAND flash memory employs a three-dimensional memory structure to increase the capacity and the degree of integration.

DETAILED DESCRIPTION

Figure 1:
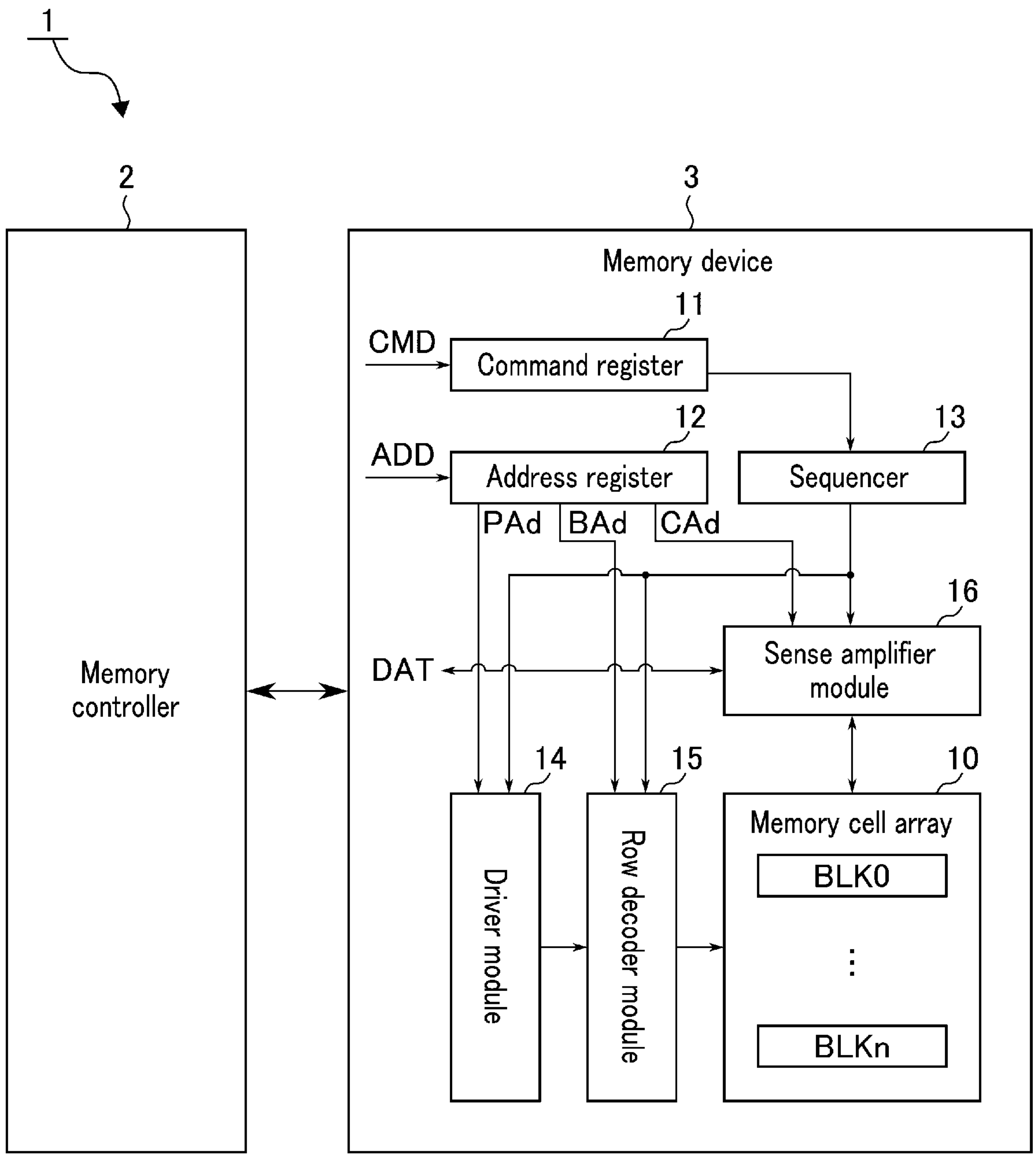
FIG. 1 is a block diagram showing a configuration of a memory system according to a first embodiment.

According to one embodiment, a memory device includes: a first conductive layer; a first conductive film extending in a first direction above the first conductive layer; a first semiconductor film extending in the first direction between the first conductive layer and the first conductive film and intersecting the first conductive layer; a second semiconductor film that is in contact with the first semiconductor film, extends in the first direction between the first conductive layer and the first conductive film, and faces the first conductive film; a first insulating film provided between the first conductive layer and the first semiconductor film; and a second insulating film provided between the first conductive film and each of the first semiconductor film and the second semiconductor film.

Hereinafter, embodiments will be described with reference to the accompanying drawings. The dimensions, scales, etc., used in the drawings are not binding on actual products.

Note that in the following description, the same reference numerals denote components having almost the same functions and configurations. Especially when components having the same or substantially the same configuration are to be distinguished from each other, different characters or numerals may be added to the common reference symbol.

1. First Embodiment

A memory device according to a first embodiment will be described.

1.1 Configuration

First, a configuration of the memory device according to the first embodiment will be described.

1.1.1 Memory System

FIG. 1 is a block diagram for explaining a configuration of a memory system according to the first embodiment. The memory system here is a storage device adapted for connection with an external host device (not shown). The memory system is, for example, a memory card such as an SD™ card, a universal flash storage (UFS) device, and a solid state drive (SSD). A memory system 1 includes a memory controller 2 and a memory device 3.

The memory controller 2 is configured as, for example, an integrated circuit such as a system-on-a-chip (SoC). The memory controller 2 controls the memory device 3 based on a request from the host device. More specifically, for example, the memory controller 2 writes data which the host device has requested the memory controller 2 to write to the memory device 3. Also, the memory controller 2 reads data which the host device has requested the memory controller 2 to read from the memory device 3 and transmits the data to the host device.

The memory device 3 is a memory that stores data in a nonvolatile manner. The memory device 3 is, for example, a NAND flash memory.

Communication between the memory controller 2 and the memory device 3 is based on, for example, a single data rate (SDR) interface, a toggle double data rate (DDR) interface, or an open NAND flash interface (ONFI).

1.1.2 Memory Device

Hereinafter, an internal configuration of the memory device according to the first embodiment will be described with reference to the block diagram shown in FIG. 1. The memory device 3 includes a memory cell array 10, a command register 11, an address register 12, a sequencer 13, a driver module 14, a row decoder module 15, and a sense amplifier module 16.

The memory cell array 10 includes a plurality of blocks BLK0 through BLKn (where n is an integer equal to or greater than 1). A block BLK is a group of a plurality of memory cells capable of storing data in a non-volatile manner, and is used as, for example, a data erasure unit. The memory cell array 10 is provided with a plurality of bit lines and a plurality of word lines. In one example, each memory cell is associated with one bit line and one word line. The detailed configuration of the memory cell array 10 will be described later.

The command register 11 stores a command CMD received by the memory device 3 from the memory controller 2. Examples of the command CMD include instructions to cause the sequencer 13 to conduct read, write, and erase operations, etc.

The address register 12 stores address information ADD received by the memory device 3 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the operation of the entire memory device 3. For example, the sequencer 13 controls the driver module 14, the row decoder module 15, the sense amplifier module 16, and the like based on the command CMD stored in the command register 11, thereby executing the write operation, the read operation, the erase operation, and the like.

The driver module 14 generates a voltage to be used in the read operation, the write operation, the erase operation, and the like. Then, the driver module 14 applies the generated voltage to a signal line corresponding to a selected word line based on, for example, the page address PAd stored in the address register 12.

Based on the block address BAd stored in the address register 12, the row decoder module 15 selects one corresponding block BLK in the memory cell array 10. Then, for example, the row decoder module 15 transfers the voltage that has been applied to the signal line corresponding to the selected word line to this selected word line in the selected block BLK.

The sense amplifier module 16, in a write operation, applies a certain voltage to each bit line in accordance with write data DAT received from the memory controller 2. In a read operation, the sense amplifier module 16 determines data stored in a memory cell based on the voltage of the bit line, and transfers the determination result to the memory controller 2 as the data DAT.

1.1.3 Circuit Configuration of Memory Cell Array

Figure 2:
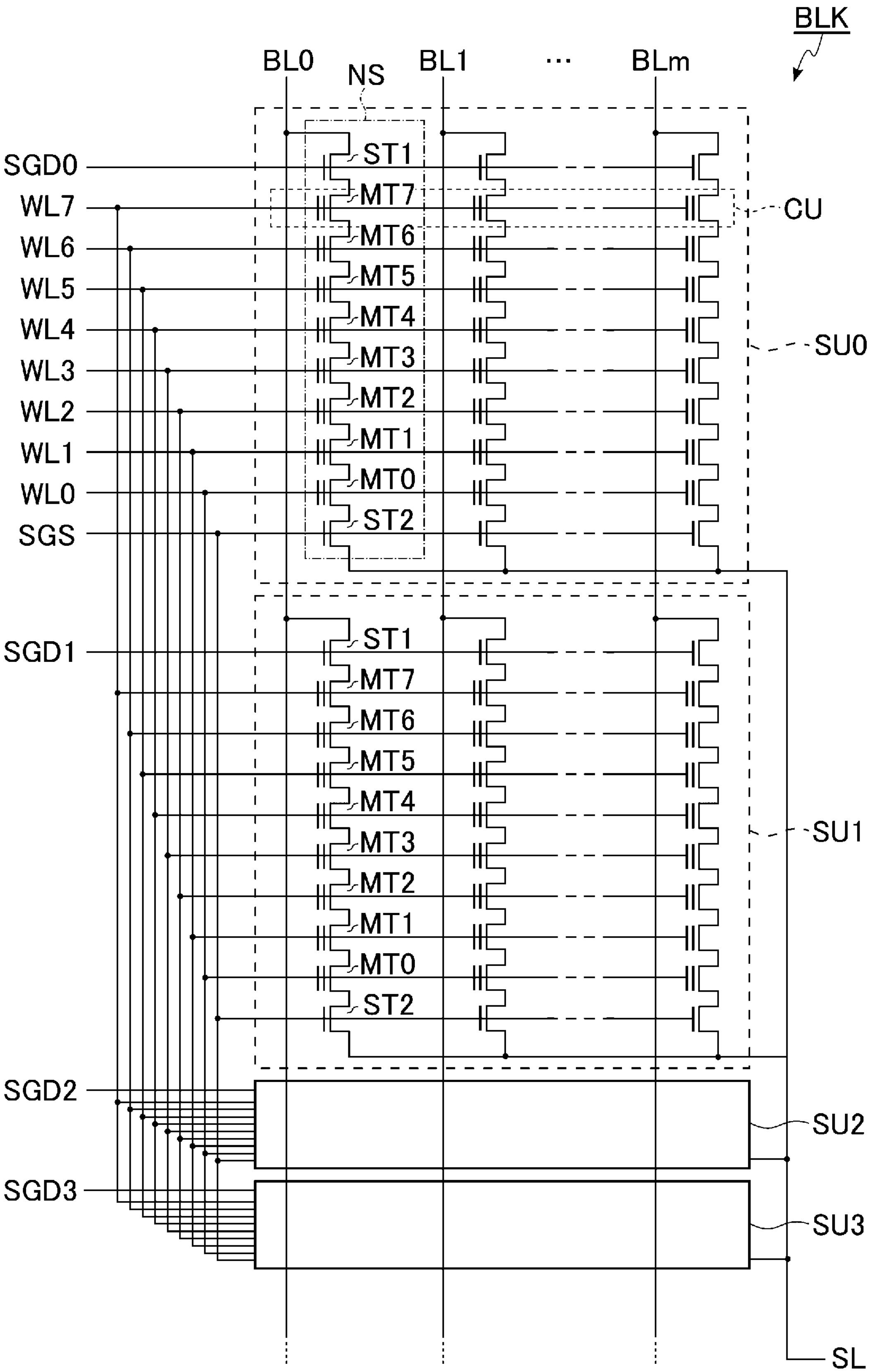
FIG. 2 is a circuit diagram showing an example of a circuit configuration of a memory cell array according to the first embodiment.

FIG. 2 is a circuit diagram showing an example of a circuit configuration of the memory cell array provided in the memory device of the first embodiment. FIG. 2 shows one block BLK of the plurality of blocks BLK included in the memory cell array 10. As shown in FIG. 2, the block BLK includes, for example, four string units SU0 to SU3.

Each string unit SU includes a plurality of NAND strings NS associated with respective bit lines BL0 through BLm (m is an integer equal to or greater than 1). The NAND strings NS each include, for example, memory cell transistors MT0 through MT7 and select transistors ST1 and ST2. Each memory cell transistor MT includes a control gate and a charge accumulating film, and stores data in a non-volatile manner. The select transistors ST1 and ST2 are each used to select a string unit SU in various operations.

In each NAND string NS, the memory cell transistors MT0 through MT7 are coupled in series. A drain of the select transistor ST1 is coupled to a bit line BL associated therewith, and a source of the select transistor ST1 is coupled to one end of a set of memory cell transistors MT0 through MT7 coupled in series. A drain of the select transistor ST2 is coupled to the other end of the set of memory cell transistors MT0 through MT7 coupled in series. A source of the select transistor ST2 is coupled to a source line SL.

Control gates of the memory cell transistors MT0 through MT7 in the same block BLK are respectively coupled to the word lines WL0 through WL7. Gates of the select transistors ST1 in the string units SU0 through SU3 are respectively coupled to the select gate lines SGD0 through SGD3. Gates of the select transistors ST2 are coupled to a select gate line SGS.

The bit lines BL0 through BLm are assigned respective column addresses differing from one another. Each bit line BL is shared by the NAND strings NS to which the same column address is assigned among a plurality of blocks BLK. The word lines WL0 through WL7 are provided for each block BLK. The source line SL is shared by, for example, a plurality of blocks BLK.

A set of memory transistors MT coupled to a common word line WL in each string unit SU is referred to as, for example, a "cell unit CU". For example, the storage capacity of the cell unit CU including the memory cell transistors MT each of which stores 1-bit data is defined as "1-page data". The cell unit CU can have a storage capacity of 2-page data or more in accordance with the number of bits of data to be stored in the memory cell transistors MT.

Note that the circuit configuration of the memory cell array 10 provided in the memory device 3 according to the first embodiment is not limited to the above described configuration. For example, the number of string units SU included in each block BLK can be designed to be any number. The number of memory cell transistors MT and the number of select transistors ST1 and ST2 included in each NAND string NS can be designed to be any numbers.

1.1.4 Structure of Memory Cell Array

An example of the structure of the memory cell array included in the memory device according to the first embodiment will be described below. Note that in the drawings to be referred to below, an X direction corresponds to the extending direction of the word line WL. A Y direction corresponds to the extending direction of the bit line BL. A Z direction corresponds to a direction vertical to the surface of a semiconductor substrate used to form the memory device 3. In the plan views, hatching is appropriately added to make the drawing easier to view. The hatching added to the plan views is not necessarily associated with the material or characteristics of a component to which the hatching is added. In the sectional views, some components are appropriately omitted to make the drawing easier to view.

1.1.4.1 Planar Layout

Figure 3:
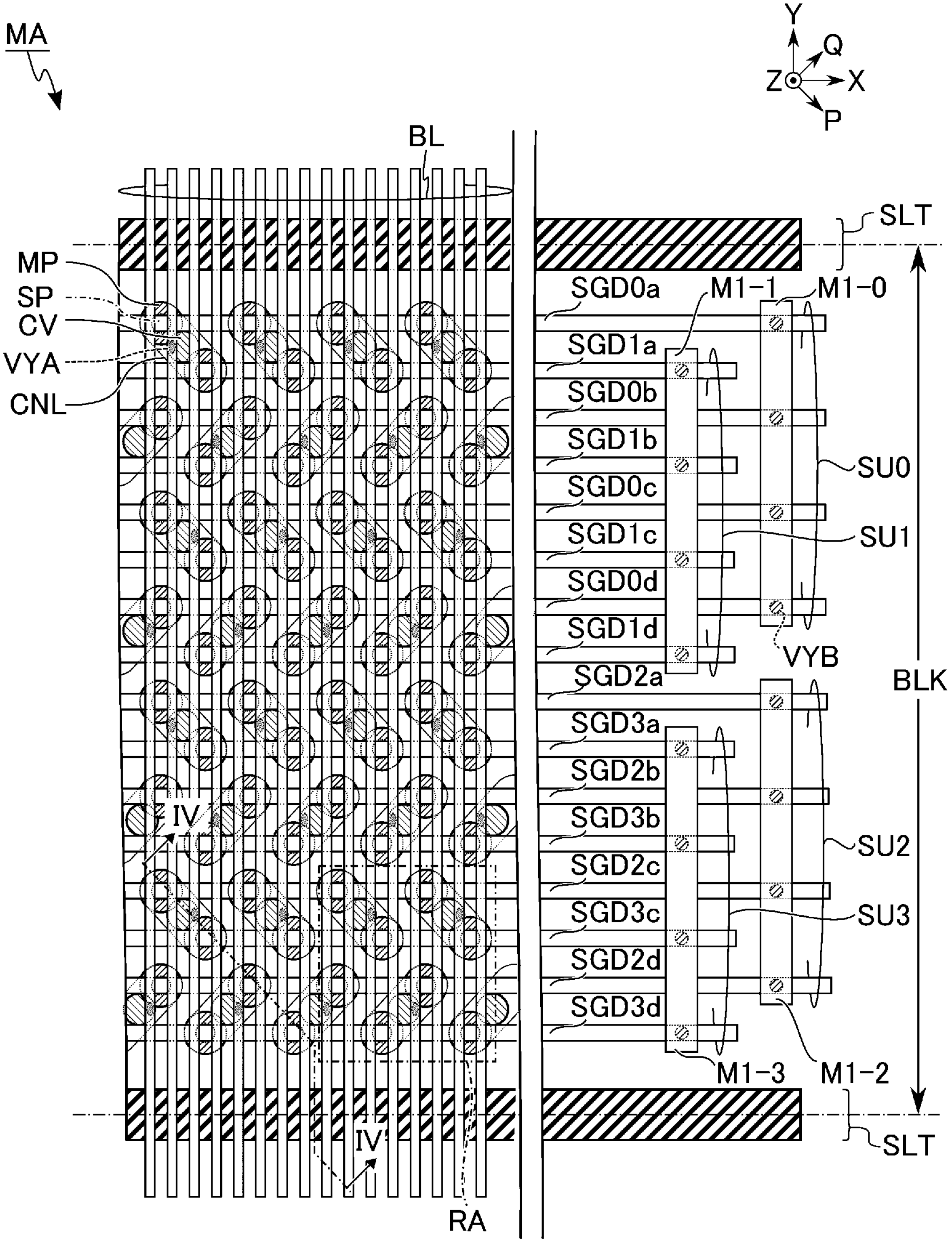
FIG. 3 is a plan view showing an example of a planar layout of the memory cell array according to the first embodiment.

FIG. 3 is a plan view showing an example of a planar layout of the memory cell array according to the first embodiment. FIG. 3 shows a region including one block BLK (that is, string units SU0 through SU3).

As shown in FIG. 3, the memory cell array 10 includes one block BLK and two members SLT sandwiching the block BLK. In addition, the memory cell array 10 includes a plurality of memory pillars MP, a plurality of interconnects M1, a plurality of current path selection portions CNL, a plurality of contacts CV, VYA, and VYB, a plurality of selection gate lines SGD0 through SGD3, and a plurality of bit lines BL.

The memory pillar MP includes a pillar-shaped electrode SP. The select gate line SGD0 includes a plurality of sub-select gate lines SGD0*a*, SGD0*b*, SGD0*c*, and SGD0*d*. The select gate line SGD1 includes a plurality of sub-select gate lines SGD1*a*, SGD1*b*, SGD1*c*, and SGD0*d*. The select gate line SGD2 includes a plurality of sub-select gate lines SGD2*a*, SGD2*b*, SGD2*c*, and SGD2*d*. The select gate line SGD3 includes a plurality of sub-select gate lines SGD3*a*, SGD3*b*, SGD3*c*, and SGD3*d*. The plurality of interconnects M1 include interconnects M1-0, M1-1, M1-2, and M1-3.

Each of the memory pillars MP functions as, for example, one NAND string NS. In the region between the two adjacent members SLT, the plurality of memory pillars MP are arranged in, for example, a staggered pattern of sixteen rows. The pillar-shaped electrode SP is provided in a central portion of the memory pillar MP in a plan view.

The plurality of sub-select gate lines SGD0*a* through SGD3*d* each extend in the X direction and are arranged in the Y direction. The sub-select gate lines SGD0*a* through SGD3*d* are electrically coupled to the corresponding pillar-shaped electrodes SP, respectively. In the example of FIG. 3, the sub-select gate lines SGD0*a* through SGD0*d* are electrically coupled to the pillar-shaped electrodes SP arranged in the first row, the third row, the fifth row, and the seventh row, respectively. The sub-select gate lines SGDla through SGD0*d* are electrically coupled to the pillar-shaped electrodes SP arranged in the second row, the fourth row, the sixth row, and the eighth row, respectively. The sub-select gate lines SGD2*a* through SGD2*d* are electrically coupled to the pillar-shaped electrodes SP arranged in the ninth row, the eleventh row, the thirteenth row, and the fifteenth row, respectively. The sub-select gate lines SGD3*a* through SGD3*d* are electrically coupled to the pillar-shaped electrodes SP arranged in the tenth row, the twelfth row, the fourteenth row, and the sixteenth row, respectively.

The interconnects M1 are disposed in a region where the memory pillars MP are not provided. Each of the interconnects M1 extends in the Y direction. To be specific, the interconnect M1-0 is electrically coupled to the sub-select gate lines SGD0*a* through SGD0*d* via the contacts VYB. The interconnect M1-1 is electrically coupled to the sub-select gate lines SGD1*a* through SGD1*d* via the contacts VYB. The interconnect M1-2 is electrically coupled to the sub-select gate lines SGD0*a* through SGD2*d* via the contacts VYB. The interconnect M1-3 is electrically coupled to the sub-select gate lines SGD3*a* through SGD3*d* via the contacts VYB.

That is, the memory pillars MP commonly coupled to the interconnect M1-0 via the sub-select gate lines SGD0*a* through SGD0*d* are included in the string unit SU0. The memory pillars MP commonly coupled to the interconnect M1-1 via the sub-select gate lines SGD1*a* through SGD0*d* are included in the string unit SU1. The memory pillars MP commonly coupled to the interconnect M1-2 via the sub-select gate lines SGD2*a* through SGD2*d* are included in the string unit SU2. The memory pillars MP commonly coupled to the interconnect M1-3 via the sub-select gate lines SGD3*a* through SGD3*d* are included in the string unit SU3.

Each of the current path selection portions CNL extends in a direction different from the X direction in an XY plane above the memory pillar MP. Each of the current path selection portions CNL is arranged to intersect the memory pillars MP respectively arranged in the rows adjacent to each other. In the drawings referred to below, directions in which the current path selection portions CNL extend in the XY plane are defined as a P direction and a Q direction. That is, the P direction and the Q direction are directions intersecting the X direction and parallel to the XY plane.

In the example of FIG. 3, each of the current path selection portions CNL is arranged so as to intersect a total of two memory pillars MP respectively arranged in the two adjacent rows. Specifically, the current path selection portion CNL arranged to intersect the memory pillar MP arranged in the i-th row and the memory pillar MP arranged in the (i+1)-th row extends in the P direction (i=1, 5, 9, and 13). The current path selection portion CNL arranged to intersect the memory pillar MP arranged in the j-th rows and the memory pillar MP arranged in the (j+1)-th row extends in the Q direction (j=3, 7, 11, and 15). In a case where the memory pillars MP are arranged in a staggered manner, the P direction and the Q direction also intersect the Y direction.

Each of the contacts CV is provided to correspond to one current path selection portion CNL. Each of the contacts CV is disposed between two memory pillars MP electrically coupled by the current path selection portion CNL among the corresponding current path selection portions CNL.

Each of the contacts VYA is provided to correspond to one contact CV. Each of the contacts VYA is arranged to overlap the corresponding contact CV.

The plurality of bit lines BL each extend in the Y direction, and are arranged in the X direction. Each bit line BL is electrically coupled to the corresponding current path selection portion CNL via the contacts VYA and CV. In the example of FIG. 3, each bit line BL is arranged so as to overlap two contacts VYA in each block BLK. That is, in the example of FIG. 3, each bit line BL is electrically coupled to four memory pillars MP via two contacts VYA in each block BLK. The four memory pillars MP electrically coupled to one bit line BL in each block BLK are included in mutually different string units SU0 through SU3.

1.1.4.2 Cross-Sectional Structure

Figure 4:
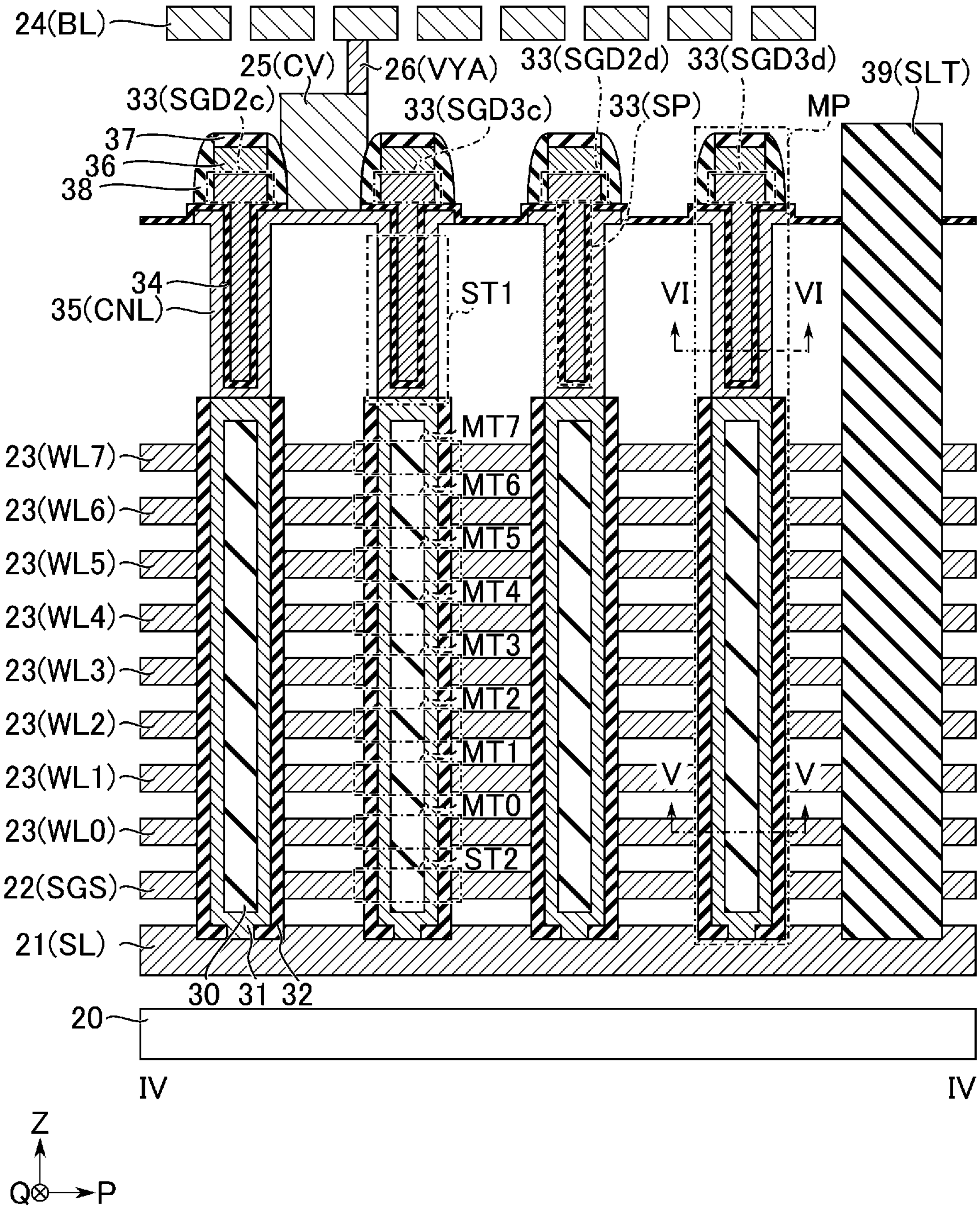
FIG. 4 is a cross-sectional view taken along line IV-IV and showing an example of a cross-sectional structure of the memory cell array according to the first embodiment.

FIG. 4 is a cross-sectional view taken along line IV-IV and showing an example of a cross-sectional structure of the memory cell array according to the first embodiment. As shown in FIG. 4, the memory cell array 10 further includes a semiconductor substrate 20 and conductive layers 21 through 26.

The semiconductor substrate 20 is, for example, a silicon substrate. The conductive layer 21 is provided above the semiconductor substrate 20 via an intervening insulating layer (not shown). The conductive layer 21 is, for example, formed in a plate shape spreading along the XY plane. The conductive layer 21 is used as the source line SL. The conductive layer 21 contains, for example, silicon doped with phosphorus.

Although not shown, circuits corresponding to, for example, the row decoder module 15 and the sense amplifier module 16, are provided in the semiconductor substrate 20 and in the insulating layer between the semiconductor substrate 20 and the conductive layer 21.

The conductive layer 22 is provided above the conductive layer 21 via an intervening insulating layer (not shown). In one example, the conductive layer 22 is formed in a plate shape spreading along the XY plane. The conductive layer 22 serves as the select gate line SGS. The conductive layer 22 contains, for example, tungsten.

Above the conductive layer 22, insulating layers (not shown) and the conductive layers 23 are alternately stacked. In one example, the conductive layer 23 is formed in a plate shape spreading along the XY plane. The stacked conductive layers 23 are used as word lines WL0 through WL7, respectively, sequentially from the side of the semiconductor substrate 20. The conductive layers 23 contain, for example, tungsten.

The conductive layers 24 are provided above the uppermost conductive layer 23 via an intervening insulating layer (not shown). Each of the conductive layers 24 is formed, for example, in a line shape extending in the Y direction. The conductive layer 24 is used as the bit line BL. The conductive layer 24 contains, for example, copper.

Each of the memory pillars MP extends in the Z direction. Each memory pillar MP penetrates the conductive layers 22 and 23. The lower end of each memory pillar MP is in contact with the conductive layer 21. The upper end of each memory pillar MP is located between the uppermost conductive layer 23 and the conductive layer 24.

A portion where each memory pillar MP and the conductive layer 22 intersect functions as the select transistor ST2. A portion where each memory pillar MP and one conductive layer 23 intersect functions as one memory cell transistor MT.

Each memory pillar MP includes, for example, a core film 30, a semiconductor film 31, a stacked film 32, a conductive film 33, an insulating film 34, a semiconductor film 35, a conductive layer 36, an insulating layer 37, and an insulating film 38.

The core film 30 extends in the Z direction. For example, the upper end of the core film 30 is located above the uppermost conductive layer 23. The lower end of the core film 30 is located above the conductive layer 21. The semiconductor film 31 surrounds the core film 30. A portion of the semiconductor film 31 is in contact with the conductive layer 21 in a lower portion of the memory pillar MP. The stacked film 32 covers the side surface and the bottom surface of the semiconductor film 31 excluding a portion where the semiconductor film 31 and the conductive layer 21 are in contact. The upper end of the stacked film 32 is aligned with the upper end of the semiconductor film 31. The core film 30 contains, for example, an insulator made of silicon oxide, etc. The semiconductor film 31 contains, for example, silicon.

The conductive film 33 includes a portion extending in the Z direction and a portion extending in the X direction. The portion of the conductive film 33 extending in the Z direction functions as a pillar-shaped electrode SP. The portion of the conductive film 33 extending in the X direction functions as one of the sub-select gate lines SGD0*a* to SGD3*d*. In the illustrated region, four conductive films 33 respectively including portions functioning as the sub-select gate lines SGD2*c*, SGD3*c*, SGD2*d*, and SGD3*d* are indicated. The lower end of the portion of the conductive film 33 extending in the Z direction is not in contact with the upper end of the semiconductor film 31. The upper end of the portion of the conductive film 33 extending in the Z direction is in contact with and continuous with the lower end of the portion of the same conductive film 33 extending in the X direction. The conductive film 33 contains, for example, silicon doped with boron.

The insulating film 34 includes a portion extending in the Z direction and a portion spreading in the XY plane. The portion of the insulating film 34 extending in the Z direction covers the side surface and the bottom surface of the portion of the conductive film 33 extending in the Z direction. The upper end of the portion of the insulating film 34 extending in the Z direction is in contact with and continuous with the lower end of the portion of the insulating film 34 spreading in the XY plane. The portion of the insulating film 34 spreading in the XY plane is located below the portion of the conductive film 33 extending in the X direction. The insulating film 34 contains, for example, an insulator made of silicon oxide, etc.

The semiconductor film 35 includes a portion extending in the Z direction and a portion extending in the P direction or the Q direction. In the illustrated region, one semiconductor film 35 having a portion extending in the P direction and two semiconductor films 35 having a portion extending in the Q direction are indicated. The portion of the semiconductor film 35 extending in the Z direction covers the bottom surface and the side surface of the portion of the insulating film 34 extending in the Z direction. The lower end of the portion of the semiconductor film 35 extending in the Z direction is in contact with the upper end of the semiconductor film 31. The upper end of the portion of the semiconductor film 35 extending in the Z direction is in contact with and continuous with the lower end of the portion of the semiconductor film 35 extending in the P direction or the Q direction. The portion of the semiconductor film 35 extending in the P direction or the Q direction is shared by two memory pillars MP. The semiconductor film 35 contains, for example, silicon. A portion of the memory pillar MP, in which the conductive film 33, the insulating film 34, and the semiconductor film 35 extend in the Z direction, functions as the select transistor ST1. For this reason, the semiconductor film 35 in which the portion extending in the P direction or the Q direction is shared by the two memory pillars MP functions as the current path selection portion CNL for causing a current to flow to one of the two memory pillars MP.

The conductive layer 36 is provided on the upper surface of the portion of the conductive film 33 extending in the X direction. The conductive layer 36 contains, for example, tungsten or tungsten silicide and titanium nitride.

The insulating layer 37 is provided on the upper surface of the conductive layer 36. The insulating film 38 is provided on the side surfaces of the portion of the conductive film 33 extending in the X direction, the conductive layer 36, and the insulating layer 37. The insulating layer 37 and the insulating film 38 contain, for example, silicon nitride.

The members SLT include an insulating film 39. The insulating film 39 separates the conductive layers 22 and 23. The lower end of the insulating film 39 reaches the conductive layer 21.

The conductive layer 25 is provided on the upper surface of the portion of the semiconductor film 35 extending in the P direction or the Q direction. The conductive layer 26 is provided on the upper surface of the conductive layer 25. The conductive layers 25 and 26 are used as the contacts CV and VYA, respectively. In the illustrated region, one contact CV and one contact VYA corresponding to the portion of the semiconductor film 35 extending in the P direction are indicated. One conductive layer 24 is provided on the upper surface of the conductive layer 26. The conductive layer 24 functions as the bit line BL.

Figure 5:
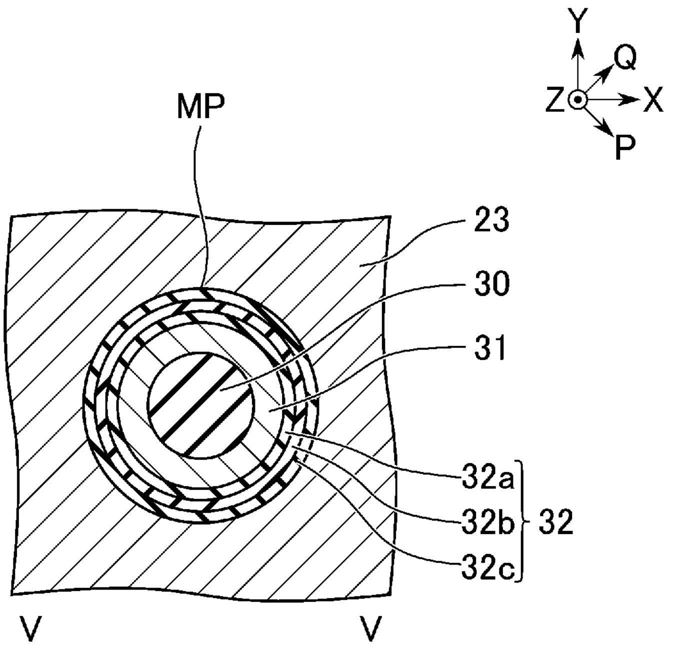
FIG. 5 is a cross-sectional view taken along line V-V and showing an example of a cross-sectional structure of a memory cell transistor in the memory cell array according to the first embodiment.

FIG. 5 is a cross-sectional view taken along line V-V and showing an example of a cross-sectional structure of the memory cell transistor in the semiconductor memory device according to the first embodiment. More specifically, FIG. 5 includes a cross-sectional structure of the memory pillar MP in a layer parallel to the surface of the semiconductor substrate 20 and including the conductive layer 23. As shown in FIG. 5, the stacked film 32 includes, for example, a tunnel insulating film 32*a*, a charge accumulating film 32*b*, and a block insulating film 32*c*.

In the cross section including the conductive layer 23, the core film 30 is provided, for example, in the central portion of the memory pillar MP. The semiconductor film 31 surrounds the side surface of the core film 30. The tunnel insulating film 32*a* surrounds the side surface of the semiconductor film 31. The charge accumulating film 32*b* surrounds the side surface of the tunnel insulating film 32*a*. The block insulating film 32*c* surrounds the side surface of the charge accumulating film 32*b*. The conductive layer 23 surrounds the side surface of the block insulating film 32*c*.

The semiconductor film 31 is used as a current path of the memory cell transistors MT0 through MT7 and the select transistor ST2. The tunnel insulating film 32*a* and the block insulating film 32*c* contain, for example, silicon oxide. The charge accumulating film 32*b* has a function of accumulating electric charges and contains, for example, silicon nitride.

Figure 6:
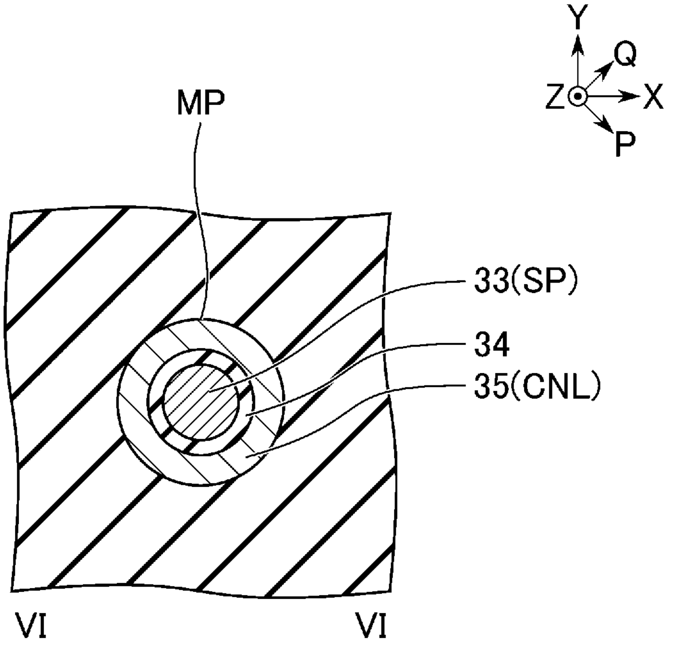
FIG. 6 is a cross-sectional view taken along line VI-VI and showing an example of a cross-sectional structure of a select transistor in the memory cell array according to the first embodiment.

FIG. 6 is a cross-sectional view taken along line VI-VI and showing an example of a cross-sectional structure of a select transistor in the semiconductor memory device according to the first embodiment. More specifically, FIG. 6 includes a cross-sectional structure of the memory pillar MP in a layer parallel to the surface of the semiconductor substrate 20 and including a portion in which the conductive film 33, the insulating film 34, and the semiconductor film 35 extend in the Z direction.

As shown in FIG. 6, the portion of the conductive film 33 extending in the Z direction is provided, for example, in the central portion of the memory pillar MP. The portion of the insulating film 34 extending in the Z direction surrounds the side surface of the portion of the conductive film 33 extending in the Z direction. The portion of the semiconductor film 35 extending in the Z direction surrounds the side surface of the portion of the insulating film 34 extending in the Z direction. The portion of the semiconductor film 35 extending in the Z direction is surrounded by an insulator.

The portion of the semiconductor film 35 extending in the Z direction is used as a current path of the select transistor ST1. With these components, the memory pillars MP are each capable of functioning as one NAND string NS.

1.2 Manufacturing Method

Each of FIGS. 7 through 17 is a diagram showing an example of a planar layout and a cross-sectional structure halfway through the manufacturing of the memory device according to the first embodiment. Each of FIGS. 7 through 17 includes a portion (A) showing a planar layout and a portion (B) showing a cross-sectional structure. The planar layout shown in the drawings corresponds to a region RA in FIG. 3. The cross-sectional structure shown in the drawings corresponds to FIG. 4. An example of steps of manufacturing the memory cell array 10 in the memory device 3 will be described below.

Figure 7:
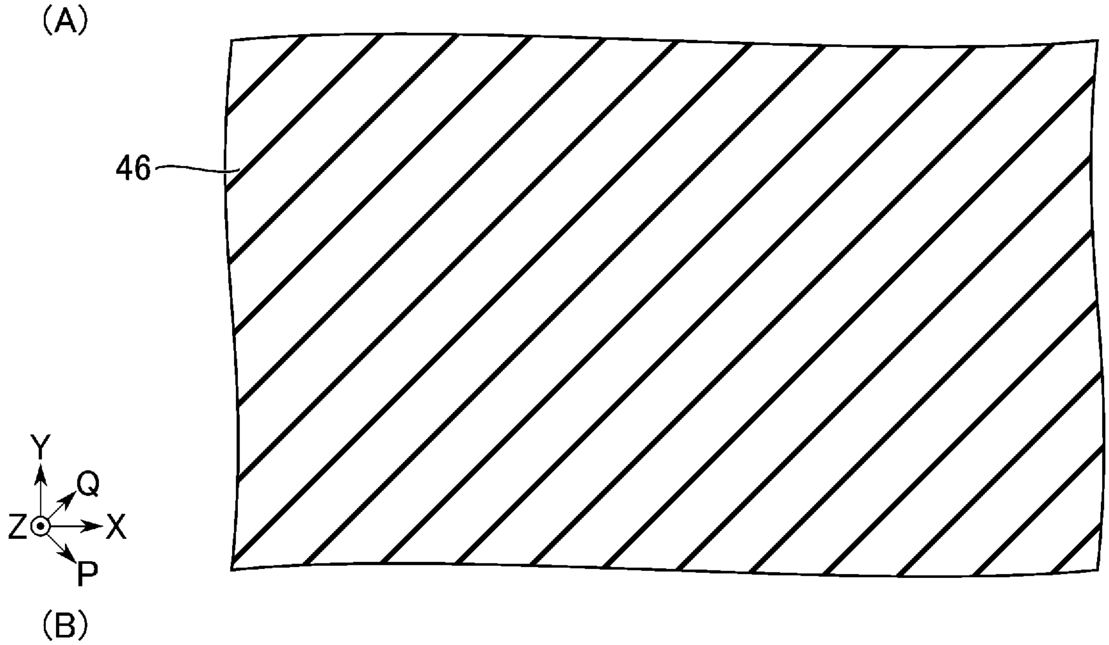
FIG. 7 is a diagram showing an example of a planar layout and a cross-sectional structure halfway through the manufacturing of the memory device according to the first embodiment.
Figure 7:
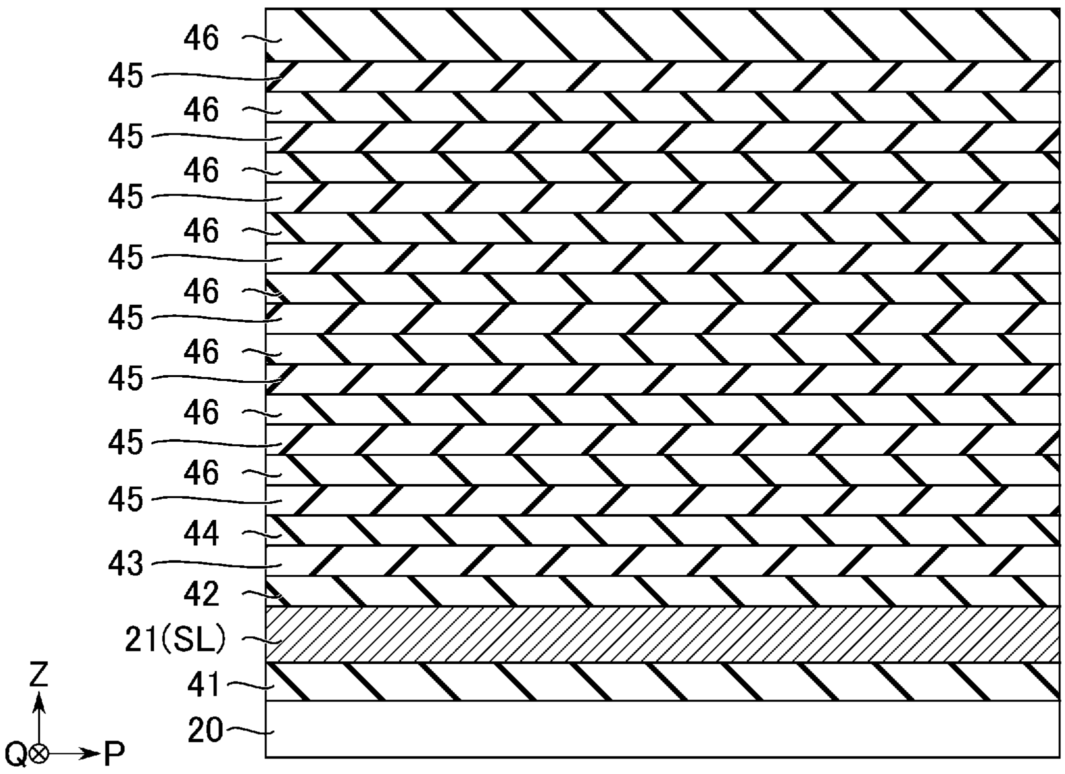

First, as shown in FIG. 7, a insulating layer 41 is formed on the upper surface of the semiconductor substrate 20. The conductive layer 21 and a insulating layer 42 are stacked in this order on the upper surface of the insulating layer 41. A sacrificial member 43 and an insulating layer 44 are sequentially stacked in this order on the upper surface of the insulating layer 42. Sacrificial members 45 and insulating layers 46 are alternately stacked on the upper surface of the insulating layer 44. The insulating layers 41, 42, 44, and 46 contain, for example, silicon oxide. The sacrificial members 43 and 45 contain, for example, silicon nitride.

Figure 8:
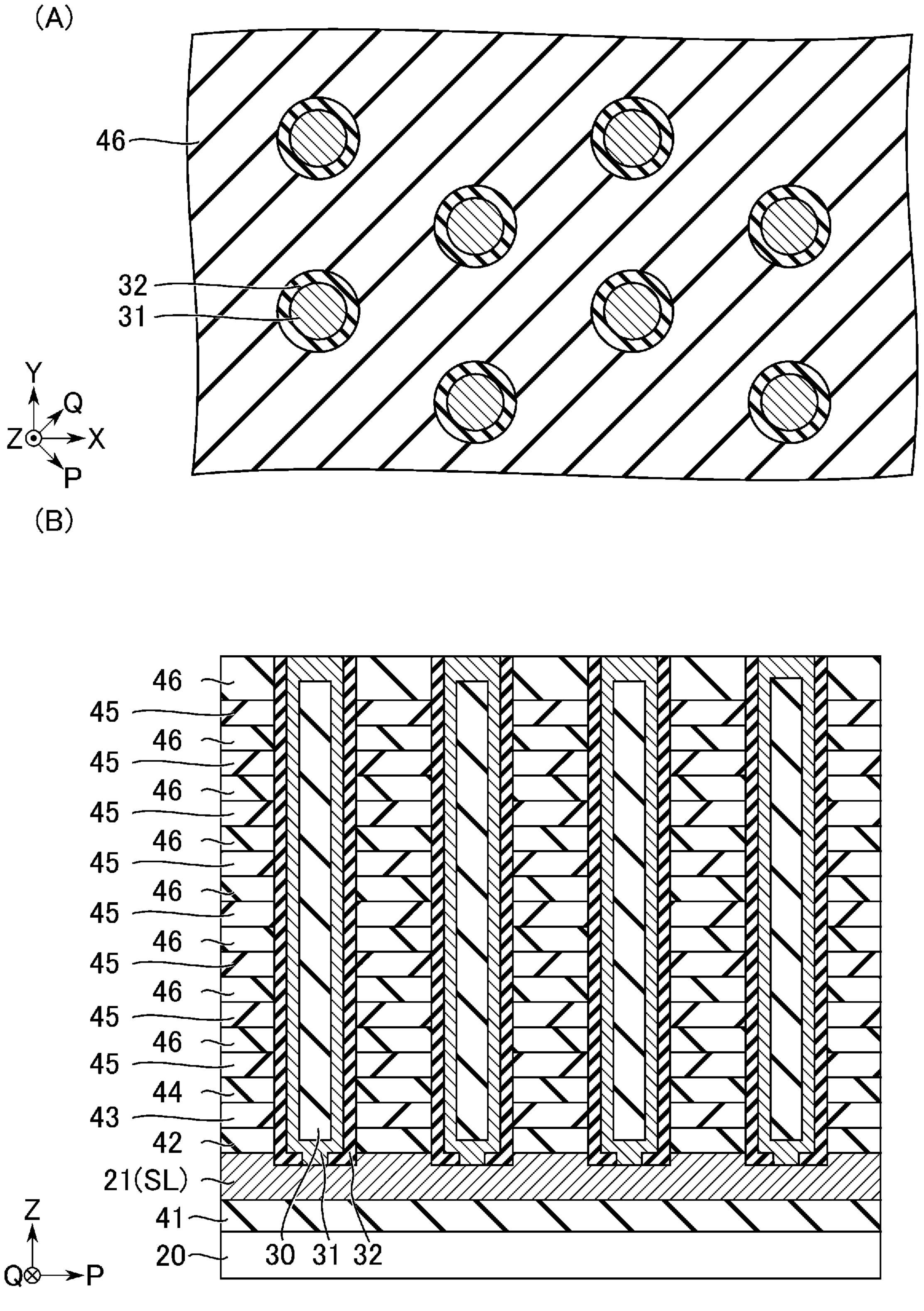
FIG. 8 is a diagram showing an example of a planar layout and a cross-sectional structure halfway through the manufacturing of the memory device according to the first embodiment.

Next, as shown in FIG. 8, a structure corresponding to the select transistor ST2 and the memory cell transistors MT0 to MT7 in the memory pillars MP is formed. Briefly, a mask having openings in regions corresponding to the memory pillars MP is formed by photolithography or the like. Then, for example, a plurality of holes (not shown) penetrating the insulating layers 42, 44, and 46 and the sacrificial members 43 and 45 are formed by anisotropic etching using the mask. A part of the conductive layer 21 is exposed in the bottom portion of each hole. Thereafter, the stacked film 32 is formed on the side surface and the bottom surface of each hole. After a part of the stacked film 32 provided at the bottom of each hole is removed, the semiconductor film 31 and the core film 30 are sequentially formed in each hole. Then, a part of the core film 30 provided in an upper portion of each hole is removed, and thereafter the semiconductor film 31 is formed to fill the space created by the removal of the part of the core film 30.

Figure 9:
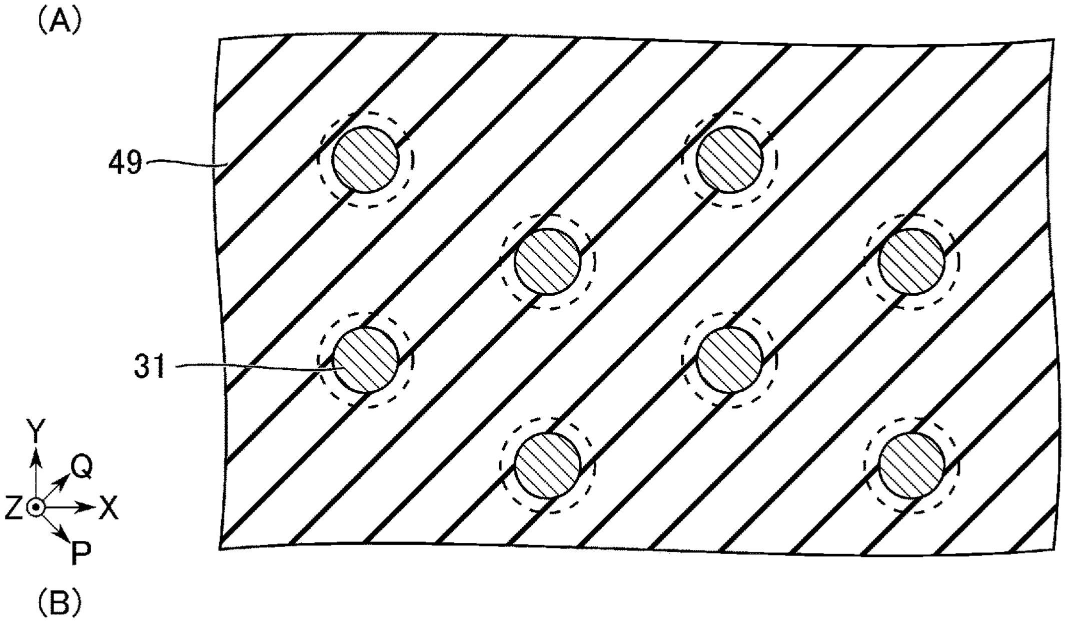
FIG. 9 is a diagram showing an example of a planar layout and a cross-sectional structure halfway through the manufacturing of the memory device according to the first embodiment.
Figure 9:
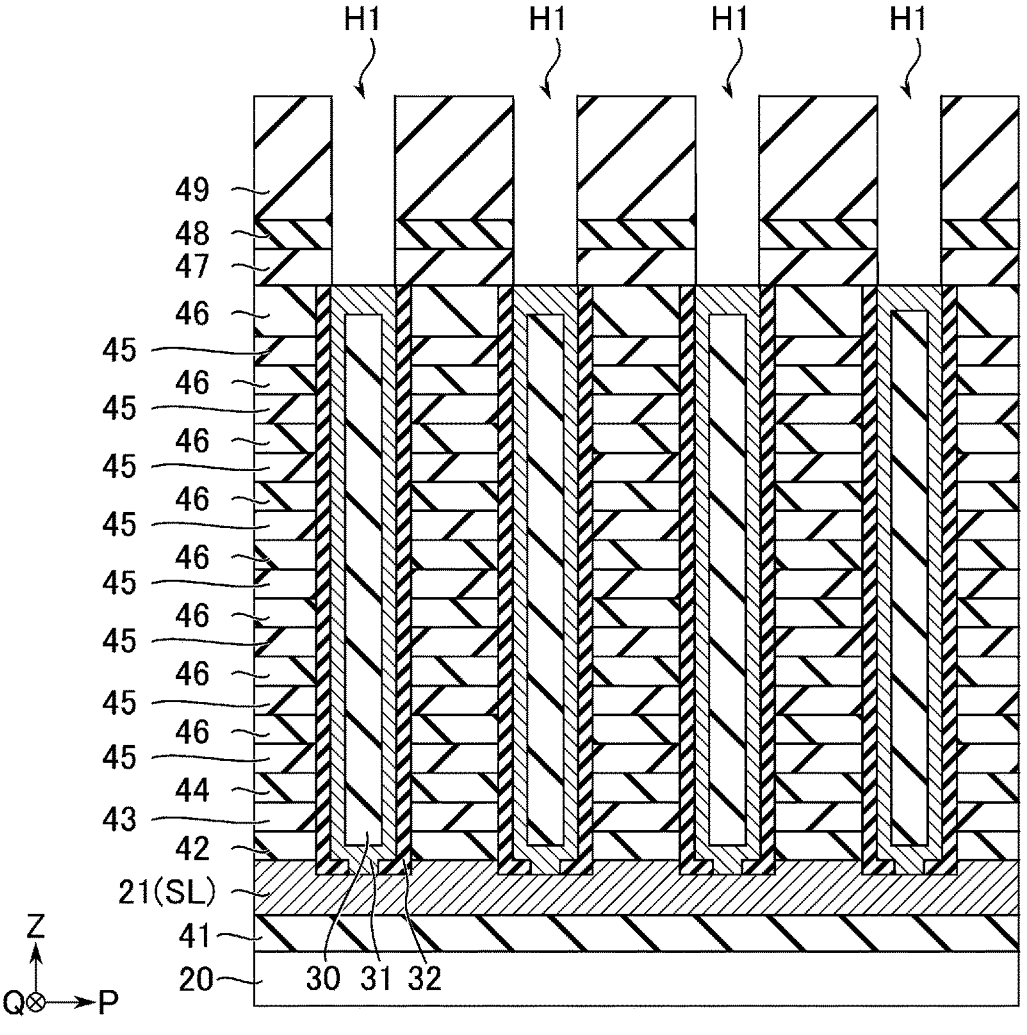

Next, as shown in FIG. 9, a hole H1 is formed in a region of the memory pillar MP where a structure corresponding to the select transistor ST1 is to be formed. Specifically, insulating layers 47, 48, and 49 are sequentially stacked on the upper surfaces of the uppermost insulating layer 46, the semiconductor film 31, and the stacked film 32. The insulating layers 47 and 49 contain, for example, silicon oxide. The insulating layer 48 contains, for example, silicon carbide nitride (SiCN). Then, a mask having openings in regions corresponding to the memory pillars MP is formed by photolithography or the like. Then, for example, a plurality of holes H1 penetrating through the insulating layers 47 to 49 are formed by anisotropic etching using the mask. The semiconductor film 31 is exposed in a bottom portion of each hole H1. For forming the holes H1, anisotropic etching with a large selectivity ratio of silicon oxide to silicon carbide nitride is applied. Accordingly, it is possible to suppress variation in the depths of the respective holes H1. For this reason, it is possible to alleviate the influence of etching of the stacked film 32 and the insulating layer 46 when the position of the hole H1 is shifted with respect to the semiconductor film 31.

Figure 10:
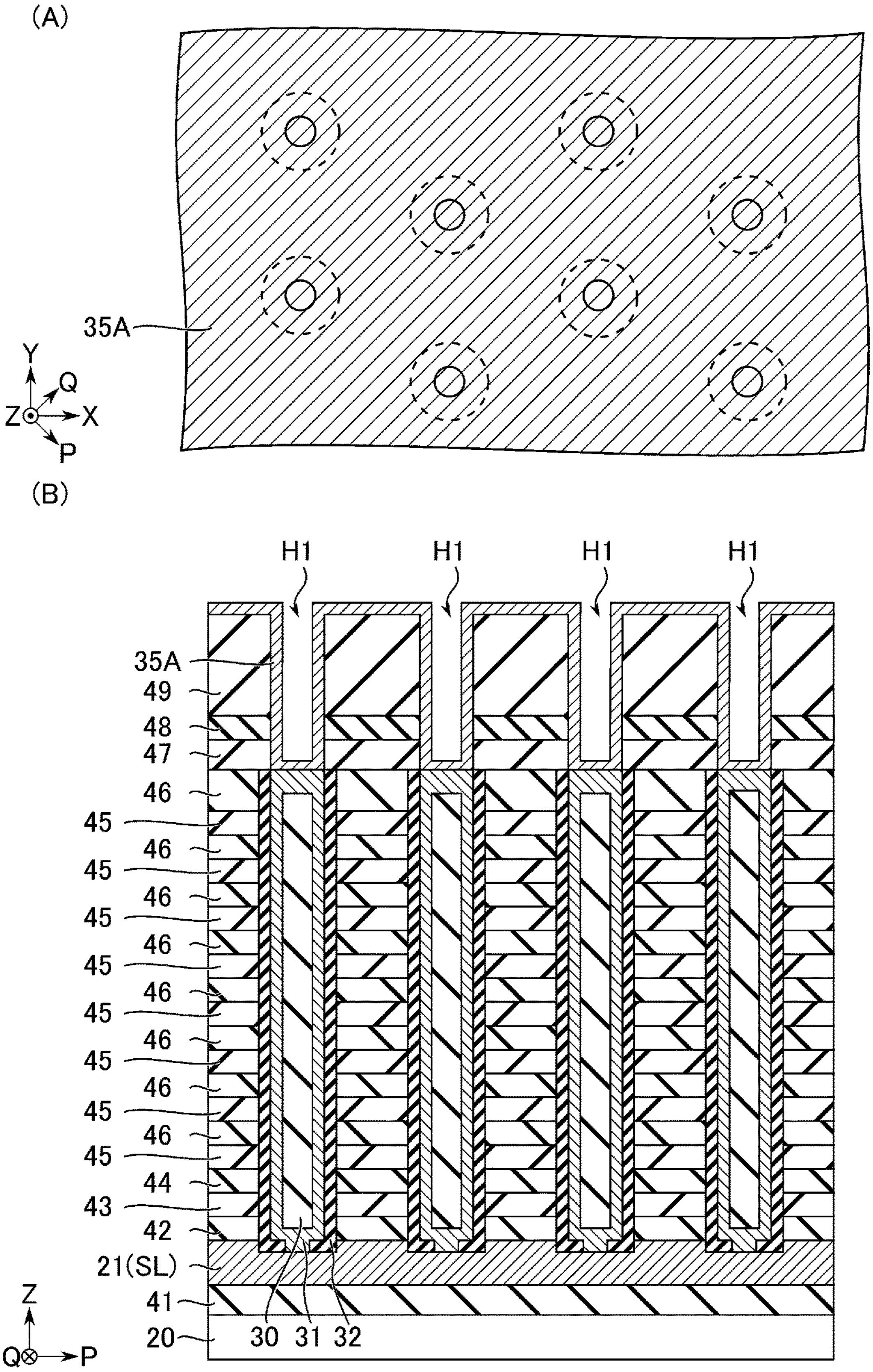
FIG. 10 is a diagram showing an example of a planar layout and a cross-sectional structure halfway through the manufacturing of the memory device according to the first embodiment.

Next, as shown in FIG. 10, a semiconductor film 35A is formed over the upper surface of the insulating layer 49 and over the side surfaces and the bottom surfaces of the plurality of holes H1.

Figure 11:
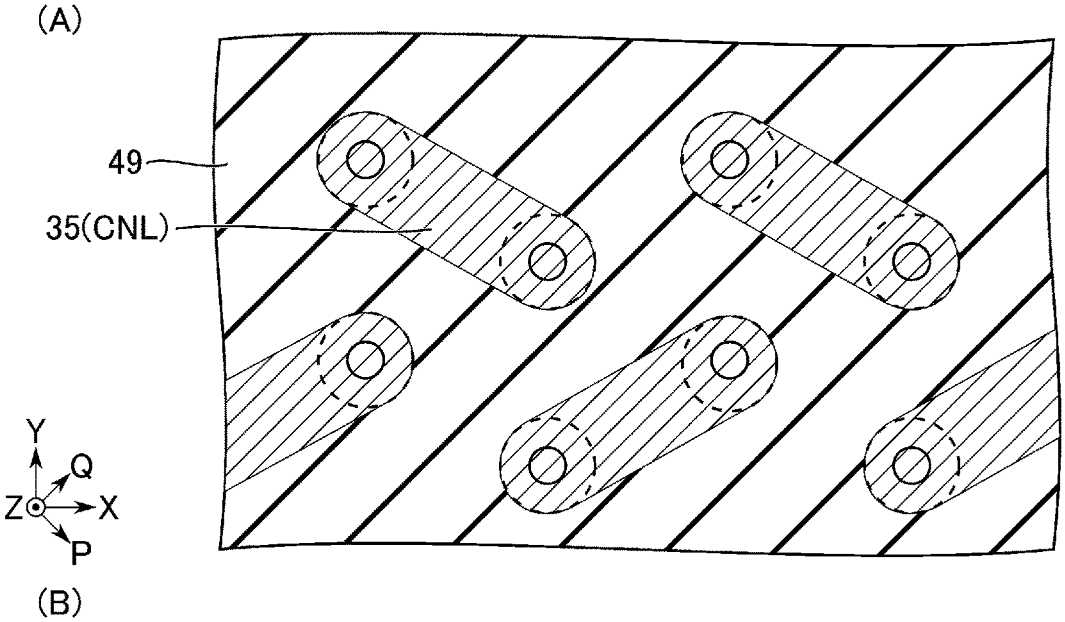
FIG. 11 is a diagram showing an example of a planar layout and a cross-sectional structure halfway through the manufacturing of the memory device according to the first embodiment.
Figure 11:
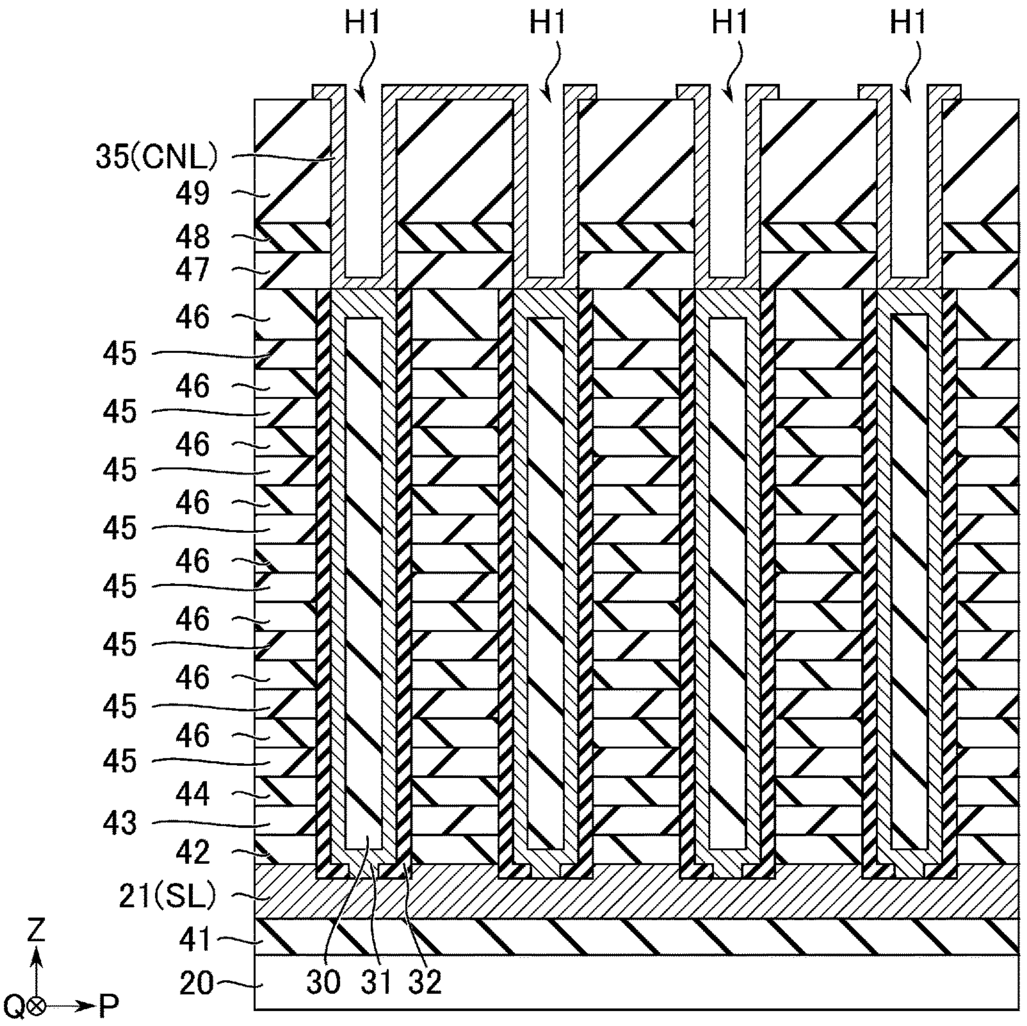

Next, as shown in FIG. 11, the semiconductor film 35A is divided to form portions each corresponding to two memory pillars MP. To be specific, for example, anisotropic etching is performed to remove portions of the semiconductor film 35A provided on the upper surface of the insulating layer 49, excluding portions which are to function as the current path selection portions CNL. Thus, the semiconductor film 35A is divided into a plurality of semiconductor films 35. Each of the semiconductor films 35 includes two portions extending in the Z direction and a portion continuous with the two portions extending in the Z direction and extending in the P direction or the Q direction.

Figure 12:
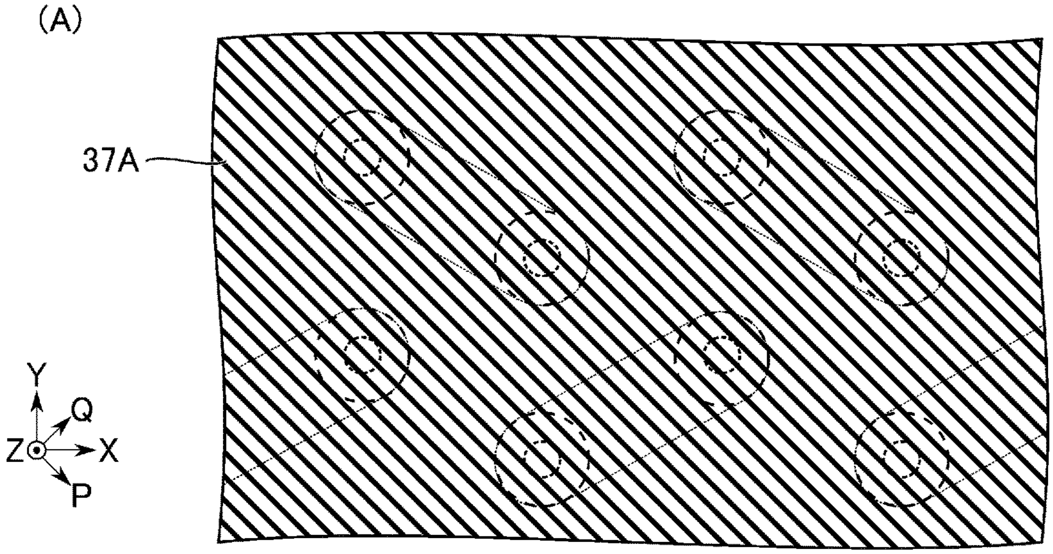
FIG. 12 is a diagram showing an example of a planar layout and a cross-sectional structure halfway through the manufacturing of the memory device according to the first embodiment.
Figure 12:
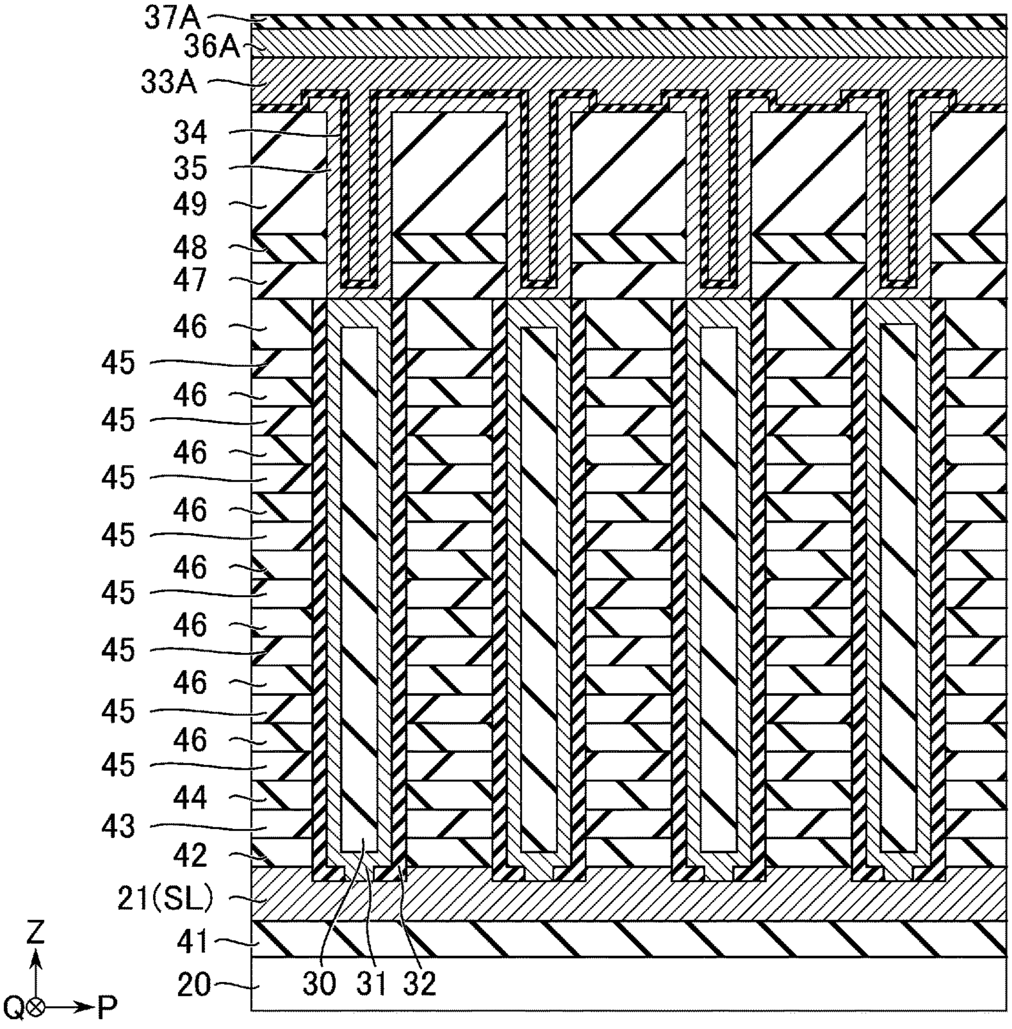

Next, as shown in FIG. 12, the insulating film 34 is formed over the upper surface of the insulating layer 49 and the side surfaces and the bottom surfaces of the plurality of holes H1. A conductive film 33A is formed on the upper surface of the insulating film 34 so as to fill the plurality of holes H1. A conductive layer 36A and an insulating layer 37A are sequentially stacked on the upper surface of the conductive film 33A.

Figure 13:
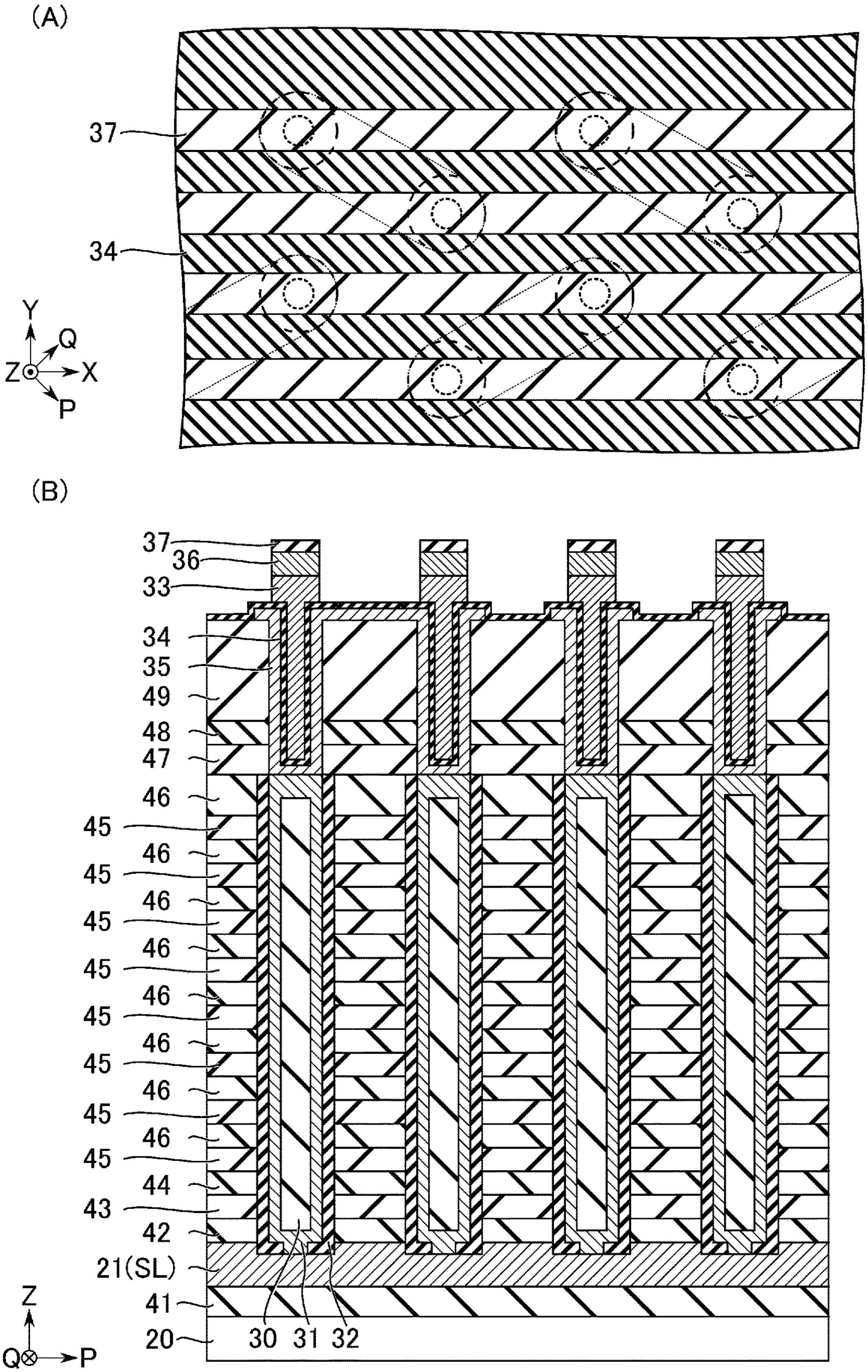
FIG. 13 is a diagram showing an example of a planar layout and a cross-sectional structure halfway through the manufacturing of the memory device according to the first embodiment.

Next, as shown in FIG. 13, the conductive film 33A, the conductive layer 36A, and the insulating layer 37A are divided into portions corresponding to the sub-select gate lines SGD0*a* through SGD3*d*. To be specific, for example, anisotropic etching is performed to remove portions of the conductive film 33A, the conductive layer 36A, and the insulating layer 37A, excluding portions which are to function as the sub-select gate lines SGD0*a* through SGD3*d*. As a result, the conductive film 33A, the conductive layer 36A, and the insulating layer 37A are divided into a plurality of conductive films 33, a plurality of conductive layers 36, and a plurality of insulating layers 37, respectively. Each of the conductive films 33 includes a plurality of portions extending in the Z direction and arranged in a row along the X direction, and a portion continuous with the plurality of portions extending in the Z direction and extending in the X direction.

Figure 14:
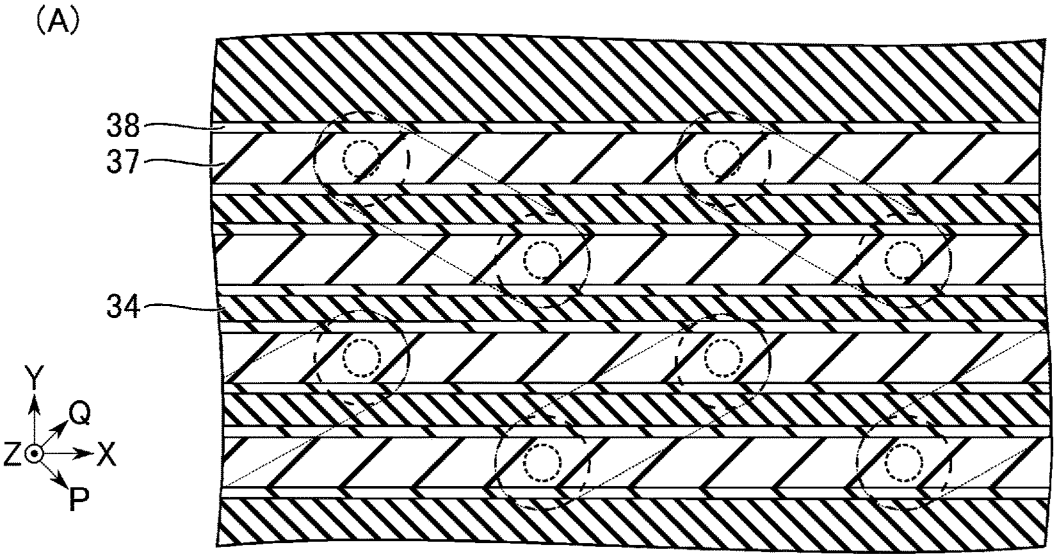
FIG. 14 is a diagram showing an example of a planar layout and a cross-sectional structure halfway through the manufacturing of the memory device according to the first embodiment.
Figure 14:
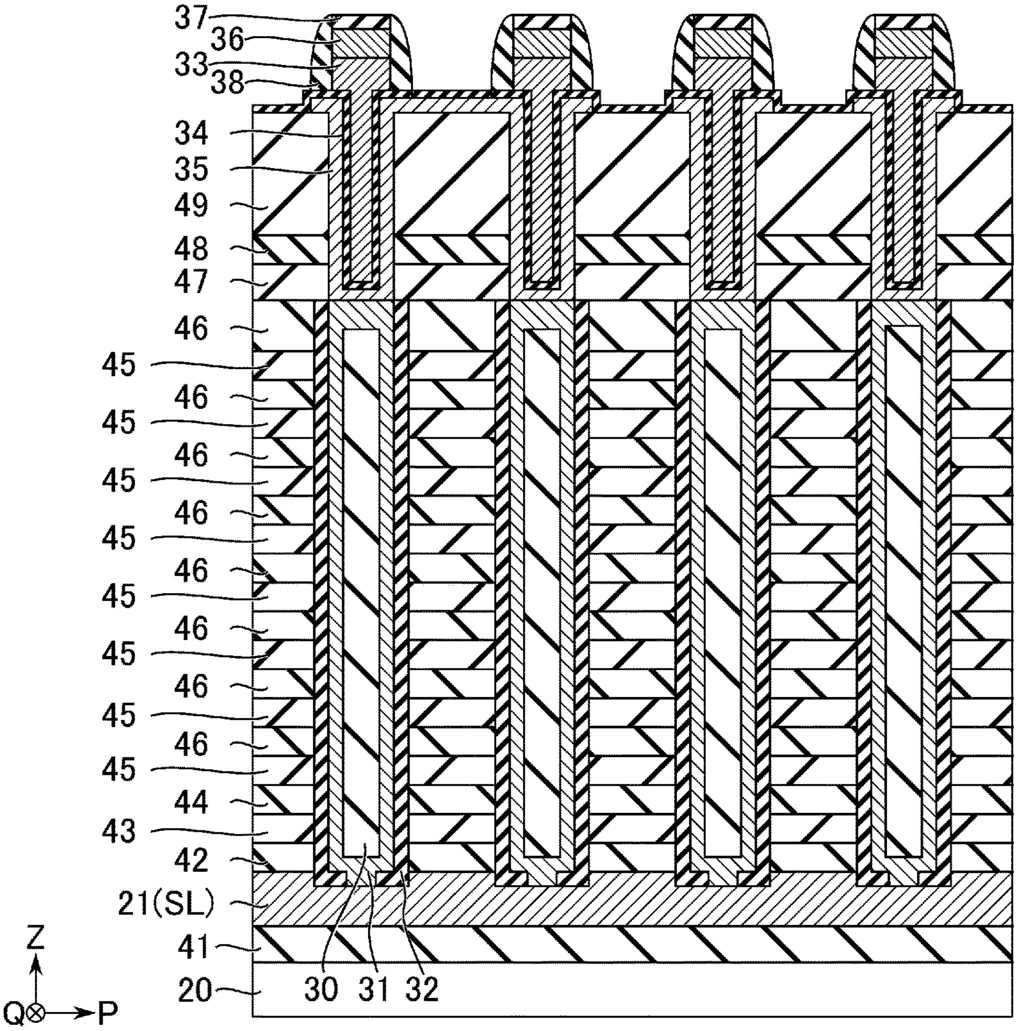

Next, as shown in FIG. 14, the insulating film 38 is formed on the side surfaces of the portions of the plurality of conductive films 33 extending in the X direction, the side surfaces of the plurality of conductive layers 36, and the side surfaces of the plurality of insulating layers 37. Specifically, after the insulating film 38 is formed over the entire surface, the insulating film 38 formed on the upper surface of the insulating film 34 is removed by anisotropic etching. Thus, the side surfaces of the conductive film 33, the conductive layer 36, and the insulating layer 37 are covered with the insulating film 38 while the insulating film 38 is removed from the upper surface of the insulating film 34 by utilizing anisotropy of the etching.

Figure 15:
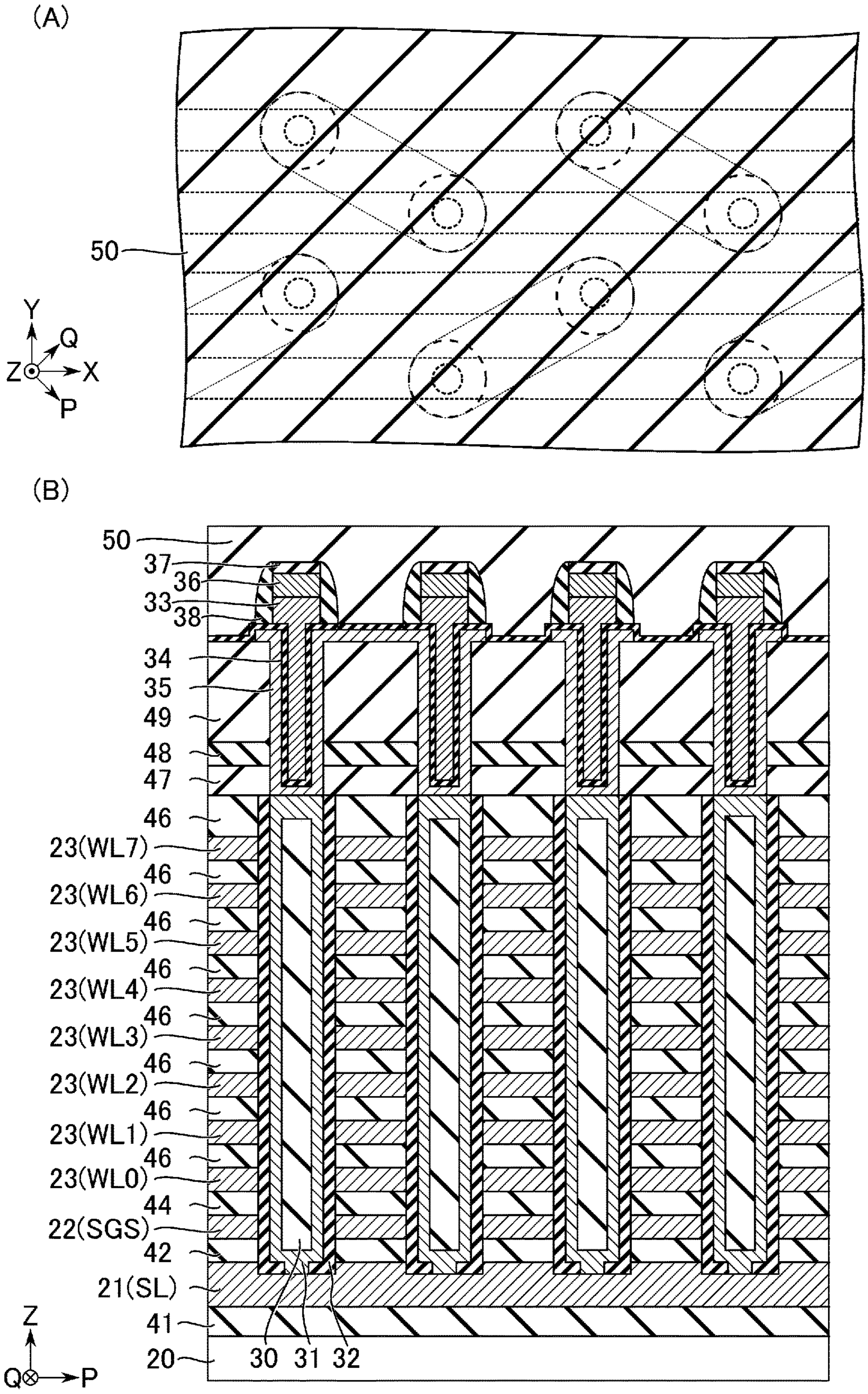
FIG. 15 is a diagram showing an example of a planar layout and a cross-sectional structure halfway through the manufacturing of the memory device according to the first embodiment.

Next, a replacement process for the sacrificial members of the stacked structure is performed. Thus, as shown in FIG. 15, a stacked interconnect structure is formed. Specifically, first, an insulating layer 50 is formed over the entire surface, and thereafter, a mask having openings in regions corresponding to the members SLT is formed by photolithography or the like in a region not shown in FIG. 15. Then, anisotropic etching is performed with the mask so that the slits (not shown) penetrating, for example, the insulating layers 42, 44, and 46 to 50, the insulating film 34, and the sacrificial members 43 and 45 are formed. Thereafter, wet etching with thermal phosphoric acids, etc., is performed to selectively remove the sacrificial members 43 and 45 via the slits. Then, a conductor is placed to fill each space created by the removal of the sacrificial members 43 and 45 via the slits.

The conductor formed inside the slits is removed by an etch-back process. Therefore, the conductors formed in the adjacent interconnect layers are separated from each other. Accordingly, the conductive layer 22 functioning as the select gate line SGS and the plurality of conductive layers 23 respectively functioning as the word lines WL0 through WL7 are formed. The slits are filled with the insulating film 39. Thus, the members SLT are formed.

Figure 16:
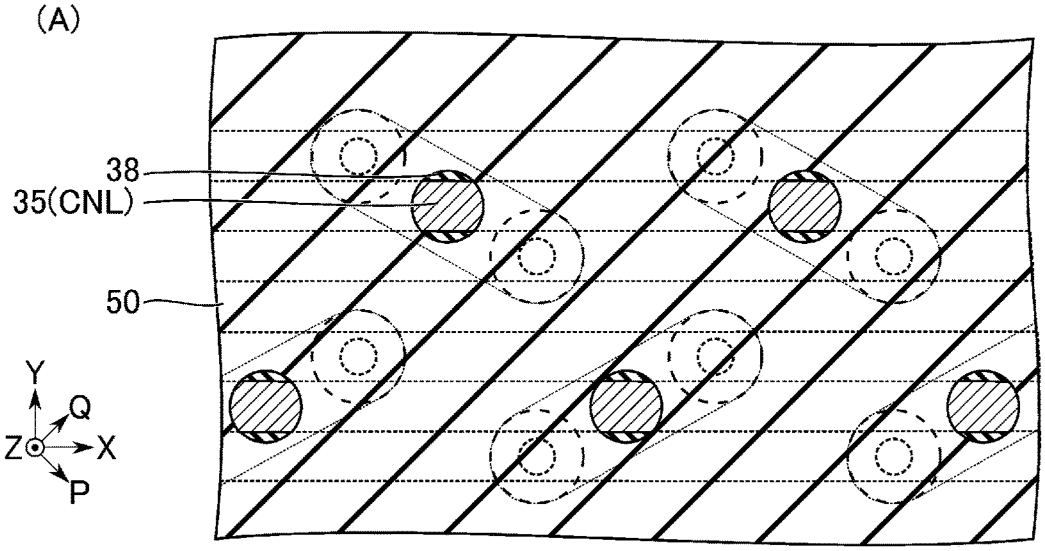
FIG. 16 is a diagram showing an example of a planar layout and a cross-sectional structure halfway through the manufacturing of the memory device according to the first embodiment.
Figure 16:
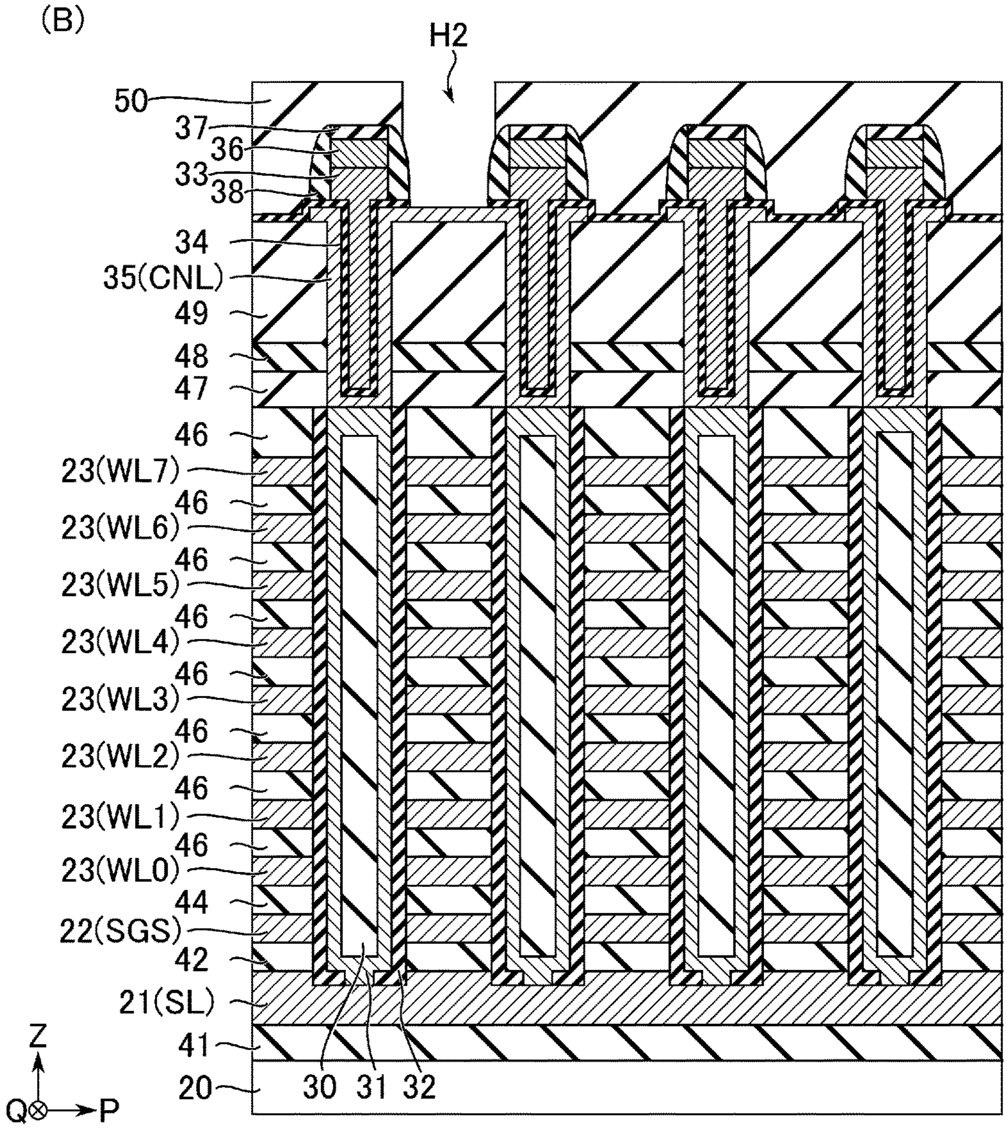

Next, as shown in FIG. 16, a hole H2 is formed in a region where a structure corresponding to the contact CV is to be formed. Specifically, a mask having openings in regions corresponding to the contacts CV is formed by photolithography or the like. Then, a plurality of holes H2 penetrating the insulating layer 50 are formed by anisotropic etching using the mask. In a bottom portion of each hole H2, a part of the side surface of the insulating film 38 and a part of the portion of the semiconductor film 35 extending in the P direction or the Q direction are exposed. For forming the holes H2, anisotropic etching with a large selectivity ratio of silicon oxide to silicon nitride is applied. Thus, the positions of the holes H2 can be self-aligned while suppressing exposure of the conductive film 33 and the conductive layer 36.

Figure 17:
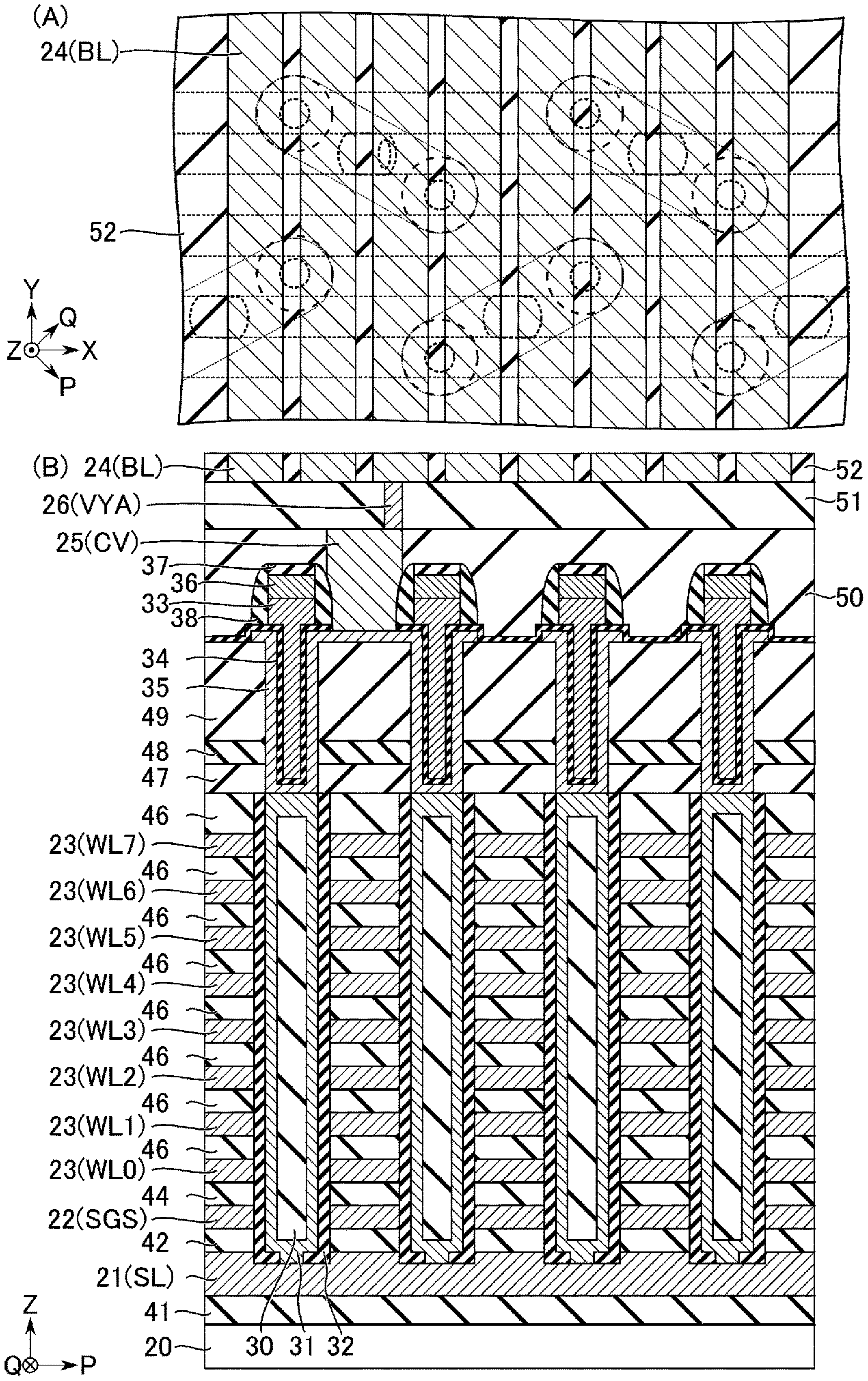
FIG. 17 is a diagram showing an example of a planar layout and a cross-sectional structure halfway through the manufacturing of the memory device according to the first embodiment.

Next, as shown in FIG. 17, the contacts CV, VYA, and VYB (not shown) and the bit lines BL are formed. To be specific, the holes H2 are filled with the conductive layer 25. An insulating layer 51 is formed on the upper surface of the insulating layer 50 and the upper surface of the conductive layer 25. A mask having openings in regions corresponding to the contacts VYA and VYB is formed by photolithography or the like. Then, holes penetrating the insulating layer 51 are formed by anisotropic etching using the mask. At the bottom of each of the holes, the corresponding conductive layer 25 is exposed. Then, the holes are filled with the conductive layer 26.

Simultaneously with the step of forming the contacts CV and VYA, the contacts VYB are formed in a region (not shown). Thereafter, an insulating layer 52 is formed on the upper surface of the insulating layer 51 and the upper surface of the conductive layer 26. A mask having openings in regions corresponding to the bit lines BL is formed by photolithography or the like. Then, holes penetrating the insulating layer 52 are formed by anisotropic etching using the mask. At the bottom of each of the holes, the corresponding conductive layer 26 is exposed. Then, the holes are filled with the conductive layer 24.

The memory cell array 10 is thus formed by the manufacturing process described above.

1.3 Advantageous Effect of First Embodiment

According to the first embodiment, the conductive film 33 has a portion extending in the Z direction above the conductive layer 23. The semiconductor film 31 has a portion that extends in the Z-direction between the conductive layer 23 and the portion of the conductive film 33 extending in the Z-direction and intersects the conductive layer 23. The semiconductor film 35 has a portion that is in contact with the semiconductor film 31, extends in the Z direction between the conductive layer 23 and the portion of the conductive film 33 extending in the Z direction, and faces the conductive film 33. The stacked film 32 is provided between the conductive layer 23 and the semiconductor film 31. The insulating film 34 is provided between the conductive film 33 and the semiconductor films 31 and 35. As a result, the select transistor ST1 of the memory pillar MP has a structure including the pillar-shaped electrode SP provided in the central portion of the memory pillar MP in a plan view and the current path selection portion CNL provided so as to surround the pillar-shaped electrode SP. Therefore, the select gate line SGD can be arranged at a height different from that of the select transistor ST1. Therefore, it is possible to improve the integration degree of the memory cell while suppressing the manufacturing load of the select gate line SGD and the select transistor ST1.

The upper surface of the semiconductor film 31 is in contact with the lower surface of the semiconductor film 35. Specifically, the contact area between the semiconductor film 31 and the semiconductor film 35 corresponds to the XY cross-sectional area of the memory pillar MP. Thus, the contact area between the semiconductor film 31 and the semiconductor film 35 can be increased. Therefore, the resistance of the current path in the memory pillar MP can be reduced.

The portion of the semiconductor film 35 extending in the P direction or the Q direction is shared by two memory pillars MP belonging to different string units SU. Thus, the number of contacts CV and VYA electrically coupling the memory pillar MP and the bit line BL can be reduced to half of the number of memory pillars MP. For this reason, it is possible to suppress the manufacturing load compared to a case where the same number of contacts as the number of memory pillars MP are provided.

2. Second Embodiment

Next, a second embodiment will be described.

In the first embodiment, a case where the interconnect layer spreading in the XY plane is not formed in the layer in which the select transistor ST1 is formed has been described. The second embodiment is different from the first embodiment in that an interconnect layer spreading in the XY plane is formed as a back gate in the layer in which the select transistor ST1 is formed. In the following explanation, a description of the same configuration and manufacturing method as in the first embodiment will be omitted, and a configuration and a manufacturing method different from the first embodiment will mainly be described.

2.1 Configuration

A configuration of a memory device according to the second embodiment will be described.

2.1.1 Circuit Configuration of Memory Cell Array

Figure 18:
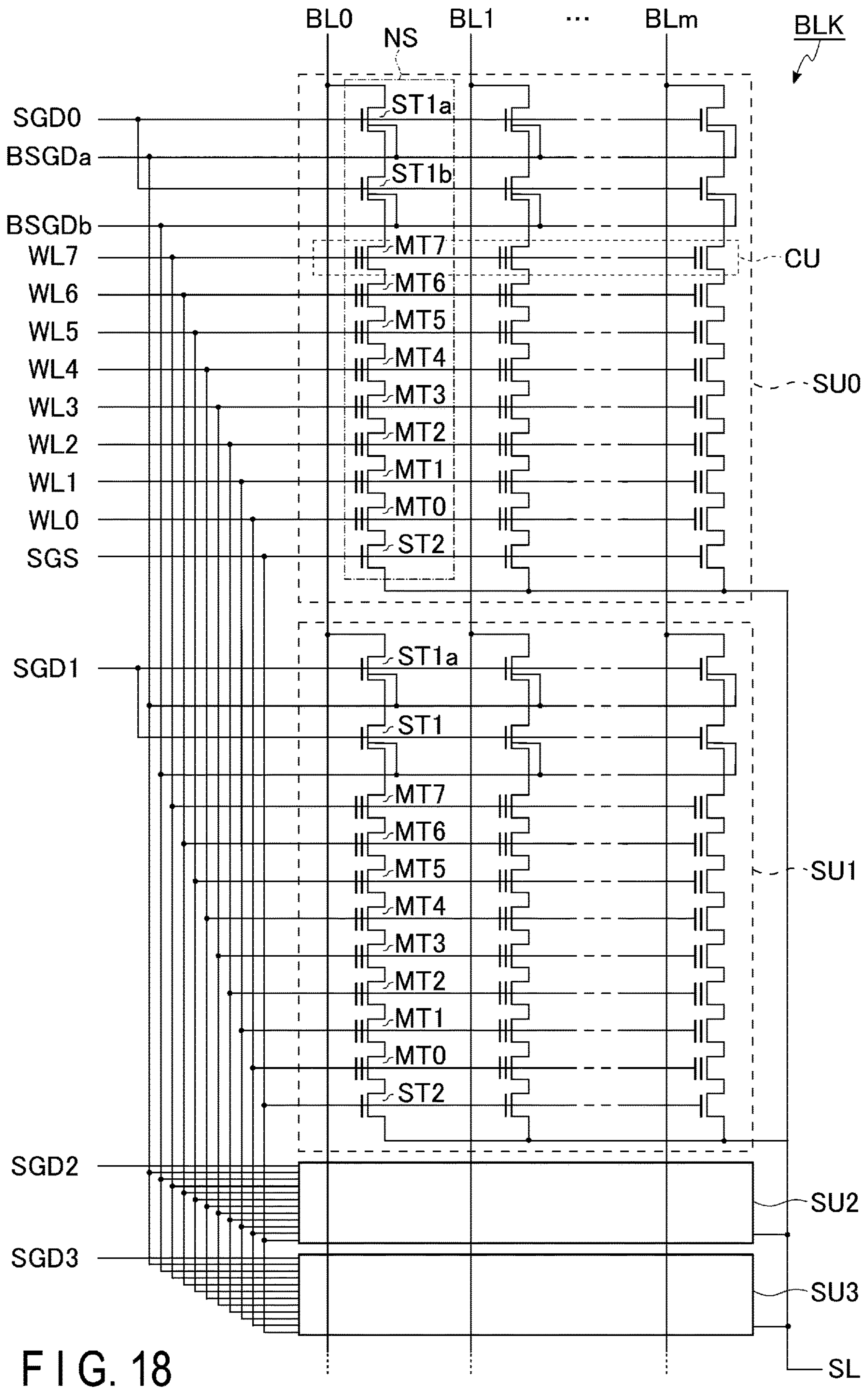
FIG. 18 is a circuit diagram showing an example of a circuit configuration of a memory cell array provided in a memory device according to a second embodiment.

FIG. 18 is a circuit diagram showing an example of a circuit configuration of a memory cell array provided in a memory device of the second embodiment. FIG. 18 corresponds to FIG. 2 to which reference was made in the first embodiment.

As shown in FIG. 18, the select transistor ST1 includes select transistors ST1*a* and ST1*b* connected in series. A drain of the select transistor ST1*a* is coupled to the associated bit line BL. A source of the select transistor ST1*a* is coupled to the drain of the select transistor ST1*b*. A source of the select transistor ST1*b* is coupled to one end of the memory cell transistors MT0 through MT7.

Gates of the select transistors ST1*a* and ST1*b* in the string units SU0 through SU3 are commonly coupled to select gate lines SGD0 to SGD3, respectively. In the same block BLK, the back gates of the select transistors ST1*a* and ST1*b* are coupled to select back gate lines BSGDa and BSGDb, respectively.

2.1.2 Structure of Memory Cell Array

An example of the structure of the memory cell array included in the memory device according to the second embodiment will be described below.

2.1.2.1 Planar Layout

Figure 19:
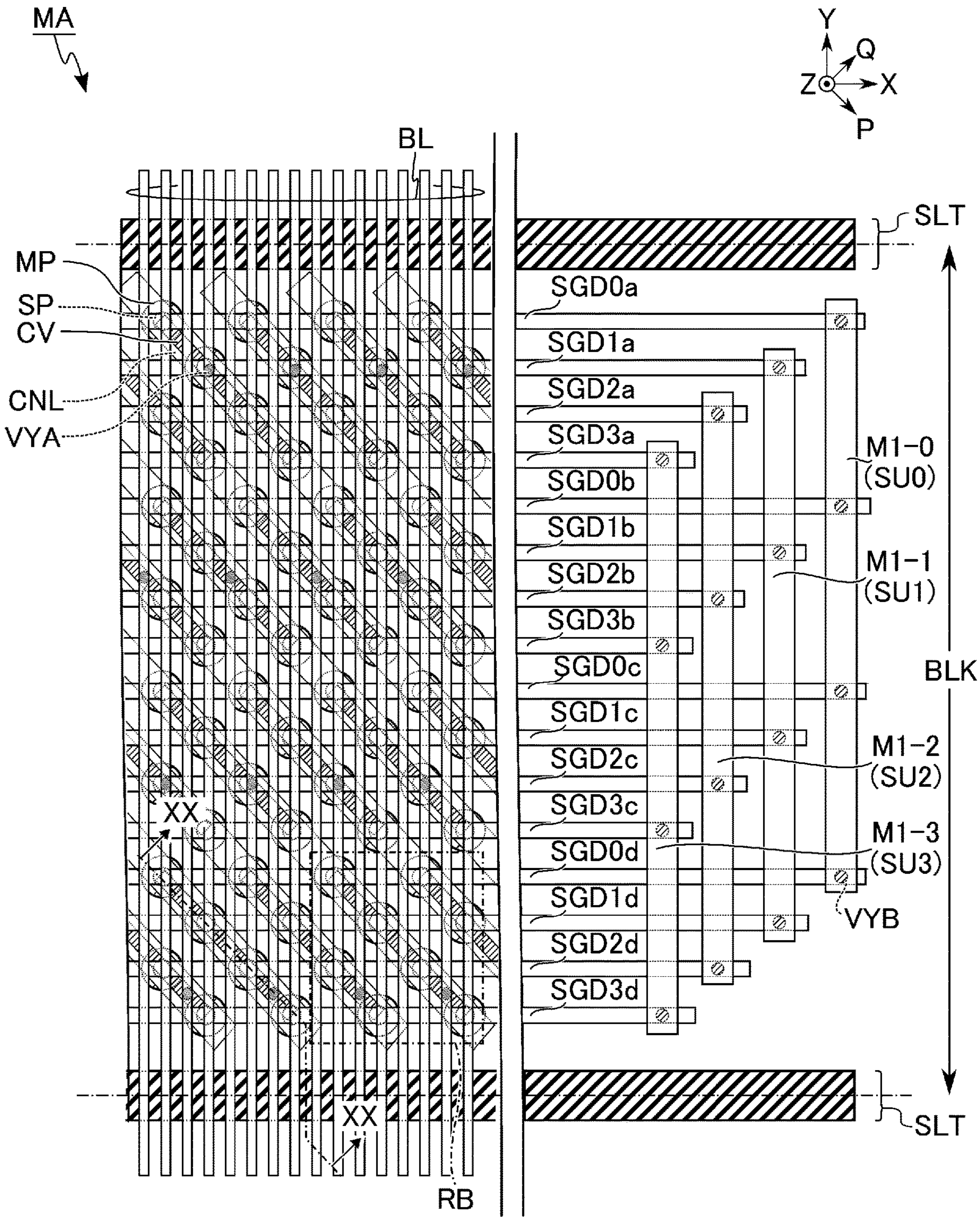
FIG. 19 is a plan view showing an example of a planar layout of the memory cell array included in the memory device according to the second embodiment.

FIG. 19 is a plan view showing an example of a planar layout of the memory cell array according to the second embodiment. FIG. 19 corresponds to FIG. 3 to which reference was made in the first embodiment.

As shown in FIG. 19, the sub-select gate lines SGD0*a* through SGD0*d* are electrically coupled to the pillar-shaped electrodes SP arranged in the first row, the fifth row, the ninth row, and the thirteenth row, respectively. The sub-selection gate lines SGD1*a* through SGD1*d* are electrically coupled to the pillar-shaped electrodes SP arranged in the second row the sixth row, the tenth row, and the fourteenth row, respectively. The sub-select gate lines SGD2*a* through SGD2*d* are electrically coupled to the pillar-shaped electrodes SP arranged in the third row, the seventh row, the eleventh row, and the fifteenth row, respectively. The sub-select gate lines SGD3*a* through SGD3*d* are electrically coupled to the pillar-shaped electrodes SP arranged in the fourth row, the eighth row, the twelfth row, and the sixteenth row, respectively.

Each of the current path selection portions CNL is arranged so as to intersect a total of sixteen memory pillars MP respectively arranged in the sixteen rows. The current path selection portions CNL all extend in the P direction.

Four contacts CV are associated with one current path selection portion CNL. Each contact CV is electrically coupled to four consecutively adjacent memory pillars MP among the sixteen memory pillars MP arranged to intersect the current path selection portion CNL via the corresponding current path selection portion CNL. Specifically, the first one of the four contacts CV corresponding to the same current path selection portion CNL is electrically coupled to the four memory pillars MP respectively arranged in the first to fourth rows. The second one of the four contacts CV corresponding to the same current path selection portion CNL is electrically coupled to the four memory pillars MP respectively arranged in the fifth to eighth rows. The third one of the four contacts CV corresponding to the same current path selection portion CNL is electrically coupled to the four memory pillars MP respectively arranged in the ninth to twelfth rows. The fourth one of the four contacts CV corresponding to the same current path selection unit CNL is electrically coupled to the four memory pillars MP arranged in the thirteenth to sixteenth rows.

Each bit line BL is arranged so as to overlap one contact VYA in each block BLK. That is, each bit line BL is electrically connected to four memory pillars MP via one contact VYA in each block BLK. The four memory pillars MP electrically coupled to one bit line BL in each block BLK are included in mutually different string units SU0 to SU3.

2.1.2.2 Cross-Sectional Structure

Figure 20:
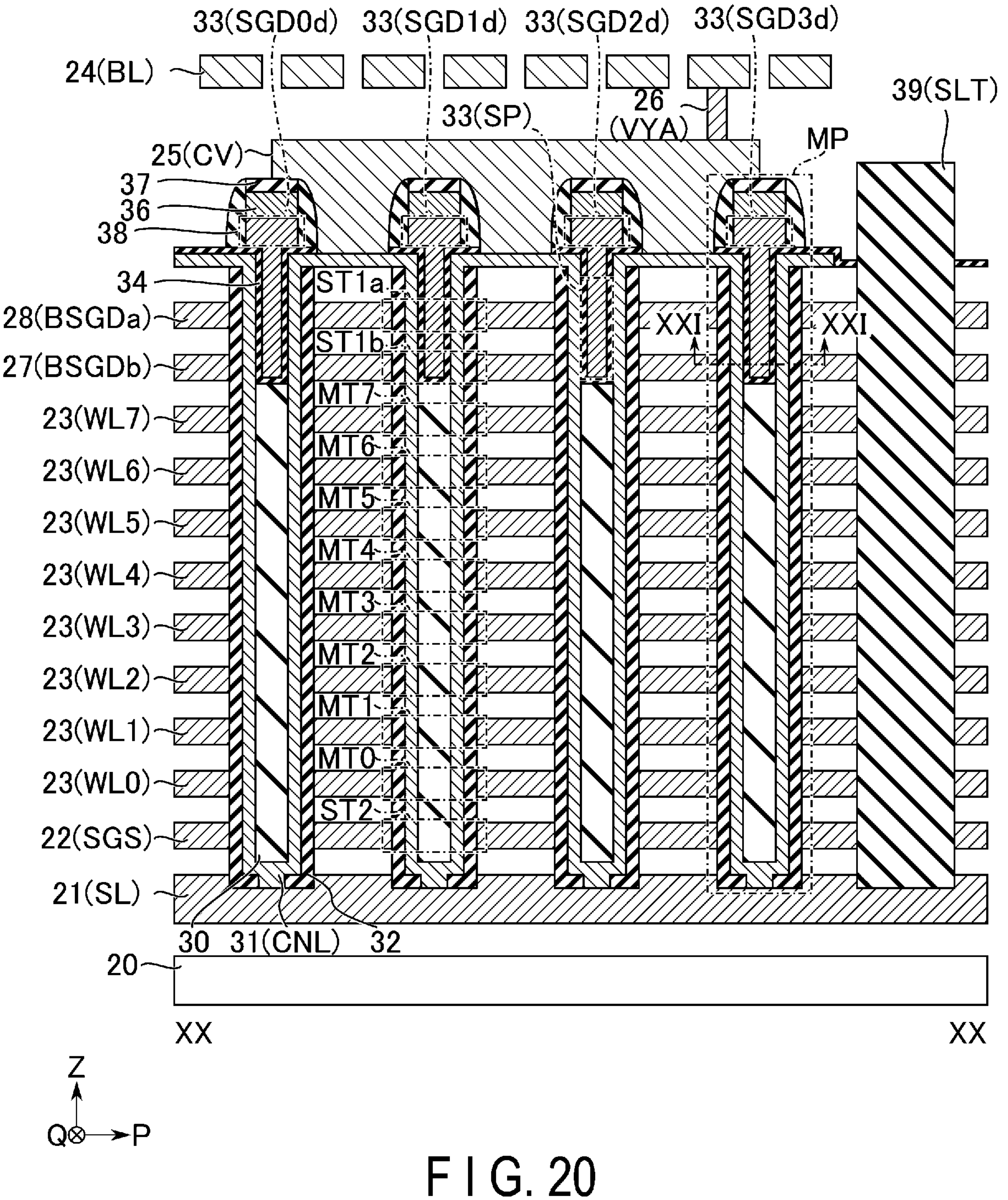
FIG. 20 is a cross-sectional view taken along line XX-XX and showing an example of a cross-sectional structure of the memory cell array according to the second embodiment.

FIG. 20 is a cross-sectional view taken along line XX-XX and showing an example of a cross-sectional structure of the memory cell array according to the second embodiment. As shown in FIG. 20, the memory cell array 10 further includes conductive layers 27 and 28.

The conductive layer 27 is provided above the uppermost conductive layer 23 via an intervening insulating layer (not shown). The conductive layer 28 is provided above the conductive layer 27 via an intervening insulating layer (not shown). A plurality of conductive layers 24 are provided above the conductive layer 28 with an insulating layer (not shown) interposed therebetween. The conductive layers 27 and 28 are formed, for example, in a plate shape spreading along the XY plane. The conductive layers 27 and 28 are used as the select back gate lines BSGDa and BSGDb, respectively. The conductive layers 27 and 28 contain, for example, tungsten.

Each memory pillar MP penetrates through the conductive layers 22, 23, 27, and 28. The upper end of the memory pillar MP is located between the conductive layer 28 and the conductive layer 24.

A portion where each memory pillar MP and the conductive layer 27 intersect functions as the select transistor SIM. A portion where each memory pillar MP and the conductive layer 28 intersect functions as the select transistor ST1*a*.

Each memory pillar MP includes, for example, a core film 30, a semiconductor film 31, a stacked film 32, a conductive film 33, an insulating film 34, a conductive layer 36, an insulating layer 37, and an insulating film 38. Since the configurations of the conductive layer 36, the insulating layer 37, and the insulating film 38 are the same as those in the first embodiment, description thereof will be omitted.

The upper end of the core film 30 is located above the uppermost conductive layer 23 and below the conductive layer 27.

The conductive film 33 includes a portion extending in the Z direction and a portion extending in the X direction. The portion of the conductive film 33 extending in the Z direction functions as the pillar-shaped electrode SP. The portion of the conductive film 33 extending in the X direction functions as one of the sub-select gate lines SGD0*a* through SGD3*d*. In the illustrated region, four conductive films 33 including portions respectively functioning as the sub-select gate lines SGD0*d*, SGD1*d*, SGD2*d*, and SGD3*d* are indicated. The lower end of the portion of the conductive film 33 extending in the Z direction is located below the upper surface of the conductive layer 27. The upper end of the portion of the conductive film 33 extending in the Z direction is in contact with and continuous with the lower end of the portion of the same conductive film 33 extending in the X direction.

The insulating film 34 includes a portion extending in the Z direction and a portion spreading in the XY plane. The portion of the insulating film 34 extending in the Z direction covers the side surface and the bottom surface of the portion of the conductive film 33 extending in the Z direction. The lower end of the portion of the insulating film 34 extending in the Z direction is in contact with the upper end of the core film 30. The upper end of the portion of the insulating film 34 extending in the Z direction is in contact with and continuous with the lower end of the portion of the insulating film 34 spreading in the XY plane. The portion of the insulating film 34 spreading in the XY plane is located below the portion of the conductive film 33 extending in the X direction.

The semiconductor film 31 includes a portion extending in the Z direction and a portion extending in the P direction. The portion of the semiconductor film 31 extending in the Z direction covers the bottom surface and the side surface of the core film 30 and the side surface of the portion of the insulating film 34 extending in the Z direction. The upper end of the portion of the semiconductor film 31 extending in the Z direction is in contact with and continuous with the lower end of the portion of the semiconductor film 31 extending in the P direction. The portion of the semiconductor film 31 extending in the P direction is shared by sixteen memory pillars MP. In the illustrated region, among the portions extending in the P direction of the semiconductor film 31, a portion shared by four memory pillars MP is indicated.

The stacked film 32 covers the side surface and the bottom surface of the semiconductor film 31 excluding a portion where the semiconductor film 31 and the conductive layer 21 are in contact. The upper end of the stacked film 32 is aligned with the upper end of the portion of the semiconductor film 31 extending in the Z direction.

The conductive layer 25 is provided on the upper surface of the portion of the semiconductor film 31 extending in the P direction. The conductive layer 26 is provided on the upper surface of the conductive layer 25. The conductive layers 25 and 26 are used as the contacts CV and VYA, respectively. In the illustrated region, one of four sets of contacts CV and VYA corresponding to portions of the semiconductor film 31 extending in the P direction is indicated. One conductive layer 24 is provided on the upper surface of the conductive layer 26. The conductive layer 24 functions as the bit line BL.

Figure 21:
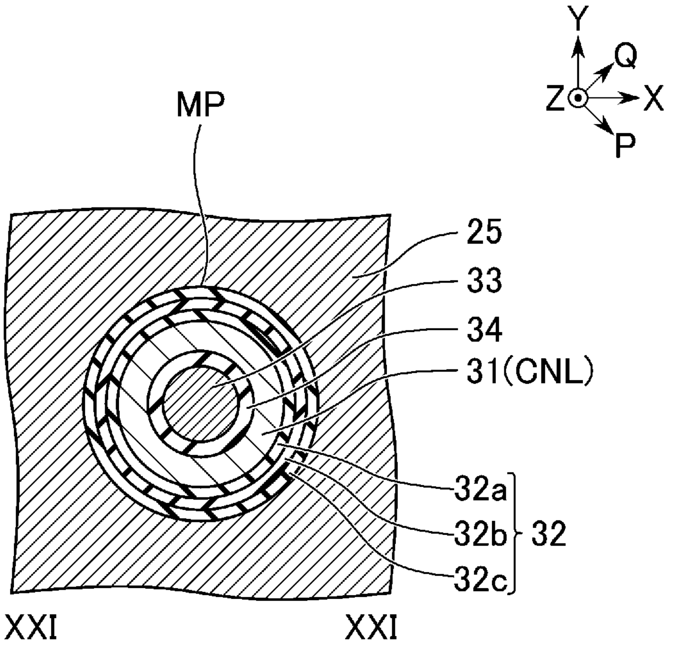
FIG. 21 is a cross-sectional view taken along line XXI-XXI and showing an example of a cross-sectional structure of a select transistor in the memory cell array according to the second embodiment.

FIG. 21 is a cross-sectional view taken along line XXI-XXI and showing an example of a cross-sectional structure of a select transistor in the semiconductor memory device according to the second embodiment. More specifically, FIG. 21 includes a cross-sectional structure of the memory pillar MP in a layer parallel to the surface of the semiconductor substrate 20 and including the conductive layer 27.

As shown in FIG. 21, the stacked film 32 includes, for example, a tunnel insulating film 32*a*, a charge accumulating film 32*b*, and a block insulating film 32*c*.

As shown in FIG. 21, the portion of the conductive film 33 extending in the Z direction is provided, for example, in the central portion of the memory pillar MP. The portion of the insulating film 34 extending in the Z direction surrounds the side surface of the portion of the insulating film 33 extending in the Z direction. The portion of the semiconductor film 35 extending in the Z direction surrounds the side surface of the portion of the insulating film 34 extending in the Z direction. The portion of the semiconductor film 35 extending in the Z direction is surrounded by an insulator.

In the cross section including the conductive layer 27, the portion of the conductive film 33 extending in the Z-direction is provided, for example, in the central portion of the memory pillar MP. The portion of the insulating film 34 extending in the Z direction surrounds the side surface of the portion of the insulating film 33 extending in the Z direction. The portion of the semiconductor film 31 extending in the Z direction surrounds the side surface of the portion of the insulating film 34 extending in the Z direction. The tunnel insulating film 32*a* surrounds the side surface of the portion of the semiconductor film 31 extending in the Z direction. The charge accumulating film 32*b* surrounds the side surface of the tunnel insulating film 32*a*. The block insulating film 32*c* surrounds the side surface of the charge accumulating film 32*b*. The conductive layer 27 surrounds the side surface of the block insulating film 32*c*.

The semiconductor film 31 is used as a current path of the select transistors ST1*a*, SIM, and ST2 and the memory cell transistors MT0 through MT7. With these components, the memory pillars MP are each capable of functioning as one NAND string NS.

2.2 Selection Operation of Select Transistor

Figure 22:
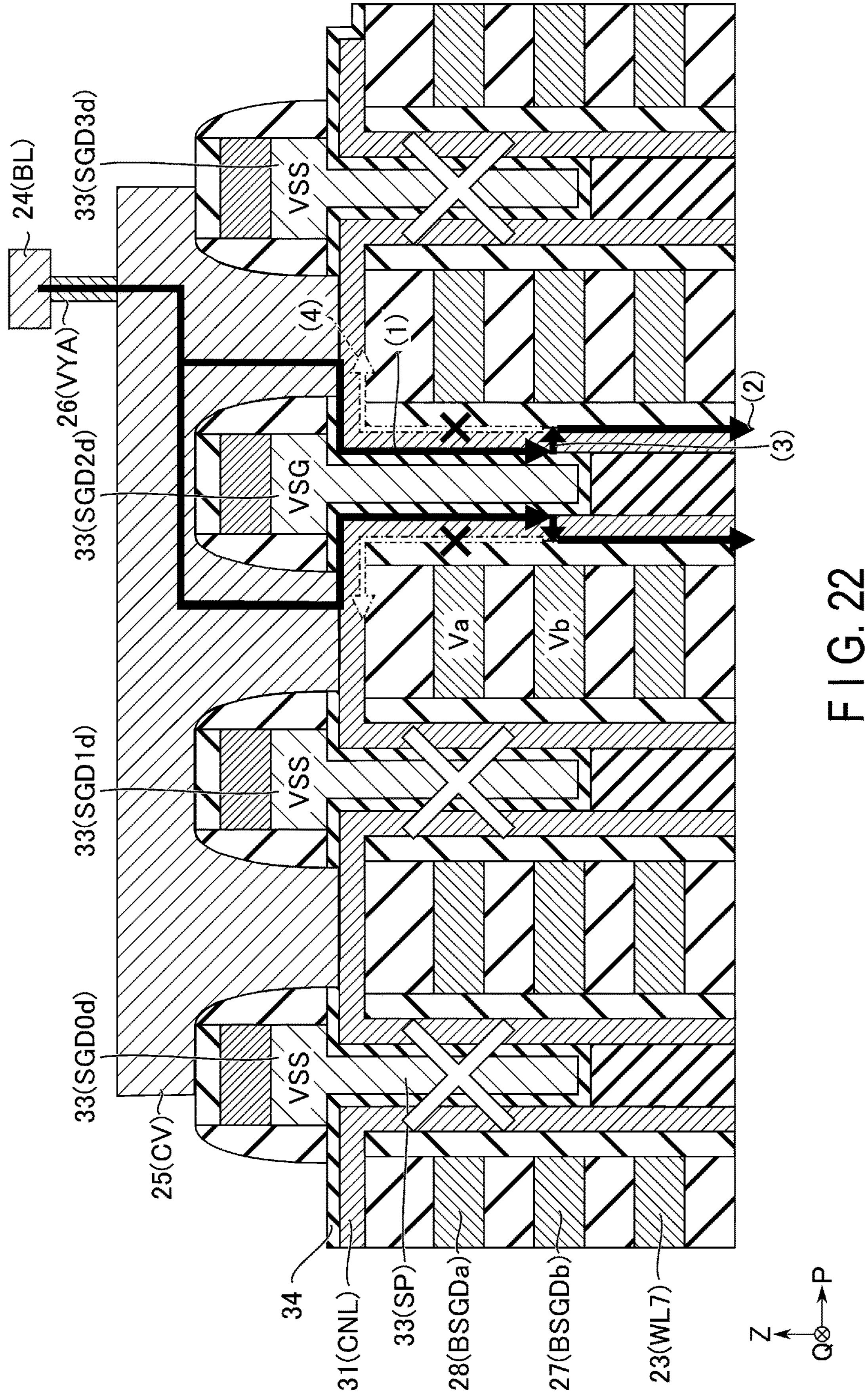
FIG. 22 is a schematic diagram showing an example of a selection operation in the memory device according to the second embodiment.

Next, a selection operation of the select transistor of the memory device according to the second embodiment will be described. FIG. 22 is a schematic diagram showing an example of a selection operation of the select transistor of the memory device according to the second embodiment. FIG. 22 schematically shows a voltage and a current path applied to the select transistor ST1 in a case where the string unit SU2 is selected, in addition to the enlarged cross-sectional structure of the upper portion of FIG. 20.

As shown in FIG. 22, in the case where the string unit SU2 is selected in the write operation, the read operation, or the like, the row decoder module 15 applies a voltage VSG to the select gate line SGD2. The voltage VSG is a voltage that turns the select transistors ST1*a* and ST1*b* to an ON state. Accordingly, in the memory pillar MP belonging to the string unit SU2, a channel (path (1) in FIG. 22) is formed in a region in contact with the insulating film 34 in the portion of the semiconductor film 31 extending in the Z direction.

On the other hand, in the case where the string unit SU2 is selected, the row decoder module 15 applies a voltage VSS to the select gate lines SGD0, SGD1, and SGD3. The voltage VSS is a voltage that turns the select transistors ST1*a* and ST1*b* to an OFF state. The voltage VSS is lower than, for example, the voltage VSG (VSS<VSG). Accordingly, in the memory pillars MP belonging to the string units SU0, SU1, and SU3, no channel is formed in a region in contact with the insulating film 34 in the portion of the semiconductor film 31 extending in the Z direction.

Further, the row decoder module 15 applies a voltage Vb0 to the select back gate line BSGDb. The voltage Vb is a voltage that turns the select transistor ST1*b* to the ON state. Accordingly, a channel (path (2) in FIG. 22) is formed in a region in contact with the stacked film 32 in the portion of the semiconductor film 31 belonging to the select transistor ST1*b*. For this reason, in the portion belonging to the select transistor ST1*b* of the semiconductor film 31, a channel is formed in both the region in contact with the insulating film 34 and the region in contact with the stacked film 32. Therefore, in the portion of the semiconductor film 31 belonging to the select transistor ST1*b*, a path (3) through which a current flows relatively easily is formed in a region between the region in contact with the insulating film 34 and the region in contact with the stacked film 32. As described above, in the memory pillar MP belonging to the string unit SU2, a current path passing through the path (3) from the path (1) via the path (2) is formed.

Further, the row decoder module 15 applies a voltage Va to the select back gate line BSGDa. The voltage Va is a voltage that turns the select transistor ST1*a* to the OFF state. The voltage Va is, for example, lower than the voltage Vb (Va<Vb). Accordingly, a channel (path (4) in FIG. 22) is not formed in a region in contact with the stacked film 32 in the portion of the semiconductor film 31 belonging to the select transistor ST1*a*. For this reason, in the memory pillar MP belonging to the string unit SU2, formation of a current path passing through the path (4) from the path (1) via the path (3) is suppressed. As described above, a current is prevented from flowing from the selected string unit SU2 to the non-selected string units SU0, SU1, and SU3.

2.3 Manufacturing Method

Each of FIGS. 23 through 32 is a diagram showing an example of a planar layout and a cross-sectional structure halfway through the manufacturing of the memory device according to the second embodiment. Each of FIGS. 23 through 32 includes a portion (A) showing a planar layout and a portion (B) showing a cross-sectional structure. The planar layout shown in the drawings corresponds to a region RB in FIG. 19. The cross-sectional structures shown in the drawings represent the region corresponding to FIG. 20. An example of steps of manufacturing the memory cell array 10 in the memory device 3 will be described below.

Figure 23:
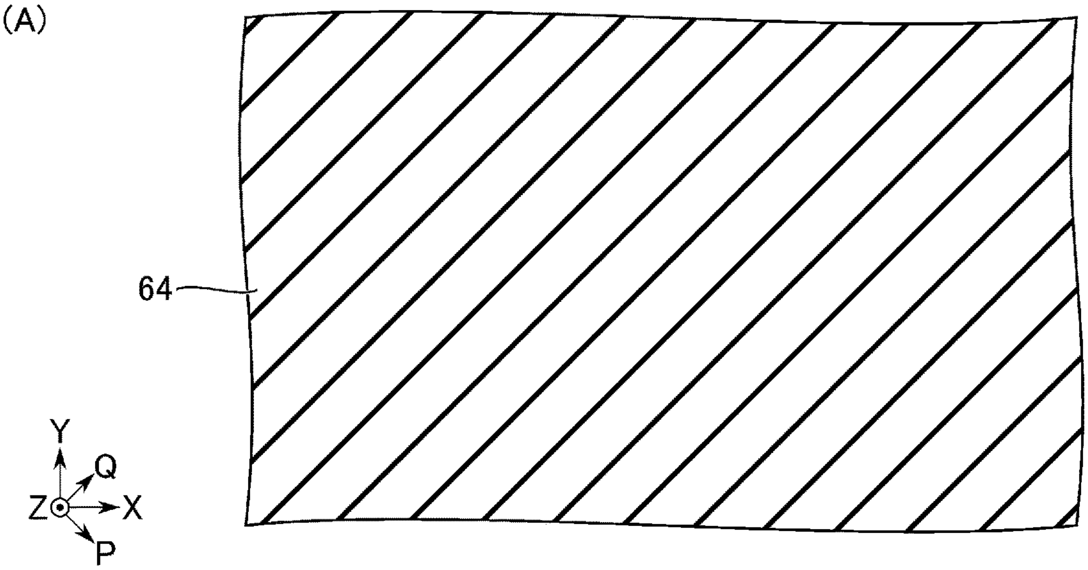
FIG. 23 is a diagram showing an example of a planar layout and a cross-sectional structure halfway through the manufacturing of the memory device according to the second embodiment.
Figure 23:
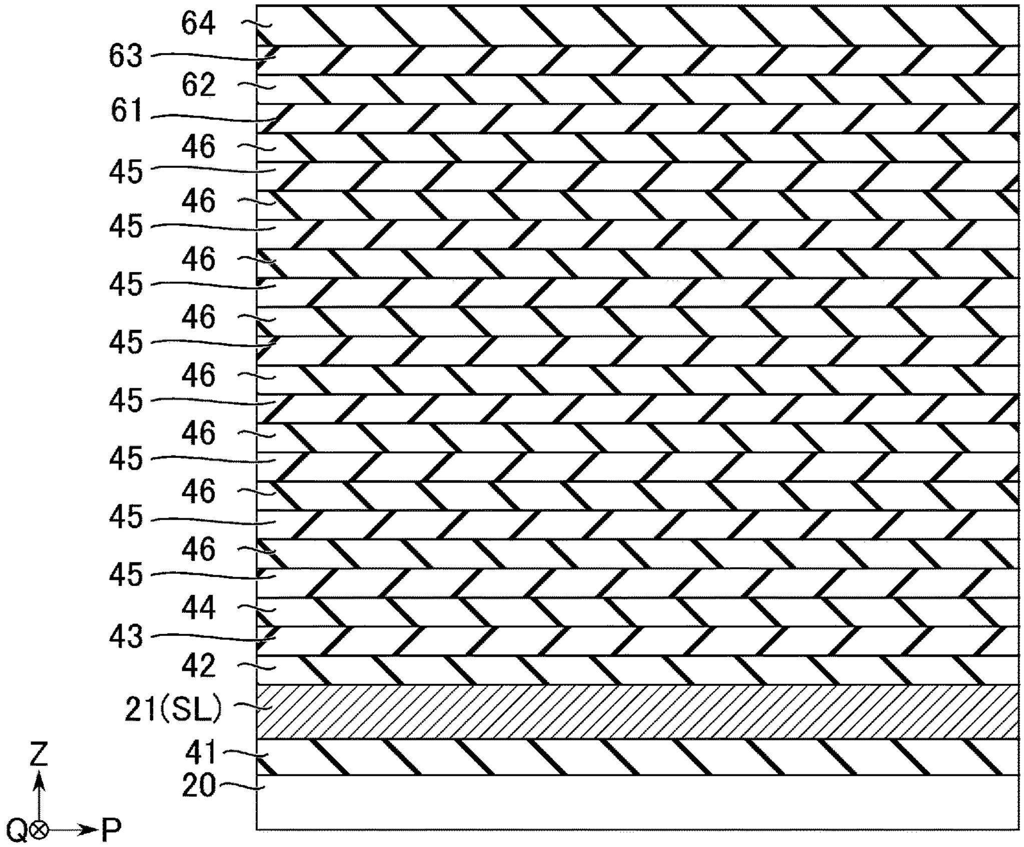

First, as shown in FIG. 23, the insulating layer 41 is formed on the upper surface of the semiconductor substrate 20. The conductive layer 21 and the insulating layer 42 are stacked in this order on the upper surface of the insulating layer 41. A sacrificial member 43 and an insulating layer 44 are sequentially stacked in this order on the upper surface of the insulating layer 42. The sacrificial members 45 and insulating layers 46 are alternately stacked on the upper surface of the insulating layer 44. A sacrificial member 61 and an insulating layer 62 are stacked in this order on the upper surface of the uppermost insulating layer 46. A sacrificial member 63 and an insulating layer 64 are sequentially stacked on the upper surface of the insulating layer 62. The insulating layers 62 and 64 contain, for example, silicon oxide. The sacrificial members 61 and 63 contain, for example, silicon nitride.

Figure 24:
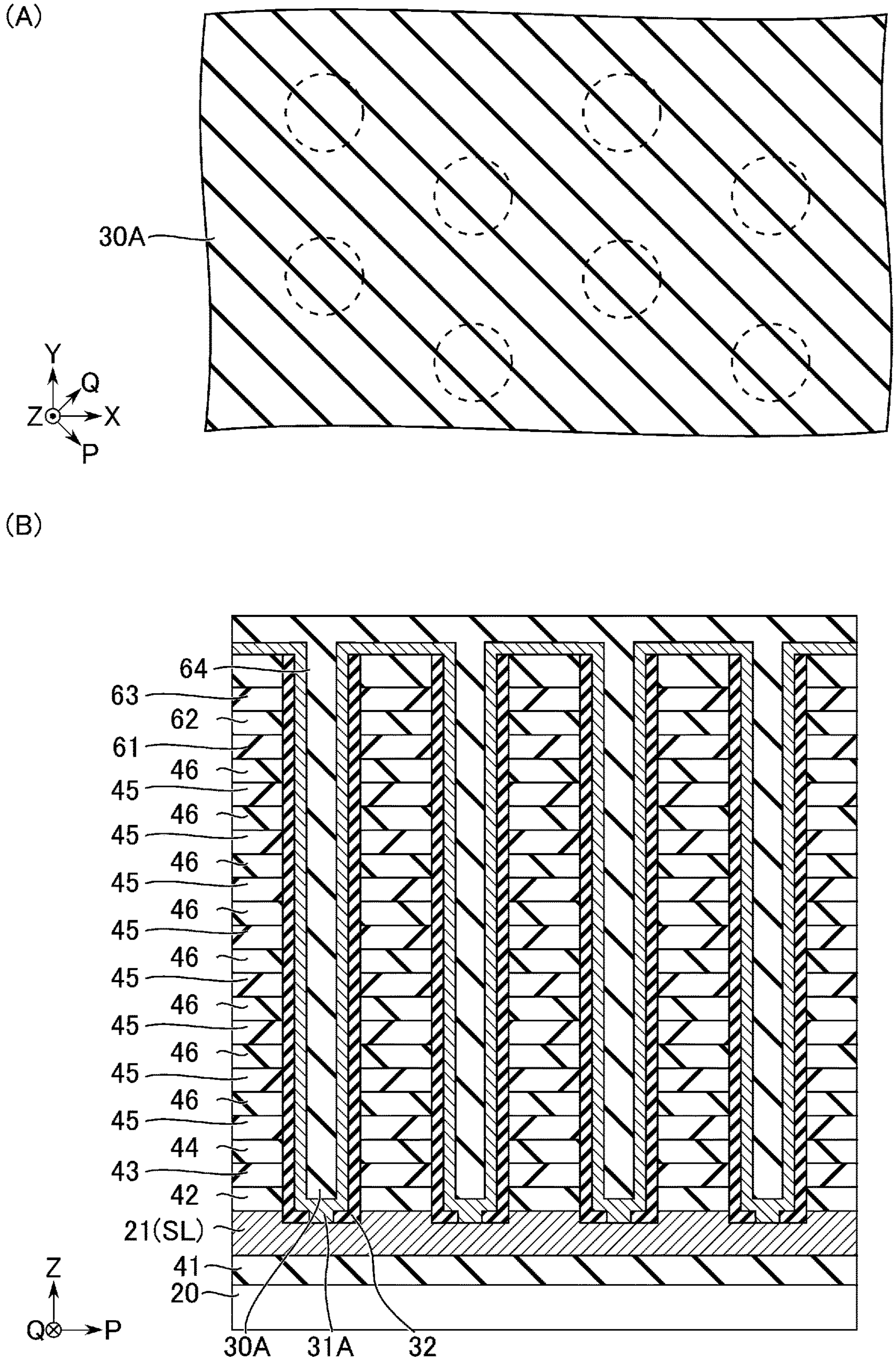
FIG. 24 is a diagram showing an example of a planar layout and a cross-sectional structure halfway through the manufacturing of the memory device according to the second embodiment.

Next, as shown in FIG. 24, a structure corresponding to the select transistors ST1*a*, ST1*b*, and ST2 and the memory cell transistors MT0 through MT7 in the memory pillar MP is formed. Briefly, a mask having openings in regions corresponding to the memory pillars MP is formed by photolithography or the like. Then, anisotropic etching is performed with the mask so that a plurality of holes (not shown) penetrating, for example, the insulating layers 42, 44, 46, 62, and 64 and the sacrificial members 43, 45, 61, and 63 are formed. A part of the conductive layer 21 is exposed in the bottom portion of each hole. Thereafter, the stacked film 32 is formed on the side surface and the bottom surface of each hole. Then, a part of the stacked film 32 provided in the bottom portion of each hole is removed, and thereafter a semiconductor film 31A and a core film 30A are sequentially formed over the upper surface of the insulating layer 64 and over the side surface and the bottom surface in each hole. Each hole is filled with the core film 30A.

Figure 25:
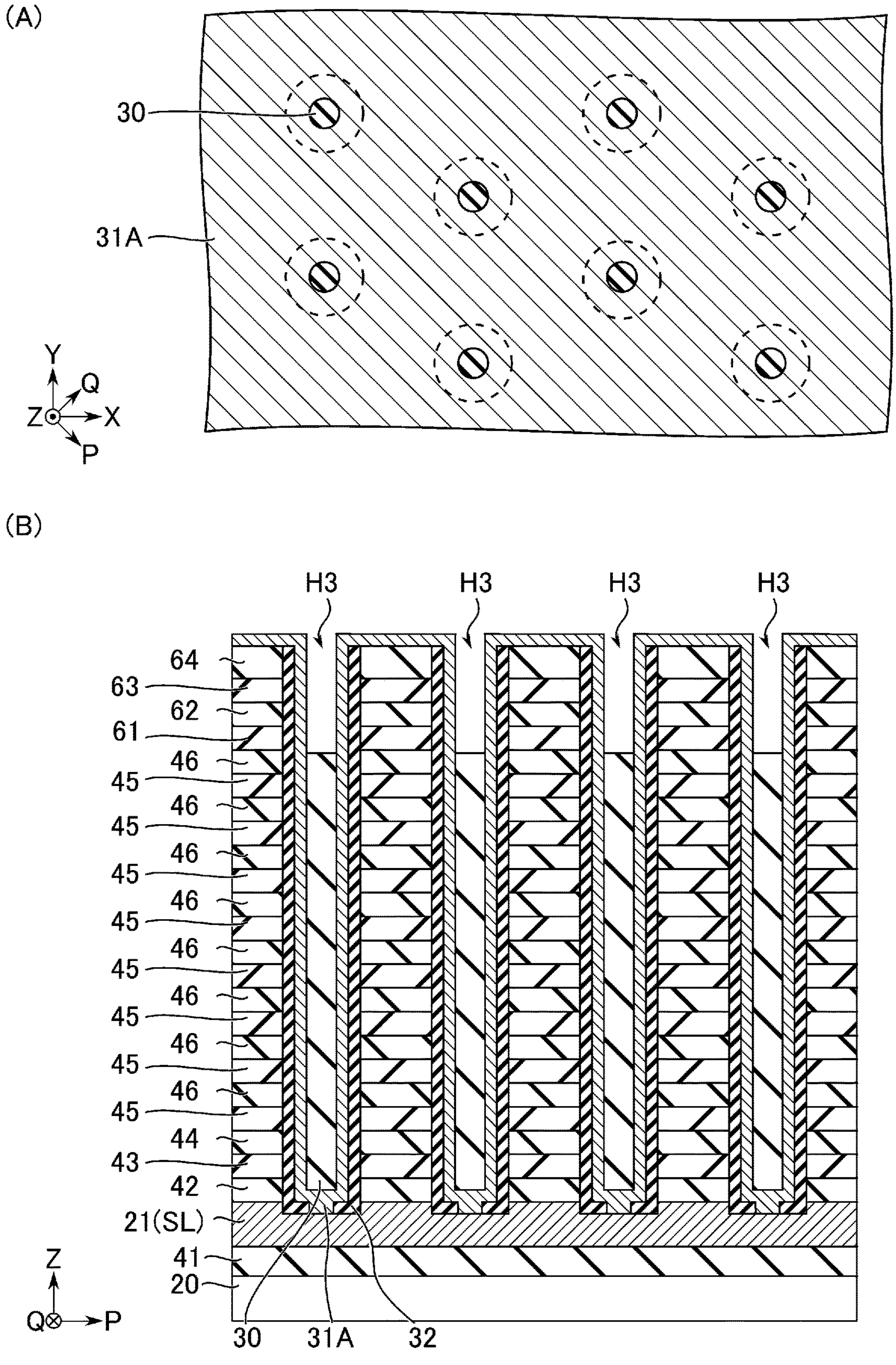
FIG. 25 is a diagram showing an example of a planar layout and a cross-sectional structure halfway through the manufacturing of the memory device according to the second embodiment.

Then, as shown in FIG. 25, the portion of the core film 30A provided on the upper surface of the insulating layer 64 and the upper portion of each hole is removed. Thus, the core film 30A is divided into a plurality of core films 30. A plurality of holes H3 penetrating the insulating layers 62 and 64 and the sacrificial members 61 and 63 are formed in the stacked structure.

Figure 26:
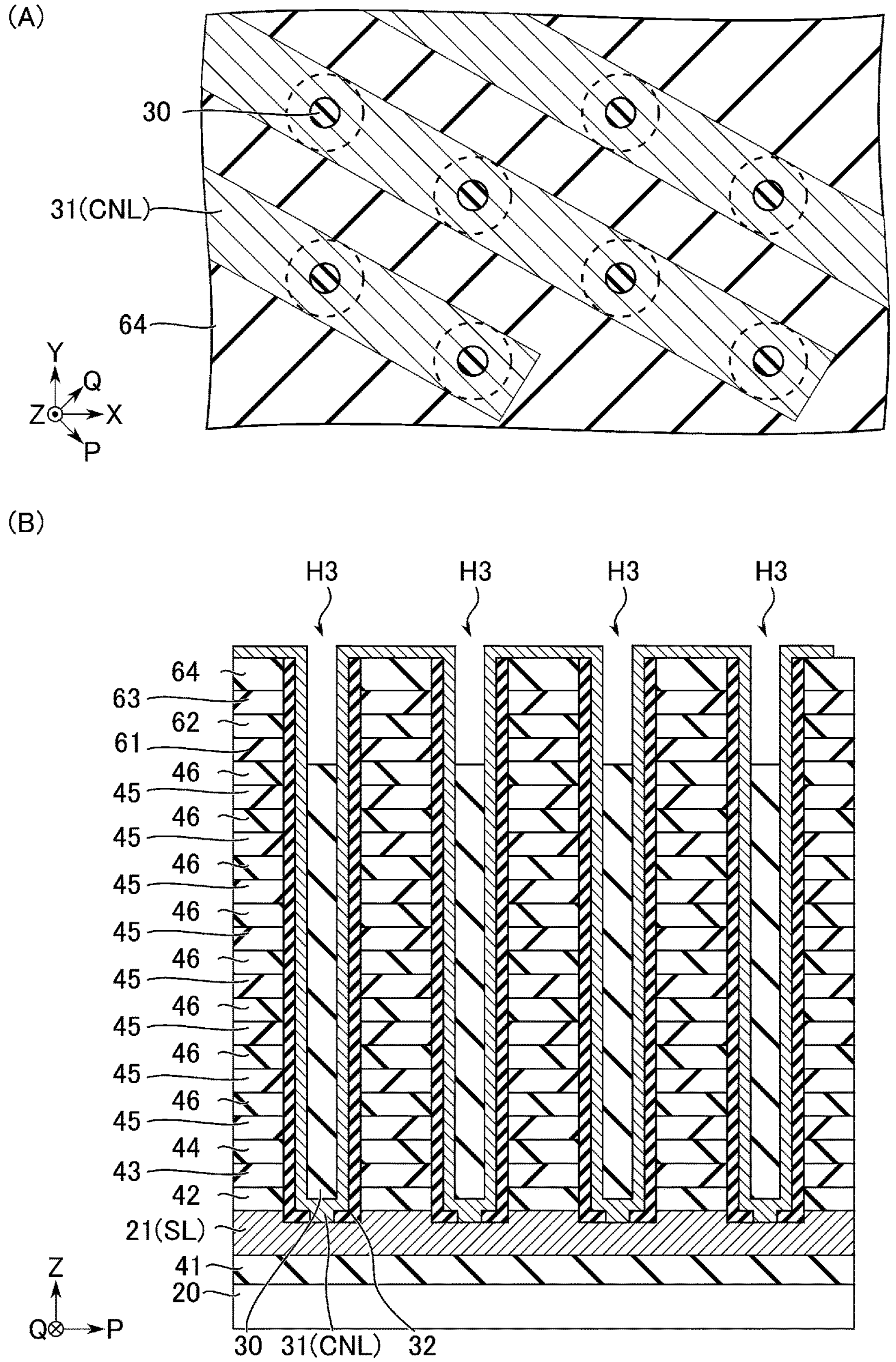
FIG. 26 is a diagram showing an example of a planar layout and a cross-sectional structure halfway through the manufacturing of the memory device according to the second embodiment.

Next, as shown in FIG. 26, the semiconductor film 31A is divided into portions each corresponding to sixteen memory pillars MP. To be specific, for example, anisotropic etching is performed to remove portions of the semiconductor film 31A provided on the upper surface of the insulating layer 64, excluding portions which are to function as the current path selection portions CNL. As a result, the semiconductor film 31A is divided into a plurality of semiconductor films 31. Each of the semiconductor films 31 includes sixteen portions extending in the Z direction and a portion extending in the P direction and continuous with the sixteen portions extending in the Z direction.

Figure 27:
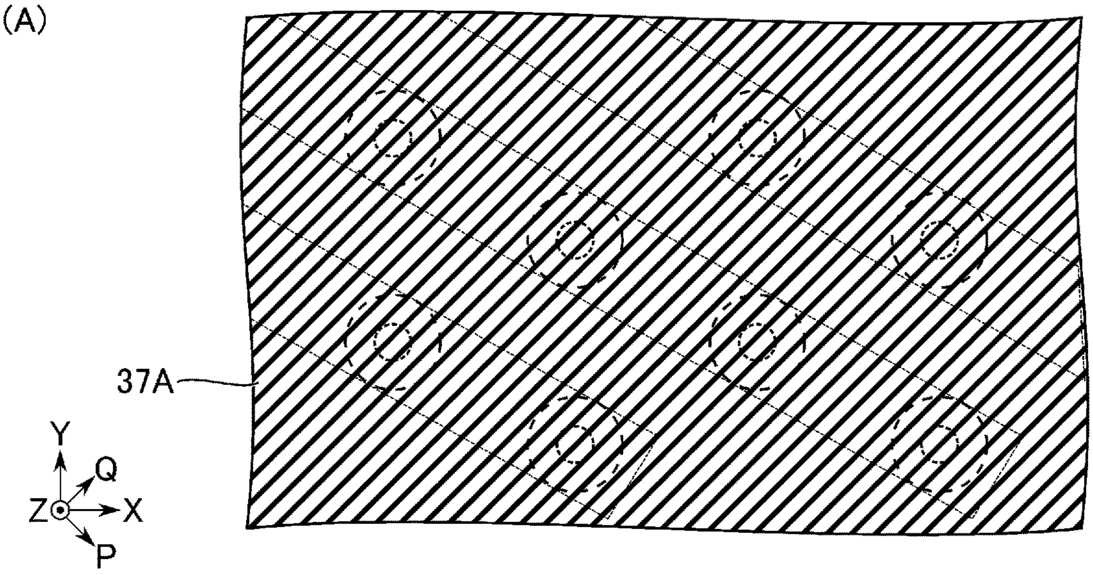
FIG. 27 is a diagram showing an example of a planar layout and a cross-sectional structure halfway through the manufacturing of the memory device according to the second embodiment.
Figure 27:
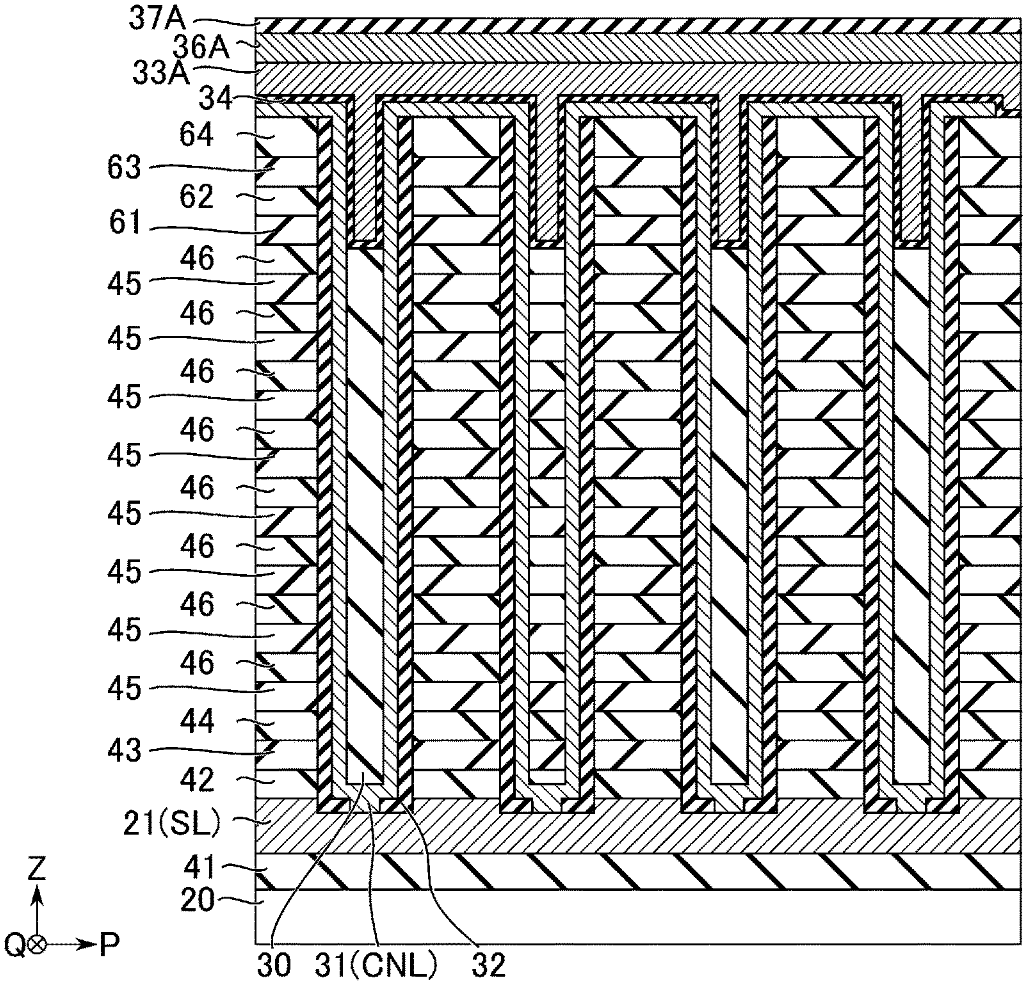

Next, as shown in FIG. 27, the insulating film 34 is formed over the upper surface of the insulating layer 64 and the side surfaces and the bottom surface of each of the plurality of holes H3. A conductive film 33A is formed on the upper surface of the insulating film 34 so as to fill the holes H3. Over the upper surface of the conductive film 33A, the conductive layer 36A and the insulating layer 37A are sequentially stacked.

Figure 28:
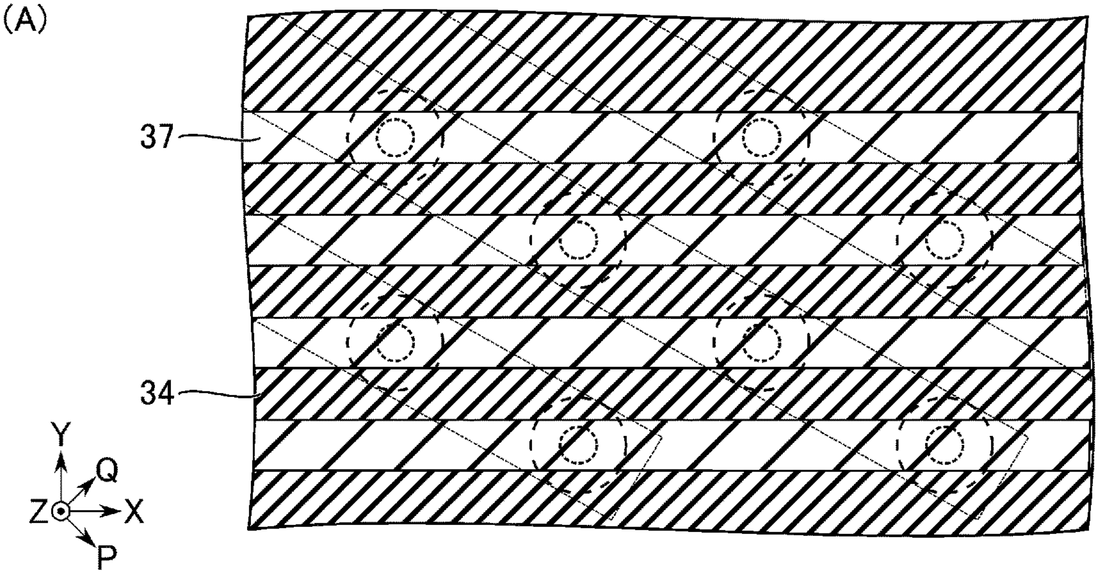
FIG. 28 is a diagram showing an example of a planar layout and a cross-sectional structure halfway through the manufacturing of the memory device according to the second embodiment.
Figure 28:
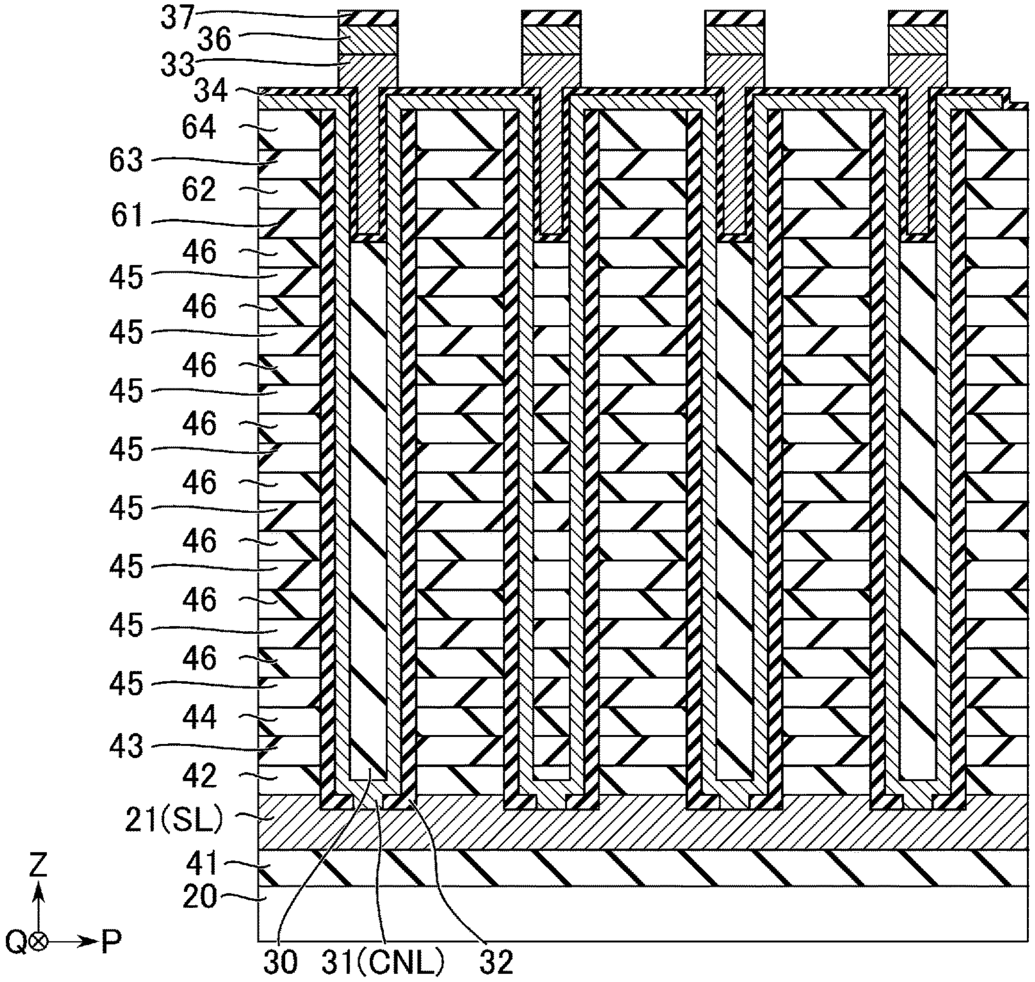

Next, as shown in FIG. 28, the conductive film 33A, the conductive layer 36A, and the insulating layer 37A are divided into portions corresponding to the select gate lines SGD. As a result, the conductive film 33A, the conductive layer 36A, and the insulating layer 37A are divided into a plurality of conductive films 33, a plurality of conductive layers 36, and a plurality of insulating layers 37, respectively. Each of the conductive films 33 includes a plurality of portions extending in the Z direction and arranged in a row along the X direction, and a portion extending in the X direction and intersecting the plurality of portions.

Figure 29:
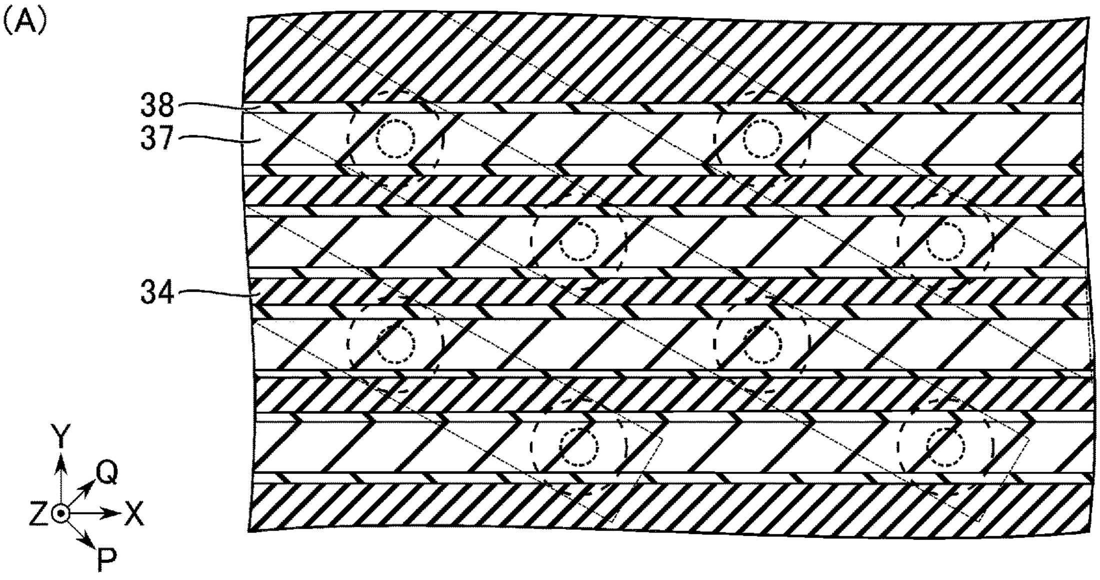
FIG. 29 is a diagram showing an example of a planar layout and a cross-sectional structure halfway through the manufacturing of the memory device according to the second embodiment.
Figure 29:
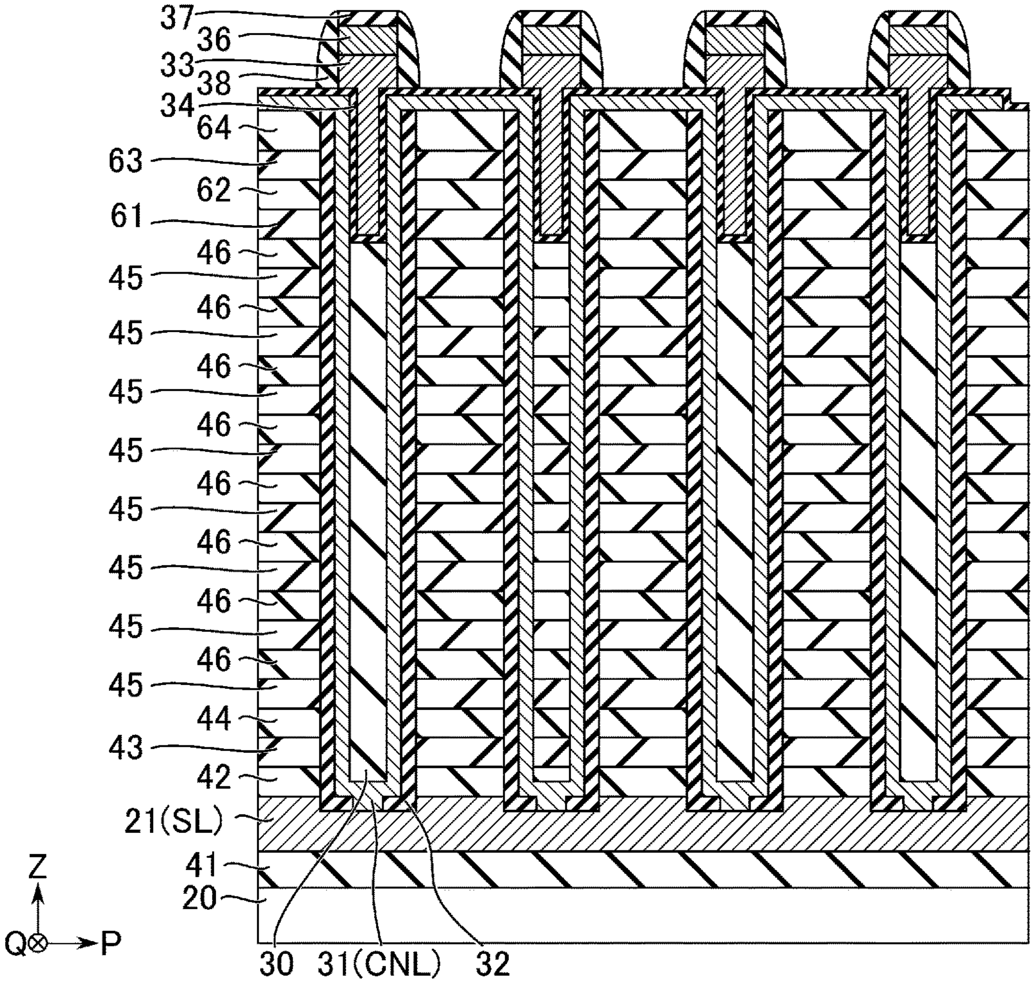

Next, as shown in FIG. 29, the insulating film 38 is formed on the side surfaces of the portions of the plurality of conductive films 33 extending in the X direction, the side surfaces of the plurality of conductive layers 36, and the side surfaces of the plurality of insulating layers 37. Specifically, after the insulating film 38 is formed over the entire surface, the insulating film 38 formed on the upper surface of the insulating film 34 is removed by anisotropic etching. As a result, the side surfaces of the conductive film 33, the conductive layer 36, and the insulating layer 37 are covered with the insulating film 38 while the insulating film 38 is removed from the upper surface of the insulating film 34 by utilizing anisotropy of the etching.

Figure 30:
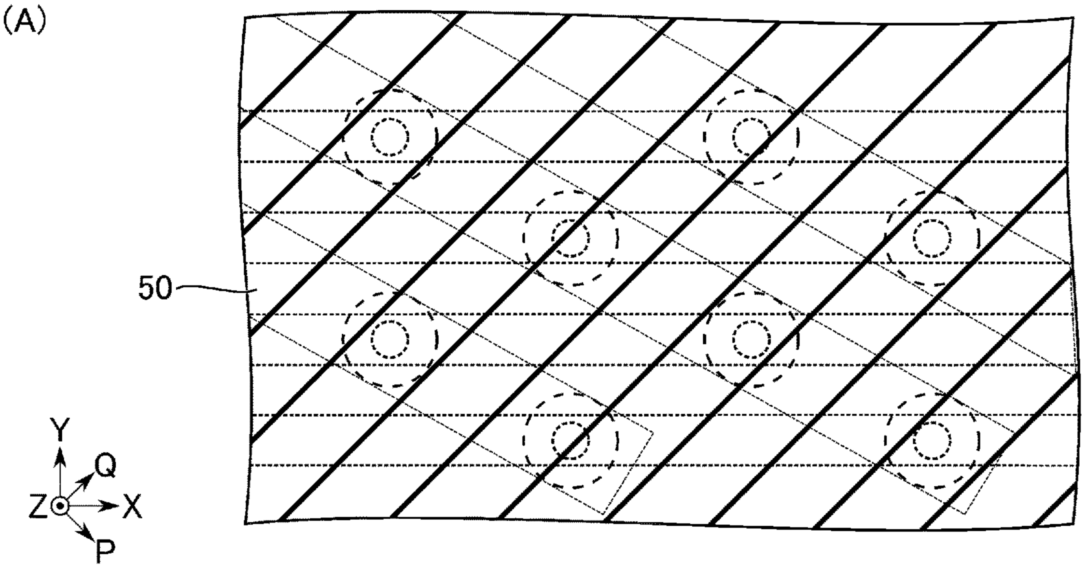
FIG. 30 is a diagram showing an example of a planar layout and a cross-sectional structure halfway through the manufacturing of the memory device according to the second embodiment.
Figure 30:
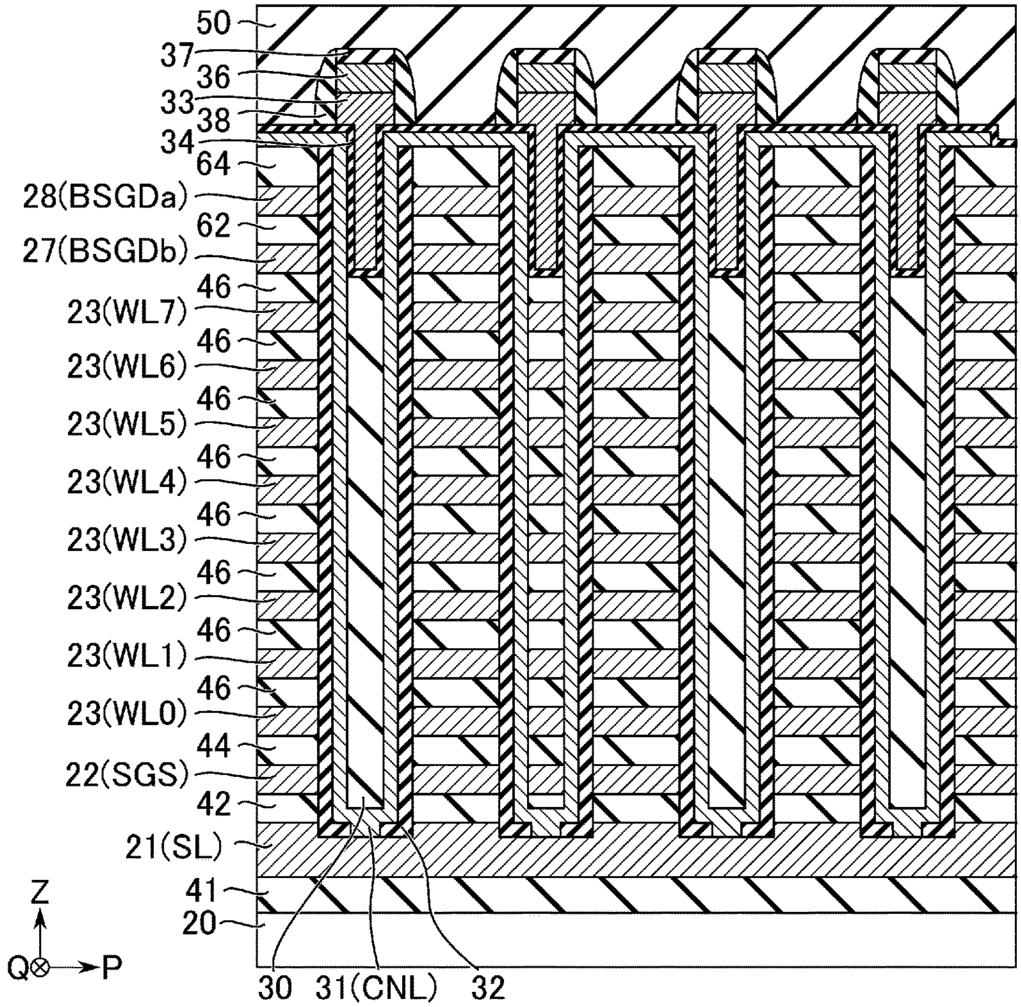

Next, a replacement process for the sacrificial members of the stacked structure is performed. Thus, as shown in FIG. 30, a stacked interconnect structure is formed. Specifically, first, an insulating layer 50 is formed over the entire surface, and thereafter, a mask having openings in regions corresponding to the members SLT is formed by photolithography or the like in a region not shown in FIG. 30. Then, anisotropic etching is performed with the mask so that the slits (not shown) penetrating, for example, the insulating layer layers 42, 44, 46, 50, 62, and 64, the insulating film 34, and the sacrificial members 43, 45, 61 and 63 are formed. Thereafter, wet etching with thermal phosphoric acids, etc. is performed to selectively remove the sacrificial members 43, 45, 61 and 63 via the slits. Then, a conductor is placed to fill each space created by the removal of the sacrificial members 43, 45, 61, and 63 via the slits.

The conductor formed inside the slits is removed by an etch-back process. Therefore, the conductors formed in the adjacent interconnect layers are separated from each other. Thus, the conductive layer 22 functioning as the select gate line SGS, the conductive layers 23 respectively functioning as the word lines WL0 through WL7, the conductive layer 27 functioning as the select back gate line BSGDa, and the conductive layer 28 functioning as the select back gate line BSGDb are formed. The slits are filled with the insulating film 39. Thus, the members SLT are formed.

Figure 31:
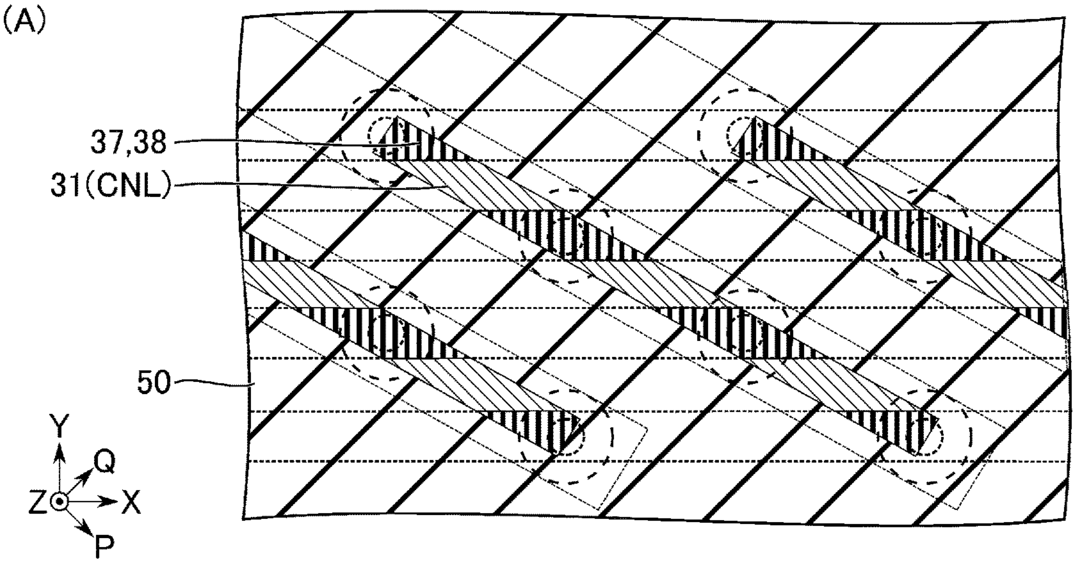
FIG. 31 is a diagram showing an example of a planar layout and a cross-sectional structure halfway through the manufacturing of the memory device according to the second embodiment.
Figure 31:
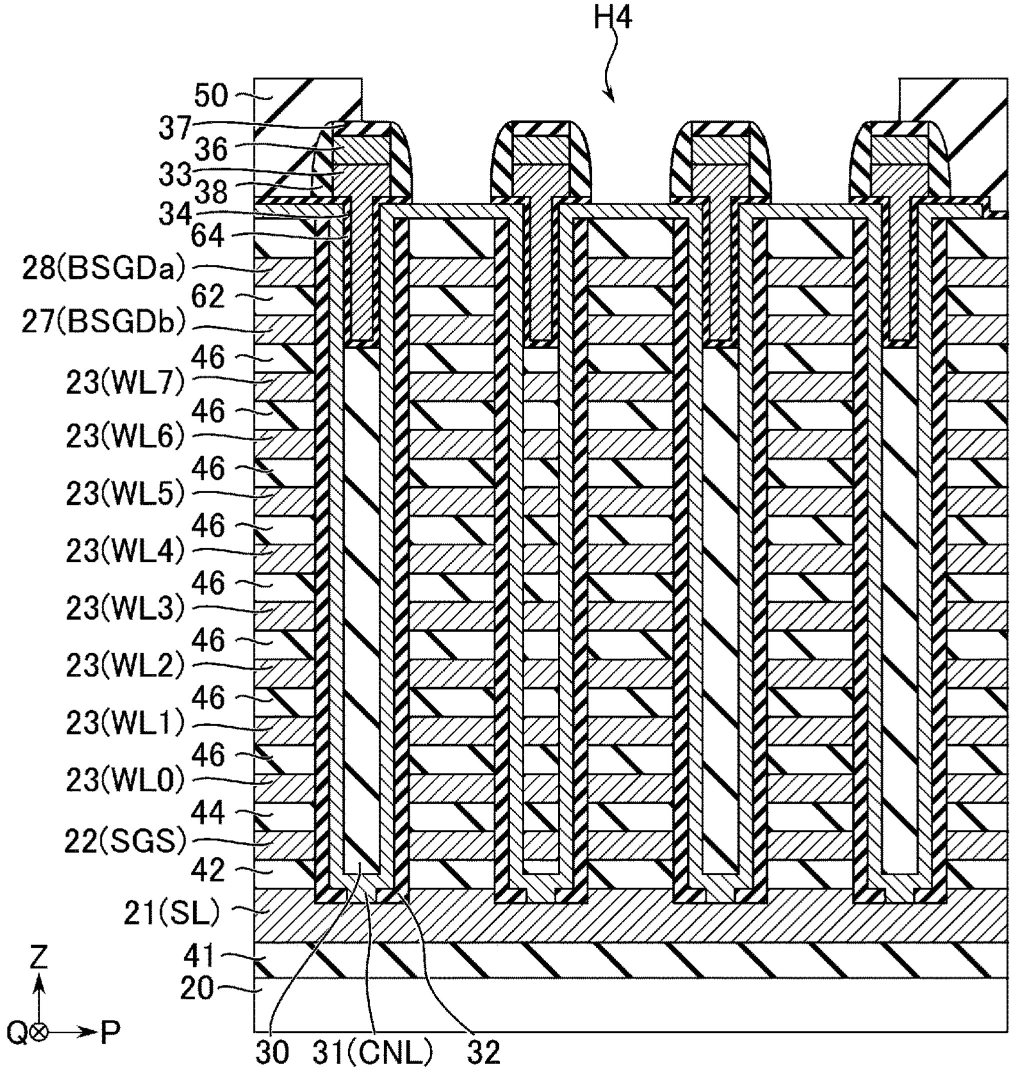

Next, as shown in FIG. 31, a hole H4 is formed in a region where a structure corresponding to the contact CV is to be formed. Specifically, a mask having openings in regions corresponding to the contacts CV is formed by photolithography or the like. Then, a plurality of holes H4 penetrating the insulating layer 50 are formed by anisotropic etching using the mask. In a bottom portion of each hole H4, a part of the upper surface of the insulating layer 37, a part of the side surface of the insulating film 38, and a part of the portion of the semiconductor film 31 extending in the P direction are exposed. For forming the holes H4, anisotropic etching with a large selectivity ratio of silicon oxide to silicon nitride is applied. Thus, the positions of the holes H4 can be self-aligned while suppressing exposure of the conductive film 33 and the conductive layer 36.

Figure 32:
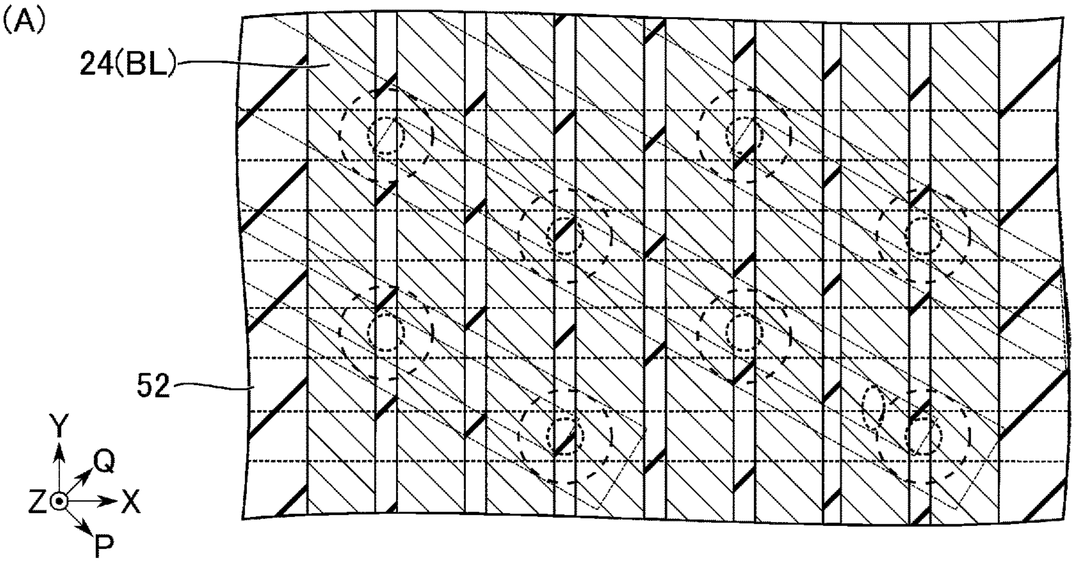
FIG. 32 is a diagram showing an example of a planar layout and a cross-sectional structure halfway through the manufacturing of the memory device according to the second embodiment.
Figure 32:
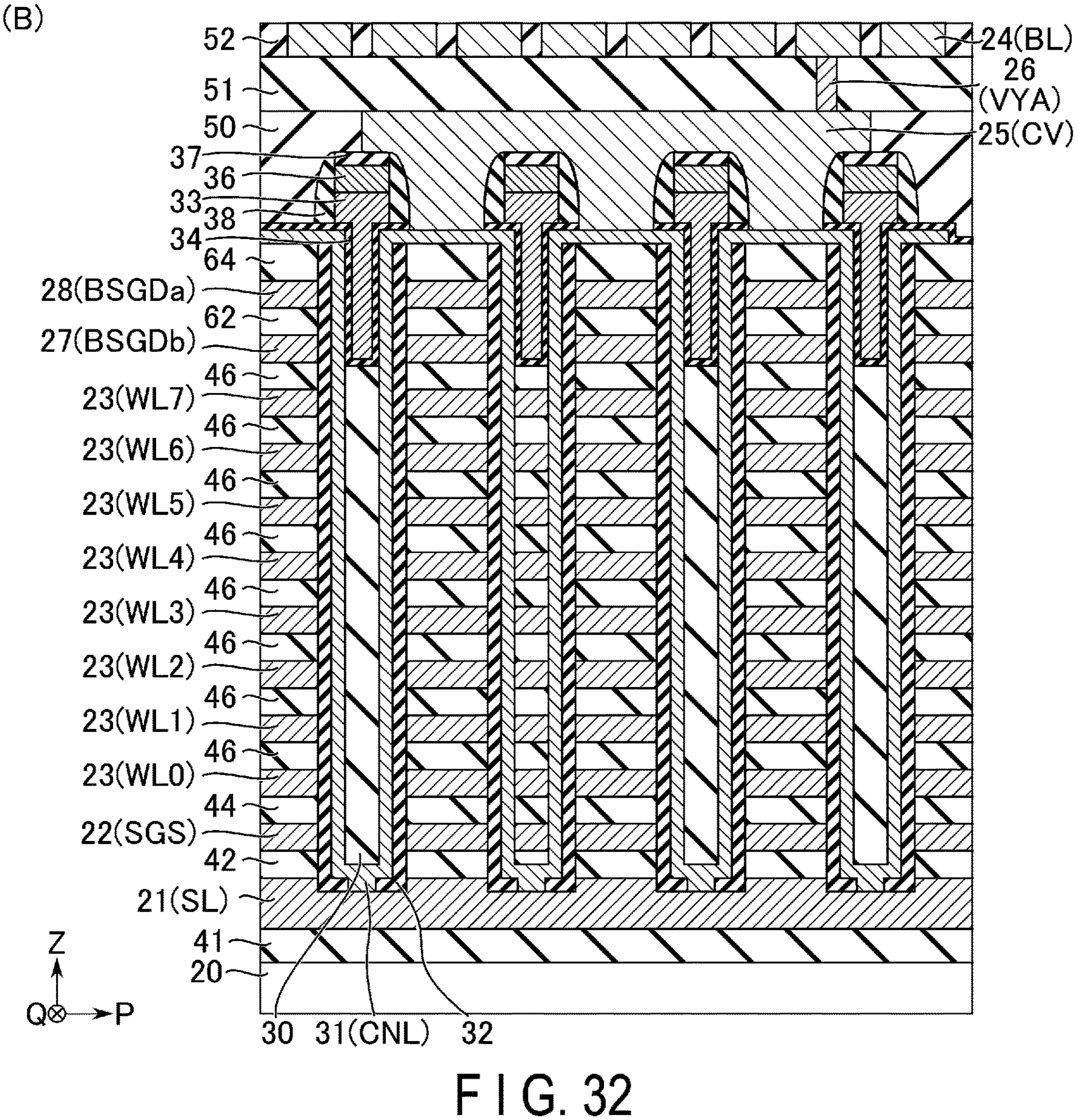

Next, as shown in FIG. 32, the contacts CV, VYA, and VYB (not shown) and the bit lines BL are formed. To be specific, the holes H4 are filled with the conductive layer 25. Thereafter, a process of forming the contacts VYA and VYB and the bit lines BL is executed through steps equivalent to those of the first embodiment shown in FIG. 17.

The memory cell array 10 is thus formed by the manufacturing process described above.

2.4 Advantageous Effect of Second Embodiment

According to the second embodiment, the conductive layers 27 and 28 are provided so as to be spaced apart from each other above the uppermost conductive layer 23. Each of the conductive layers 27 and 28 intersects the semiconductor film 31 and the conductive film 33. Thus, the select transistor ST1 includes a select transistor ST1*b* using the conductive layer 27 as a select back gate line BSGDb and a select transistor ST1*a* using the conductive layer 28 as a select back gate line BSGDa. Therefore, in the semiconductor film 31 of the memory pillar MP, a current path can be formed in both the region on the conductive film 33 side and the region on the conductive layers 27 and 28 side. Specifically, at the time of the write operation or the read operation, in the memory pillar MP belonging to the selected string unit SU, it is possible to block the current from flowing through the path (4) while causing the current to flow through the paths (1), (2), and (3) shown in FIG. 22. Therefore, the resistance of the current path in the selected string unit SU can be made low while the leakage of the current to the non-selected string unit SU is suppressed.

The portion of the semiconductor film 31 extending in the P direction is shared by the sixteen memory pillars MP. The conductive layer 25 is shared by the four memory pillars MP belonging to different string units SU. Thus, the number of contacts CV and VYA that electrically couple the memory pillars MP and the bit lines BL can be reduced to one fourth of the number of memory pillars MP. For this reason, it is possible to suppress the manufacturing load compared to the case where the same number of contacts as the number of memory pillars MP are provided.

3. Third Embodiment

Next, a third embodiment will be described.

The third embodiment is equivalent to the first embodiment in that each current path selection portion CNL is configured to intersect two memory pillars MP. The third embodiment is also equivalent to the second embodiment in that the back gate is formed in the layer in which the select transistor ST1 is formed. However, the third embodiment is different from the first embodiment and the second embodiment in that each of a plurality of sub-select gate lines SGD extending in the X direction is formed to intersect a plurality of rows of memory pillars MP. In the following explanation, a description of the same configuration, operation, and manufacturing method as in the second embodiment will be omitted, and a configuration, operation, and manufacturing method different from the second embodiment will mainly be described.

3.1 Configuration

A configuration of a memory device according to the third embodiment will be described.

3.1.1 Structure of Memory Cell Array

An example of the structure of a memory cell array included in a memory device according to the third embodiment will be described below.

3.1.1.1 Planar Layout

Figure 33:
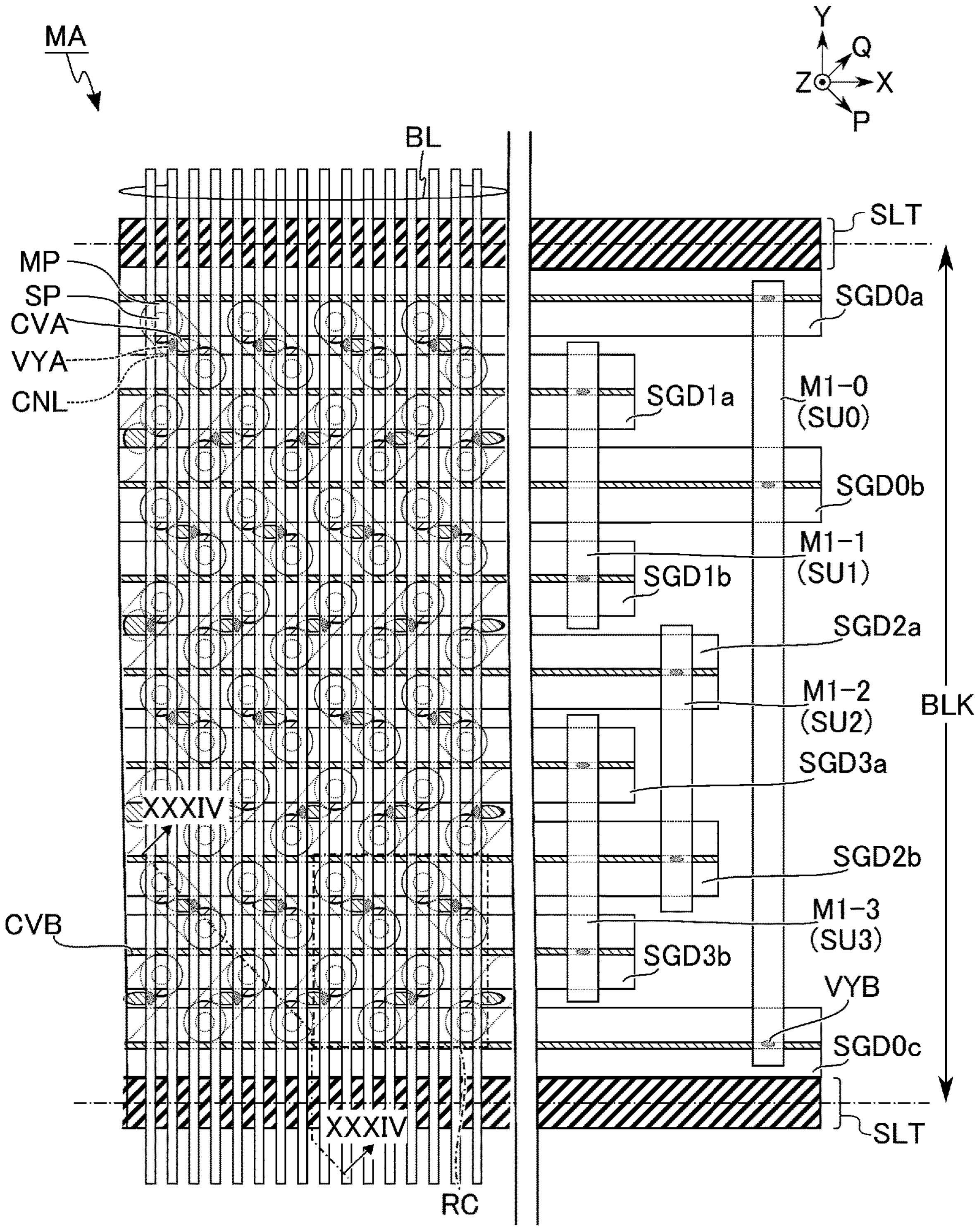
FIG. 33 is a plan view showing an example of a planar layout of a memory cell array according to a third embodiment.

FIG. 33 is a plan view showing an example of a planar layout of a memory cell array according to the third embodiment. FIG. 33 corresponds to FIG. 3 of the first embodiment and FIG. 19 of the second embodiment. As shown in FIG. 33, the memory cell array 10 includes a plurality of contacts CVA and CVB.

The select gate line SGD0 includes a plurality of sub-select gate lines SGD0*a*, SGD0*b*, and SGD0*c*. The select gate line SGD1 includes a plurality of sub-select gate lines SGD1*a* and SGD1*b*. The select gate line SGD2 includes a plurality of sub-select gate lines SGD2*a* and SGD2*b*. The select gate line SGD3 includes a plurality of sub-select gate lines SGD3*a* and SGD3*b*.

The sub-select gate lines SGD0*a* through SGD0*c* are electrically coupled to the pillar-shaped electrodes SP arranged in the first row, the fourth row, the fifth row, and the sixteenth row, respectively. The sub-selection gate lines SGD1*a* and SGD1*b* are electrically coupled to the pillar-shaped electrodes SP arranged in the second and third rows and the sixth and seventh rows, respectively. The sub-selection gate lines SGD2*a* and SGD2*b* are electrically coupled to the pillar-shaped electrodes SP arranged in the eighth and ninth rows and the twelfth and thirteenth rows, respectively. The sub-selection gate lines SGD3*a* and SGD3*b* are electrically coupled to the pillar-shaped electrodes SP arranged in the tenth and eleventh rows and the fourteenth and fifteenth rows, respectively.

The contacts CVB are provided to correspond to the sub-select gate lines SGD0*a* through SGD3*b*, respectively. Each of the contacts CVB extends in the X direction. The contacts CVB are arranged between one of the two members SLT and the pillar-shaped electrodes SP arranged in the first row, between the pillar-shaped electrodes SP arranged in the 2k-th row and the pillar-shaped electrodes SP arranged in the (2k+1)-th row, and between the other of the two members SLT and the pillar-shaped electrodes SP arranged in the sixteenth row (1≤k≤7).

Each of the plurality of contacts VYB is provided to correspond to one sub-select gate line. Each of the contacts VYB is arranged to overlap the corresponding contact CVB.

The interconnect M1-0 is electrically coupled to the sub-select gate lines SGD0*a* through SGD0*c* via the contacts VYB and CVB. The interconnect M1-1 is electrically coupled to the sub-select gate lines SGD1*a* and SGD1*b* via the contacts VYB and CVB. The interconnect M1-2 is electrically coupled to the sub-select gate lines SGD2*a* and SGD2*b* via the contacts VYB and CVB. The interconnect M1-3 is electrically coupled to the sub-select gate lines SGD3*a* and SGD3*b* via the contacts VYB and CVB.

Each of the current path selection portions CNL extends in one direction in the XY plane above the memory pillar MP. Each of the current path selection portions CNL is arranged to intersect the memory pillars MP respectively arranged in the rows adjacent to each other. In the example of FIG. 33, similarly to the example of FIG. 3 of the first embodiment, each of the current path selection portions CNL is arranged so as to intersect a total of two memory pillars MP respectively arranged in the two adjacent rows.

Each of the contacts CVA is provided to correspond to one current path selection portion CNL. Each of the contacts CVA is disposed between two memory pillars MP electrically coupled by the current path selection portion CNL among the corresponding current path selection portions CNL and between two adjacent sub-selection gate lines.

Each of the contacts VYA is provided to correspond to one contact CVA. Each of the contacts VYA is arranged to overlap the corresponding contact CVA.

Each of the bit lines BL is electrically coupled to the corresponding current path selection portion CNL via the contacts VYA and CVA.

3.1.1.2 Cross-Sectional Structure

Figure 34:
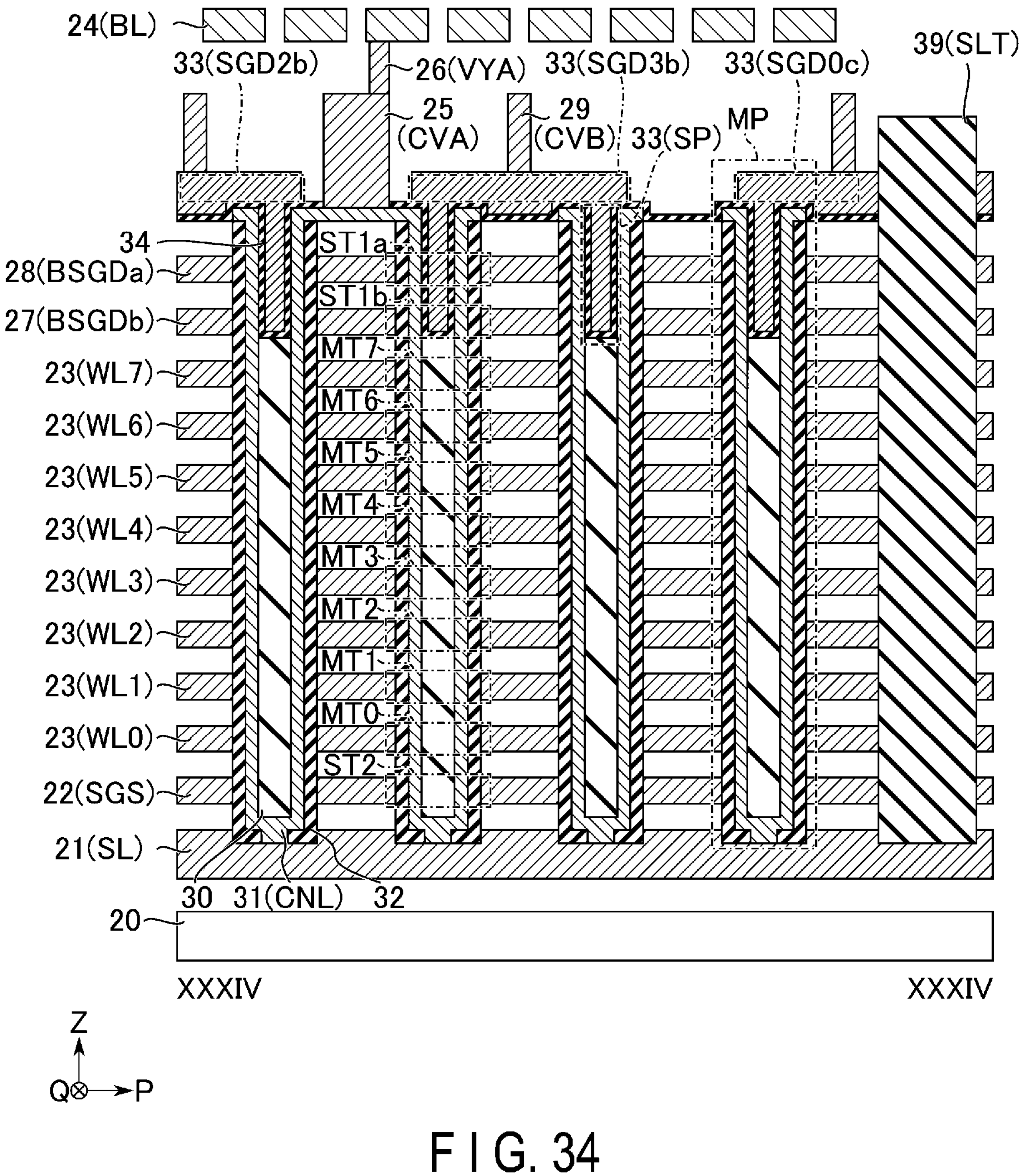
FIG. 34 is a cross-sectional view taken along line XXXIV-XXXIV and showing an example of a cross-sectional structure of the memory cell array according to the third embodiment.

FIG. 34 is a cross-sectional view taken along line XXXIV-XXXIV and showing an example of a cross-sectional structure of the memory cell array according to the third embodiment. As shown in FIG. 34, the memory cell array 10 further includes a conductive layer 29.

Each memory pillar MP includes, for example, a core film 30, a semiconductor film 31, a stacked film 32, a conductive film 33, and an insulating film 34. Since the configurations of the core film 30, the stacked film 32, and the insulating film 34 are the same as those in the second embodiment, description thereof will be omitted.

The semiconductor film 31 includes a portion extending in the Z direction and a portion extending in the P direction or the Q direction. In the illustrated region, one semiconductor film 31 having a portion extending in the P direction and two semiconductor films 31 having a portion extending in the Q direction are indicated. The portion of the semiconductor film 31 extending in the P direction or the Q direction is shared by two memory pillars MP.

The conductive layer 25 is provided on the upper surface of the portion of the semiconductor film 31 extending in the P direction or the Q direction. The conductive layer 26 is provided on the upper surface of the conductive layer 25. The conductive layers 25 and 26 are used as the contacts CVA and VYA, respectively. In the illustrated region, one contact CVA and one contact VYA corresponding to a portion of the semiconductor film 31 extending in the P direction are shown. One conductive layer 24 is provided on the upper surface of the conductive layer 26. The conductive layer 24 functions as the bit line BL.

The conductive film 33 includes a portion extending in the Z direction and a portion extending in the X direction. The portion of the conductive film 33 extending in the Z direction functions as the pillar-shaped electrode SP. The portion of the conductive film 33 extending in the X direction functions as one of the sub-select gate lines SGD0*a* through SGD3*b*. Each of the portions extending in the X direction of the seven conductive films 33 functioning as the sub-select gate line SGD0*b* and SGD1*a* through SGD3*b* is shared by the memory pillars MP in two adjacent rows. Each of the portions extending in the X direction of the two conductive films 33 functioning as the sub-select gate lines SGD0*a* and SGD0*c* is shared by the memory pillars MP in one row. In the illustrated region, three conductive films 33 including portions functioning as the sub-select gate lines SGD2*b*, SGD3*b*, and SGD0*c* are indicated.

The conductive layer 29 is provided on the upper surface of the portion of the conductive film 33 extending in the X direction. The conductive layer 29 is used as the contact CVB. In the illustrated region, three contacts CVB corresponding to the sub-selection gate lines SGD2*b*, SGD3*b*, and SGD0*c* are indicated.

3.2 Manufacturing Method

Each of FIGS. 35 through 41 is a diagram showing an example of a planar layout and a cross-sectional structure halfway through the manufacturing of the memory device according to the third embodiment. Each of FIGS. 35 through 41 includes a portion (A) showing a planar layout and a portion (B) showing a cross-sectional structure. The planar layout shown in the drawings corresponds to a region RC in FIG. 33. The sectional structures shown in the drawings represent the region corresponding to FIG. 34. An example of steps of manufacturing the memory cell array 10 of the memory device 3 will be described.

First, a structure including the core film 30A, the semiconductor film 31A, and the stacked film 32 is formed on the stacked structure through steps equivalent to those shown in FIGS. 23 and 24 of the second embodiment. Thereafter, the core film 30A is divided into the plurality of core films 30 through the same step as that shown in FIG. 25 of the second embodiment. Thus, a plurality of holes H3 penetrating the insulating layers 62 and 64 and the sacrificial members 61 and 63 are formed in the stacked structure.

Figure 35:
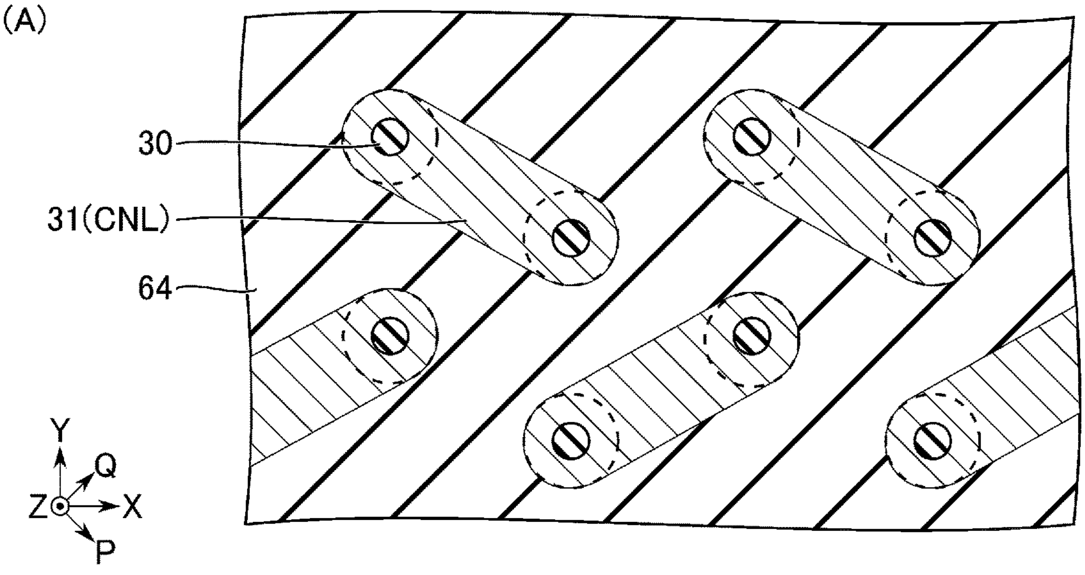
FIG. 35 is a diagram showing an example of a planar layout and a cross-sectional structure halfway through the manufacturing of the memory device according to the third embodiment.
Figure 35:
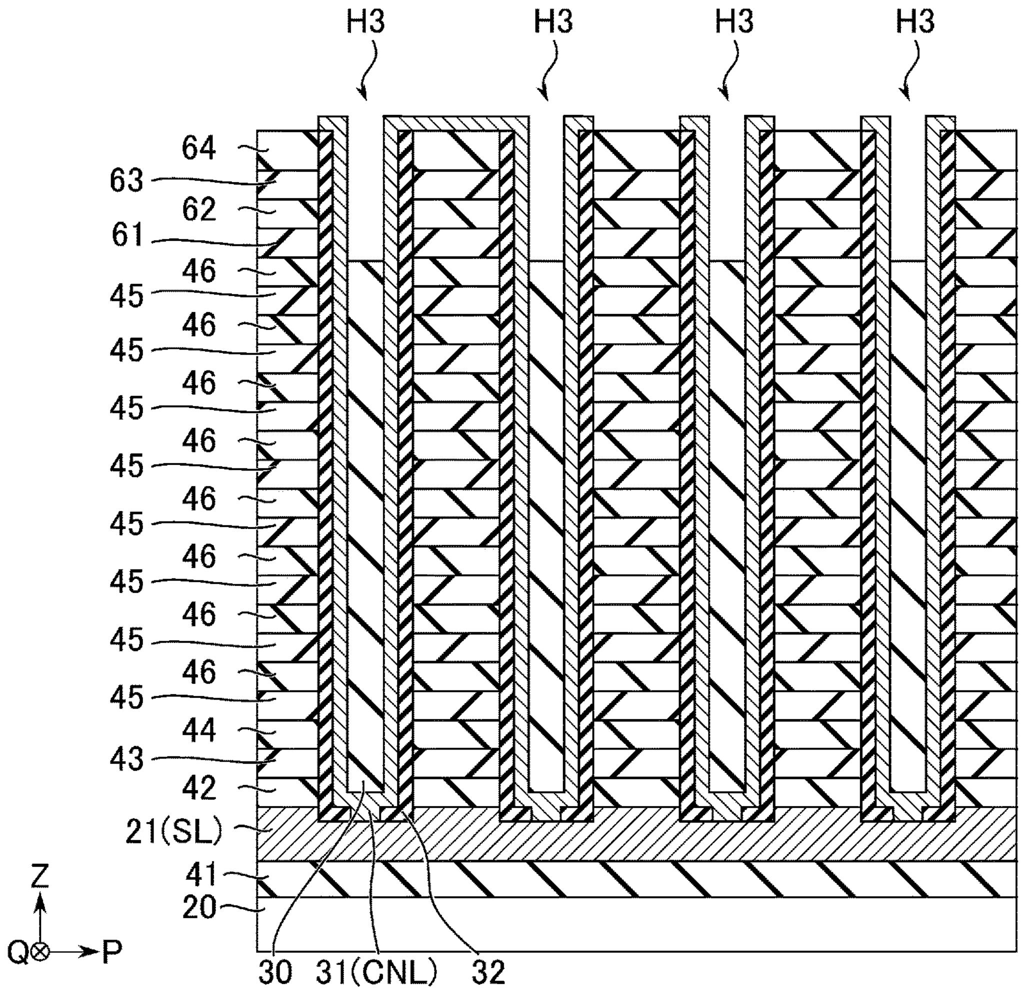

Next, as shown in FIG. 35, the semiconductor film 31A is divided to form portions each corresponding to two memory pillars MP. To be specific, for example, anisotropic etching is performed to remove portions of the semiconductor film 31A provided on the upper surface of the insulating layer 64, excluding portions which are to function as the current path selection portions CNL. As a result, the semiconductor film 31A is divided into a plurality of semiconductor films 31. Each of the semiconductor films 31 includes two portions extending in the Z direction and a portion extending in the P direction or the Q direction and intersecting the two portions extending in the Z direction.

Figure 36:
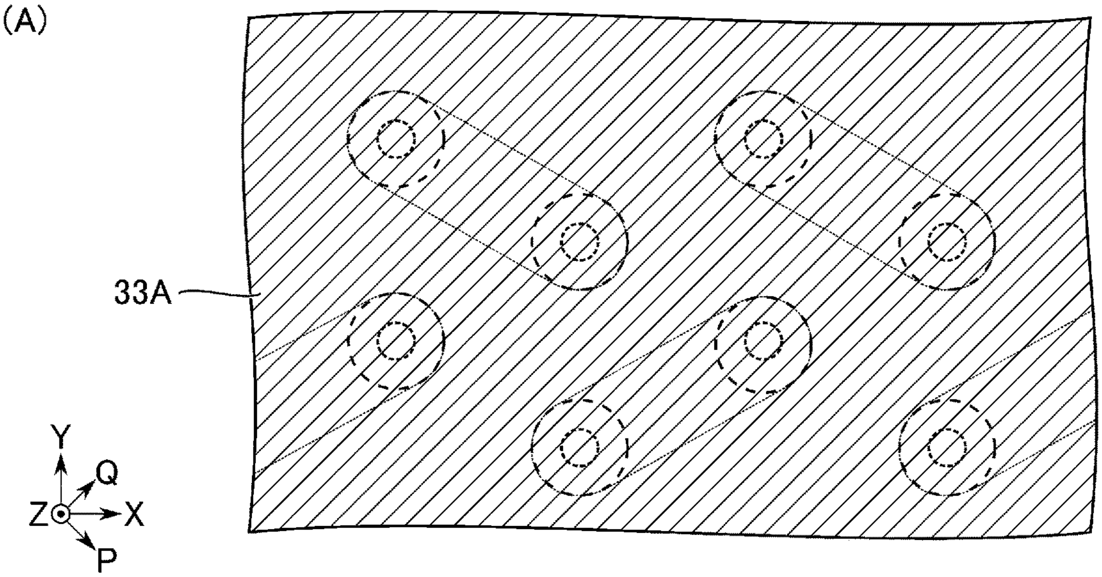
FIG. 36 is a diagram showing an example of a planar layout and a cross-sectional structure halfway through the manufacturing of the memory device according to the third embodiment.
Figure 36:
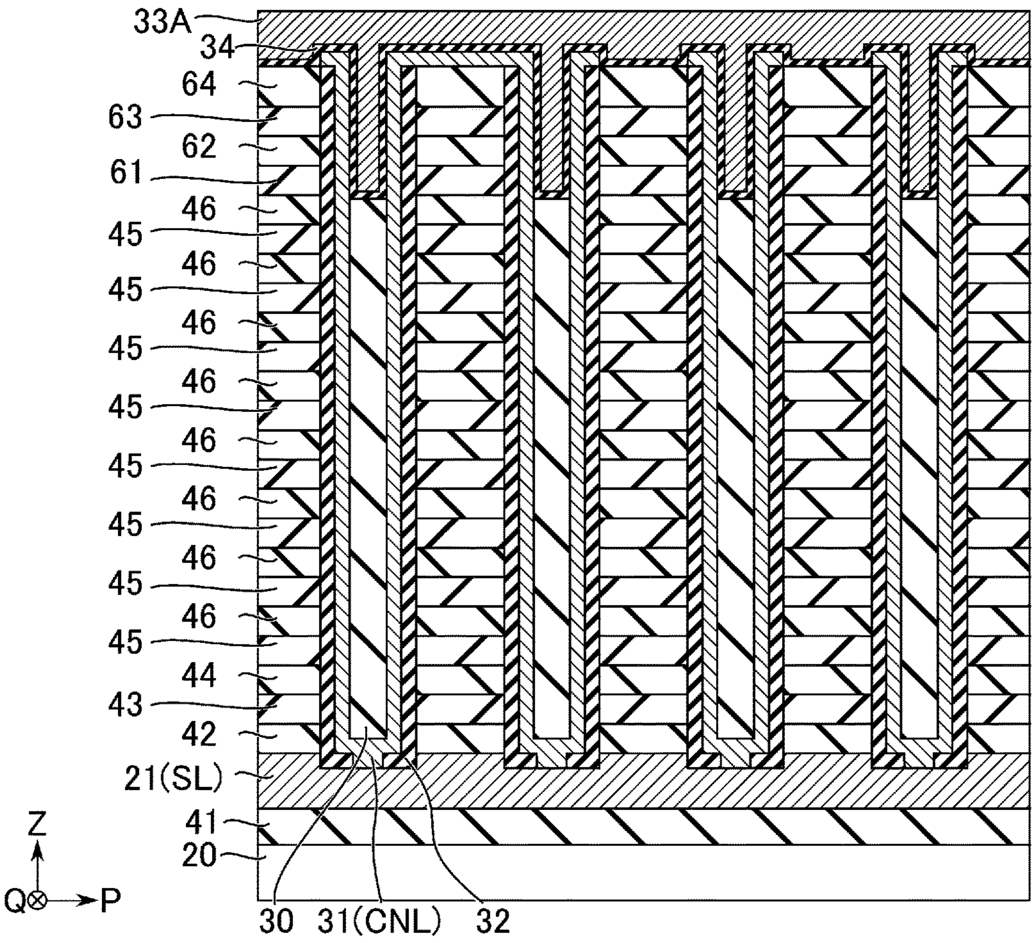

Next, as shown in FIG. 36, the insulating film 34 is formed over the upper surface of the insulating layer 64 and the side surface and the bottom surface of each of the plurality of holes H3. A conductive film 33A is formed on the upper surface of the insulating film 34 so as to fill the plurality of holes H3.

Figure 37:
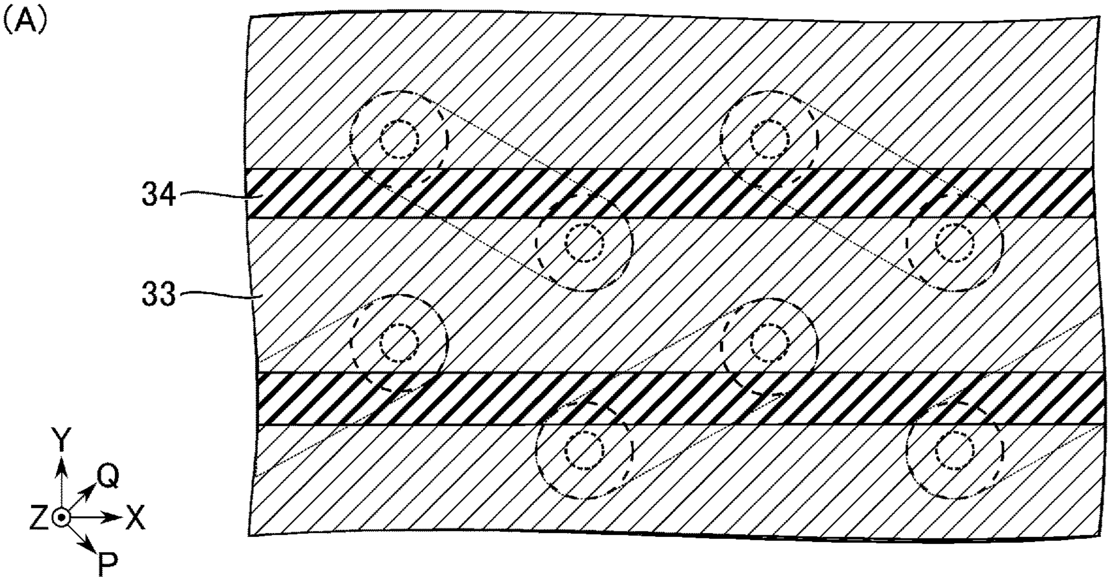
FIG. 37 is a diagram showing an example of a planar layout and a cross-sectional structure halfway through the manufacturing of the memory device according to the third embodiment.
Figure 37:
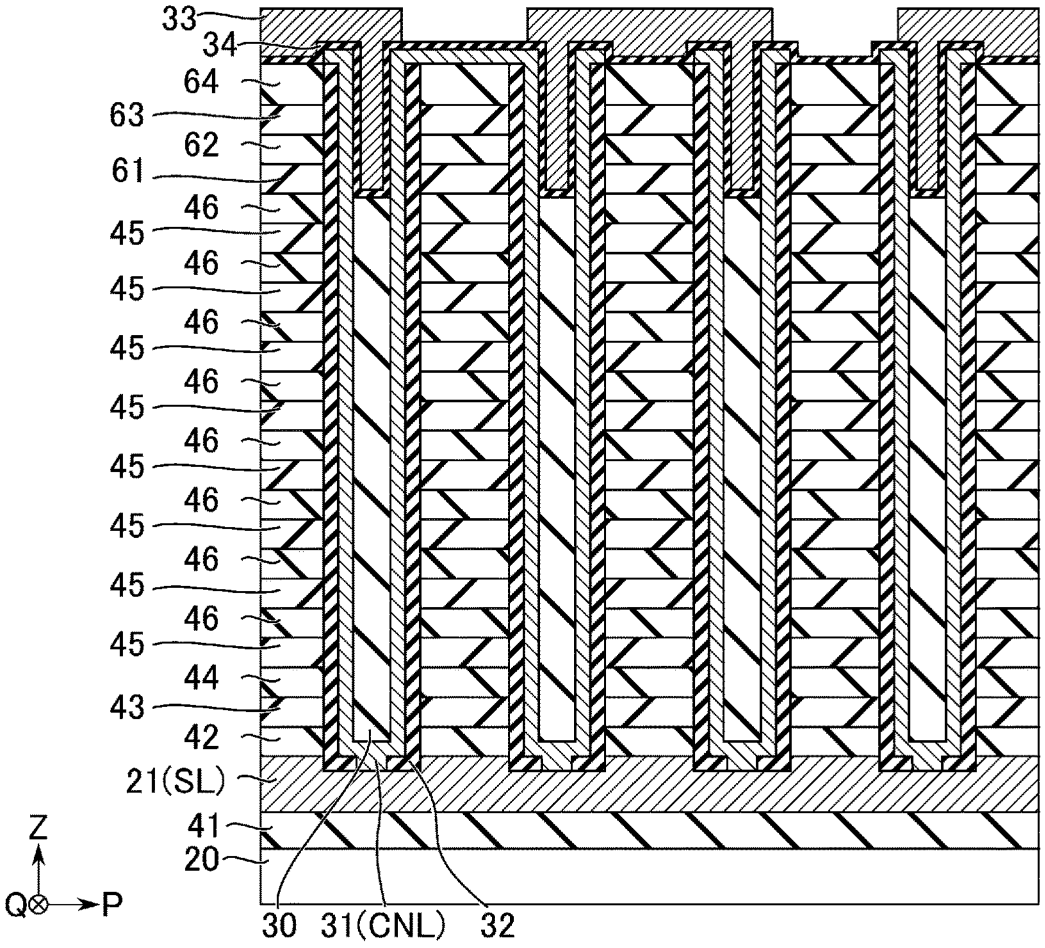

Next, as shown in FIG. 37, the conductive film 33A is divided into portions corresponding to the sub-select gate lines SGD0*a* through SGD3*b*. To be specific, for example, anisotropic etching is performed to remove portions of the conductive film 33A spreading in the XY plane, excluding portions which are to function as the sub-select gate lines SGD0*a* through SGD3*b*. As a result, the conductive film 33A is divided into a plurality of conductive films 33. Each of the conductive films 33 includes a plurality of portions extending in the Z direction and arranged in two rows along the X direction, and a portion intersecting the plurality of portions and extending in the X direction.

Figure 38:
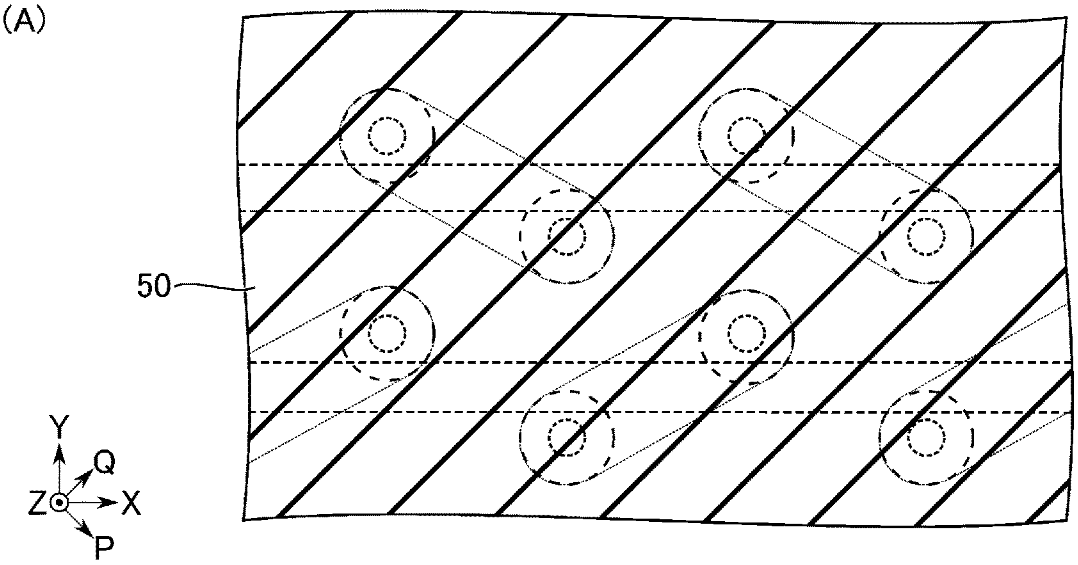
FIG. 38 is a diagram showing an example of a planar layout and a cross-sectional structure halfway through the manufacturing of the memory device according to the third embodiment.
Figure 38:
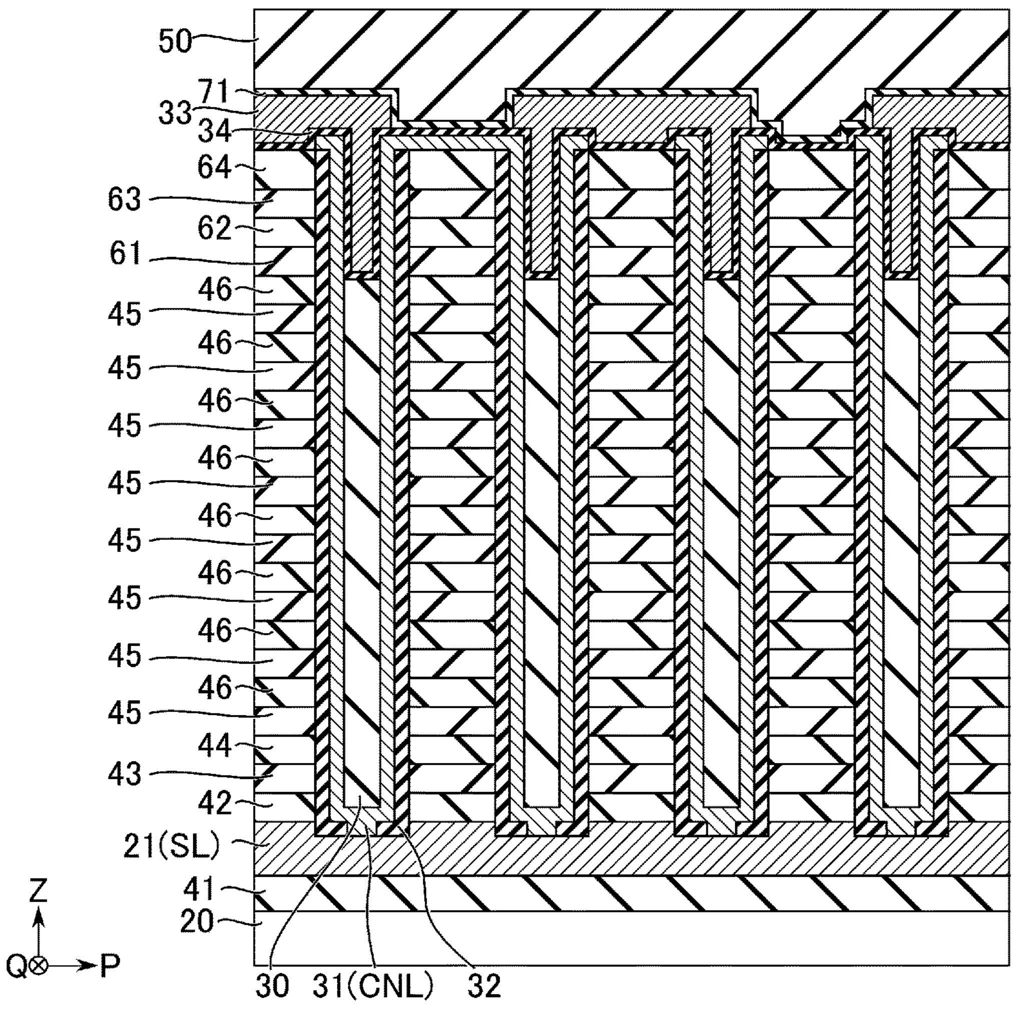

Next, as shown in FIG. 38, an insulating layer 71 is formed over the entire surface. The insulating layer 71 contains, for example, silicon carbide nitride (SiCN).

Figure 39:
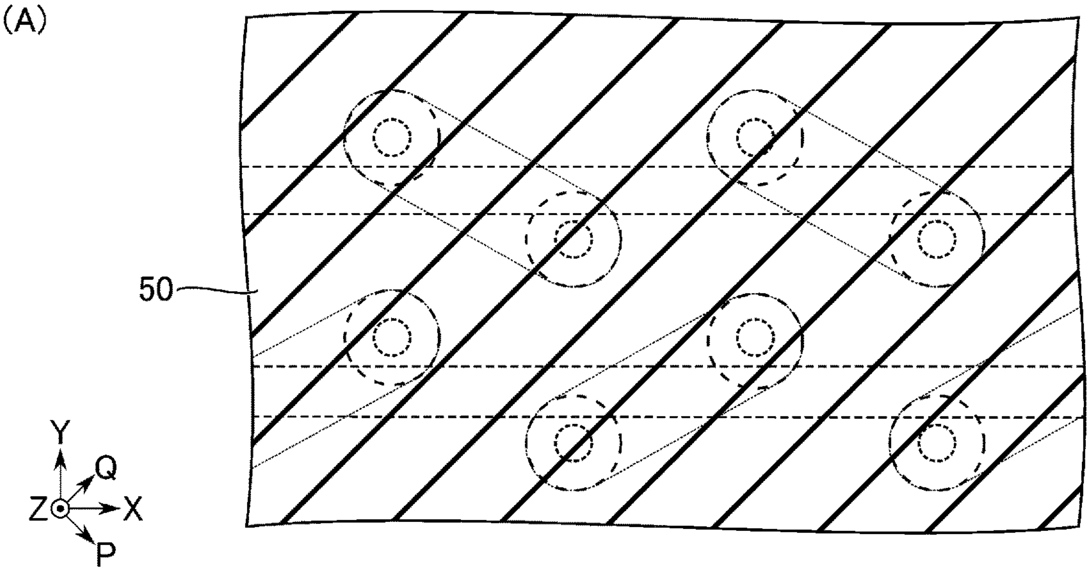
FIG. 39 is a diagram showing an example of a planar layout and a cross-sectional structure halfway through the manufacturing of the memory device according to the third embodiment.
Figure 39:
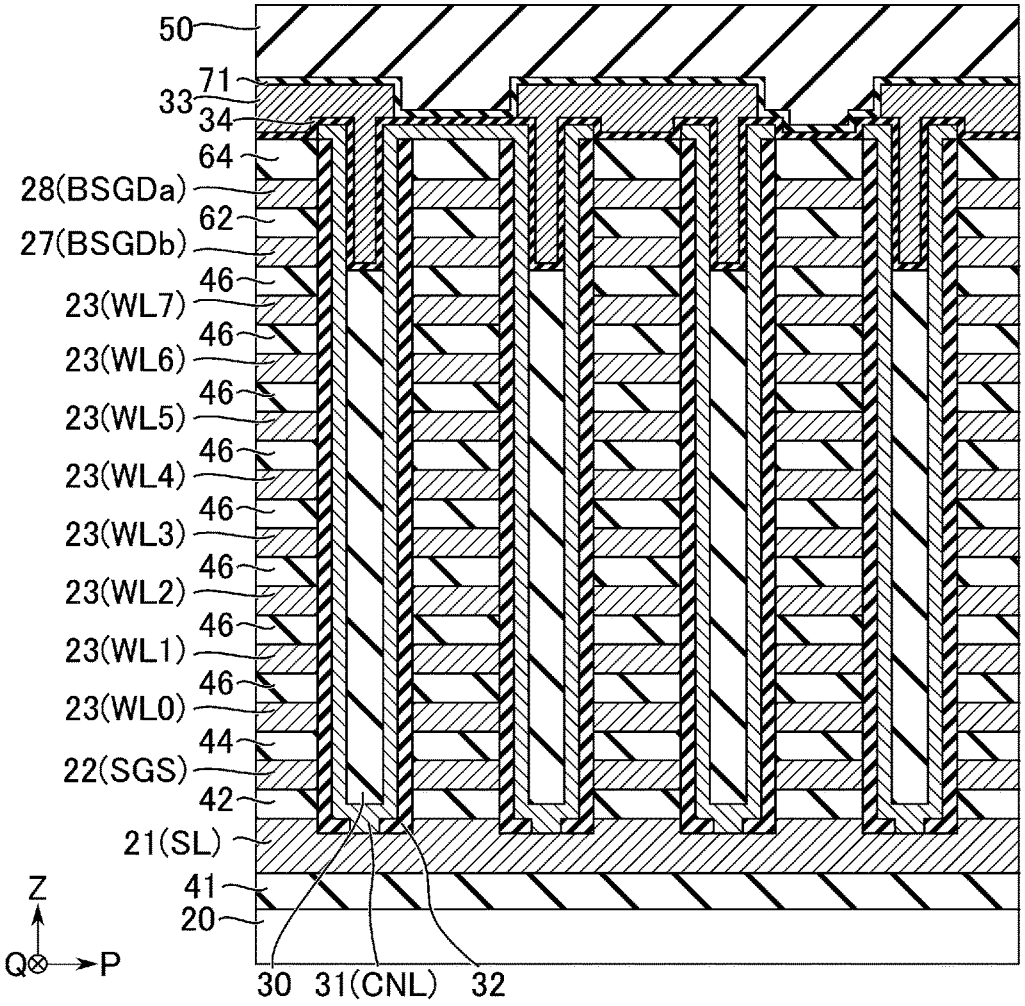

Next, a replacement process for the sacrificial members of the stacked structure is performed. Thus, as shown in FIG. 39, a stacked interconnect structure is formed. Specifically, first, an insulating layer 50 is formed over the entire surface, and thereafter, a mask having an opening in regions corresponding to the members SLT is formed by photolithography or the like in a region not shown in FIG. 39. Then, anisotropic etching is performed with the mask so that the slits (not shown) penetrating, for example, the insulating layers 42, 44, 46, 50, 62, 64, and 71, the insulating film 34, and the sacrificial members 43, 45, 61, and 63 are formed. Thereafter, the replacement process and the process of forming the member SLT are executed through steps equivalent to those of the second embodiment shown in FIG. 30.

Figure 40:
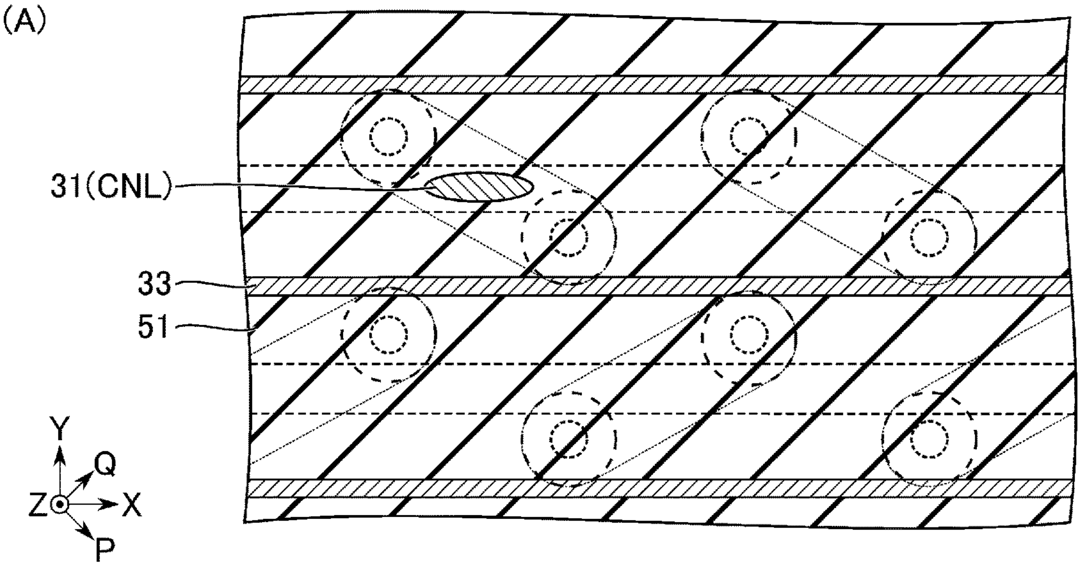
FIG. 40 is a diagram showing an example of a planar layout and a cross-sectional structure halfway through the manufacturing of the memory device according to the third embodiment.
Figure 40:
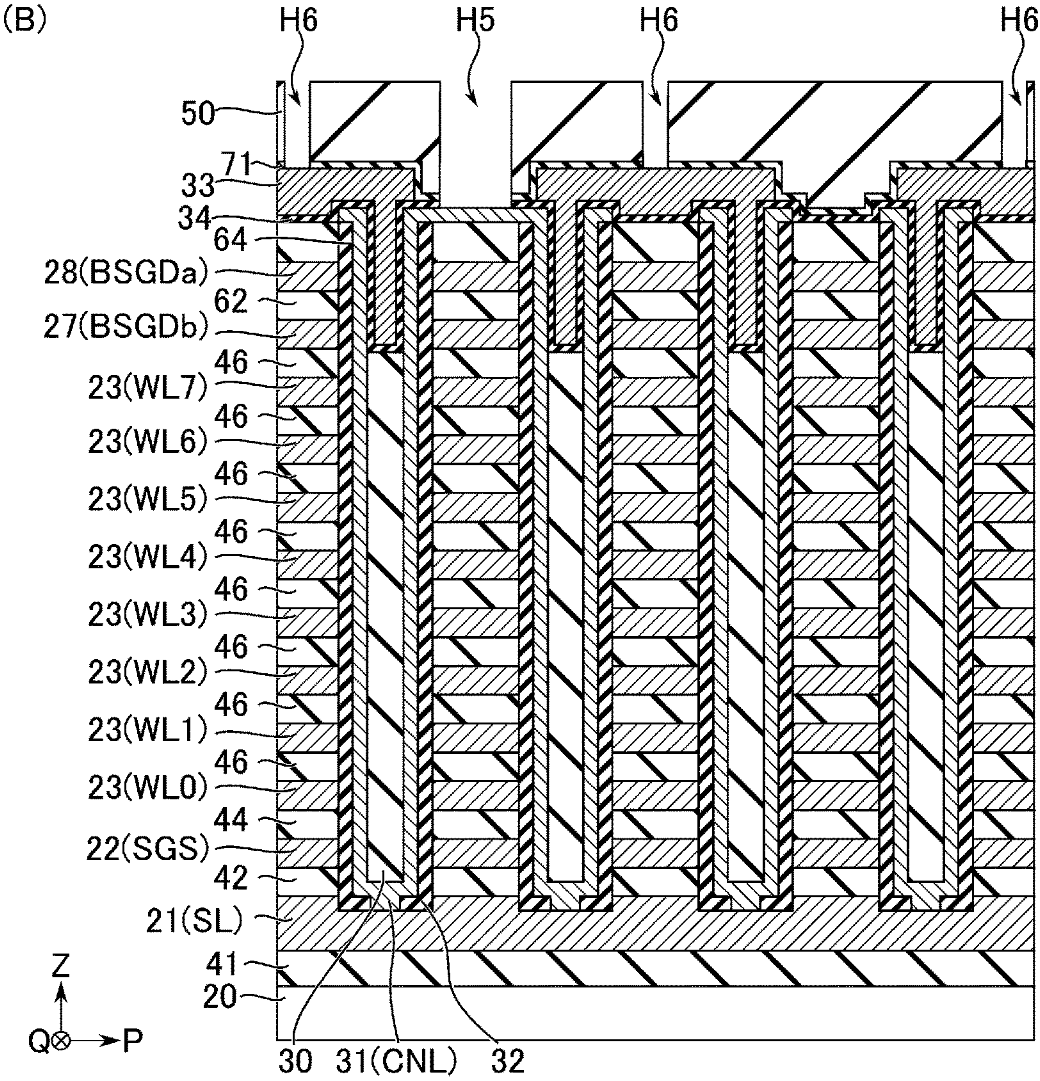

Next, as shown in FIG. 40, holes H5 and H6 are formed in regions where structures corresponding to contacts CVA and CVB are to be formed, respectively. Specifically, a mask having openings in regions corresponding to the contacts CVA and CVB is formed by photolithography or the like. Then, the holes H5 and H6 penetrating the insulating layers 50 and 71 are formed by anisotropic etching using the mask. In a bottom portion of each hole H5, a part of the portion of the semiconductor film 31 extending in the P direction or the Q direction is exposed. In a bottom portion of each hole H6, a portion of the conductive film 33 extending in the X direction is exposed. For forming the holes H5 and H6, anisotropic etching with a large selectivity ratio of silicon oxide to silicon carbide nitride is applied. As a result, the holes H5 and H6 can be formed while suppressing over-etching of the semiconductor film 31 and the conductive film 33.

Figure 41:
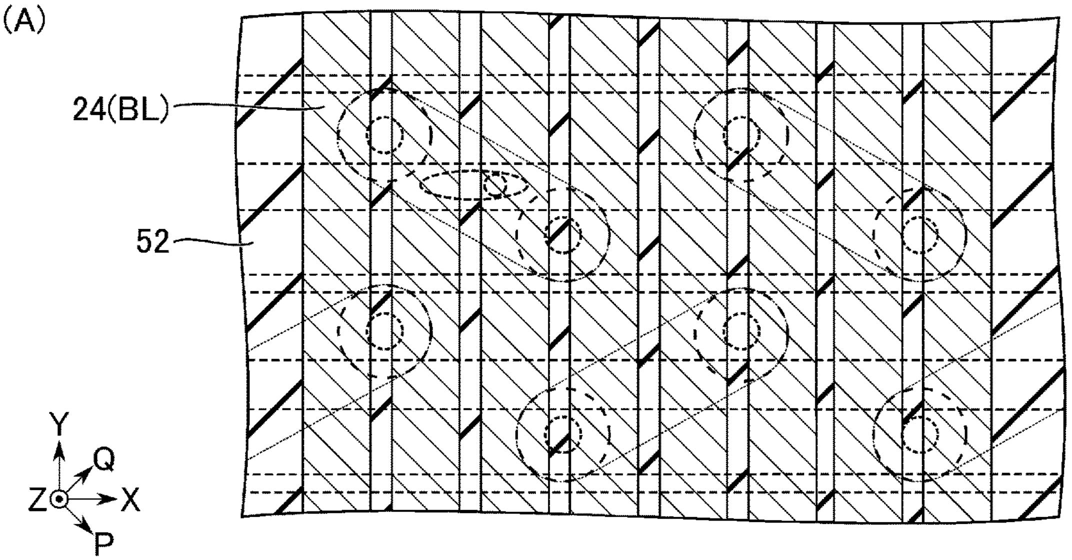
FIG. 41 is a diagram showing an example of a planar layout and a cross-sectional structure halfway through the manufacturing of the memory device according to the third embodiment.
Figure 41:
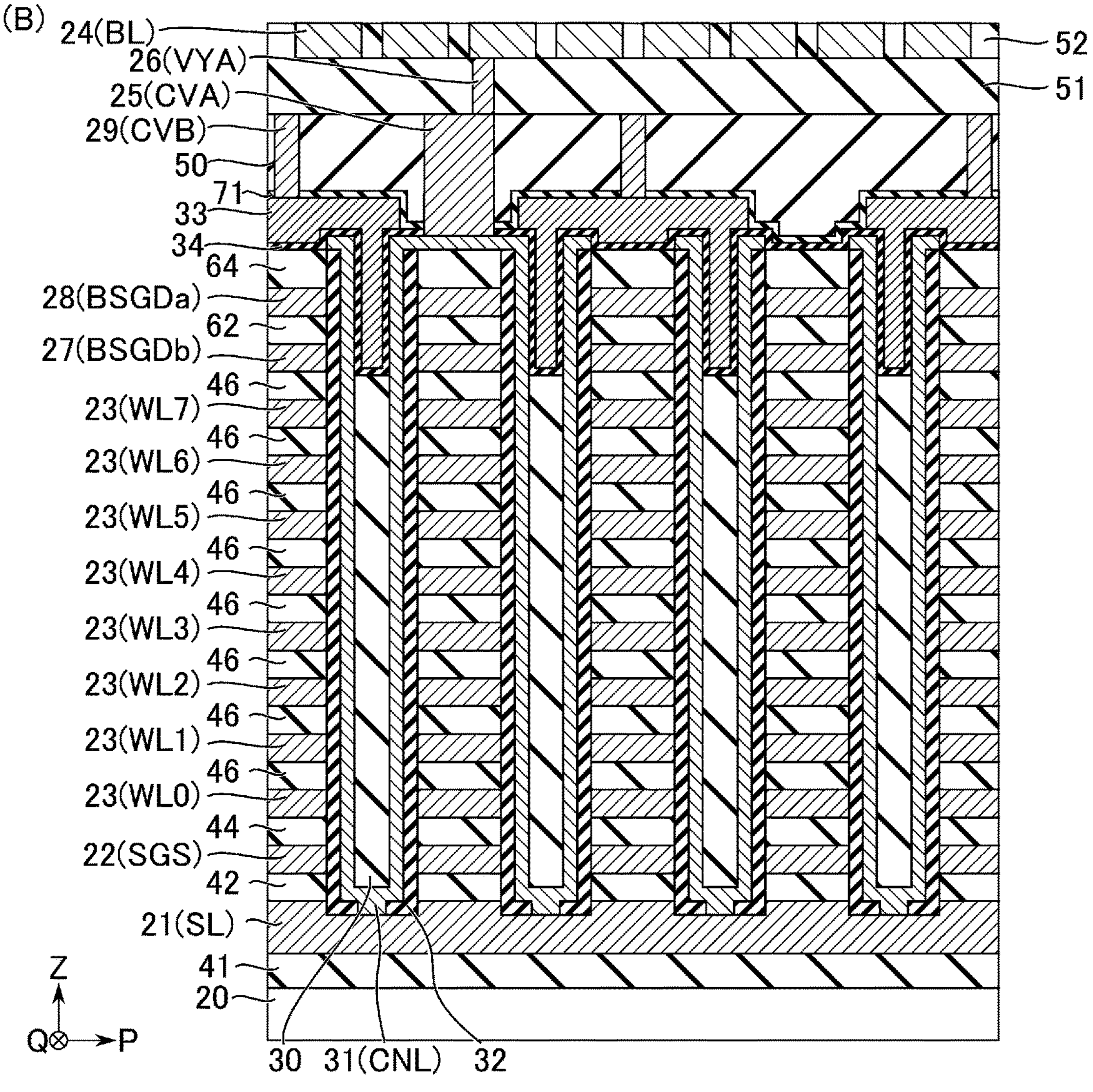

Next, as shown in FIG. 41, a plurality of contacts CVA, CVB, VYA, and VYB (not shown) and a plurality of bit lines BL are formed. To be specific, the holes H5 and the holes H6 are filled with the conductive layer 25 and the conductive layer 29, respectively. Thereafter, a process of forming the contacts VYA and VYB and the bit lines BL is executed through steps equivalent to those of the second embodiment shown in FIG. 32.

The memory cell array 10 is thus formed by the manufacturing process described above.

3.3 Advantageous Effect of Third Embodiment

According to the third embodiment, each of the portions of the seven conductive films 33 extending in the X direction and respectively corresponding to the sub-select gate lines SGD0*b* and SGD1*a* through SGD3*b* is shared by the plurality of memory pillars MP in two rows. Thus, the number of sub-select gate lines can be made smaller than the number of rows of the memory pillars MP. For this reason, it is possible to suppress the manufacturing load compared to the case where the same number of the sub-select gate lines as the number of memory pillars MP are provided.

4. Others

Note that various modifications can be applied to the first through third embodiments described above.

For example, in the first through third embodiments described above, a case where the plurality of memory pillars MP are arranged in a staggered manner has been described, but the embodiments are not limited to this case. For example, the plurality of memory pillars MP may be arranged in a lattice pattern. In this case, the P direction and the Q direction may coincide with the Y direction.

In the second embodiment described above, a case where the conductive layer 25 is shared by the four memory pillars MP belonging to different string units SU has been described, but the embodiments are not limited to this case. For example, the conductive layer 25 may be shared by three or fewer and five or more memory pillars MP. In this case, the memory pillars MP sharing the conductive layer 25 belong to string units SU different from each other. Therefore, the number of rows of the plurality of memory pillars MP in one block BLK is the square of the number of memory pillars MP sharing the conductive layer 25.

The manufacturing steps described in the first through third embodiments are merely examples, and the present invention is not limited thereto. For example, other processing steps may be inserted in the course of the manufacturing steps, or some of the processing steps may be omitted or integrated together.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The embodiments and their modifications are covered by the accompanying claims and their equivalents, as would fall within the scope and gist of the inventions.

What is claimed is:

1. A memory device comprising:

a first conductive layer having a plate shape along a plane intersecting a first direction, the first conductive layer extending in a second direction in the plane;

a first conductive film extending in the first direction above the first conductive layer;

a first semiconductor film extending in the first direction between the first conductive layer and the first conductive film and intersecting the first conductive layer;

a second semiconductor film that is in contact with the first semiconductor film, extends in the first direction between the first conductive layer and the first conductive film, and sandwiches the first conductive film in a third direction, the third direction intersecting the second direction in the plane;

a first insulating film provided between the first conductive layer and the first semiconductor film; and a second insulating film provided between the first conductive film and each of the first semiconductor film and the second semiconductor film.

2. The memory device according to claim 1, further comprising a second conductive layer continuous with the first conductive film and extending in the second direction.

3. The memory device according to claim 2, further comprising a first pillar and a second pillar, each including the first conductive film, the first semiconductor film, the second semiconductor film, the first insulating film, and the second insulating film, the first pillar and the second pillar being arranged in the second direction, wherein the second conductive layer is continuous with both of the first conductive film of the first pillar and the first conductive film of the second pillar.

4. The memory device according to claim 3, further comprising a third pillar and a fourth pillar, each including the first conductive film, the first semiconductor film, the second semiconductor film, the first insulating film, and the second insulating film, the third pillar and the fourth pillar being arranged in a third direction intersecting the first direction and the second direction, wherein the second conductive layer is continuous with both of the first conductive film of the third pillar and the first conductive film of the fourth pillar.

5. The memory device according to claim 2, further comprising:

a first semiconductor layer continuous with the second semiconductor film and extending in the third direction;

a contact that is in contact with an upper surface of the first semiconductor layer and extends in the first direction; and a third conductive layer that is in contact with an upper surface of the contact above the second conductive layer and extends in a fourth direction intersecting the second direction in the plane.

6. The memory device according to claim 5, further comprising a third insulating film provided between the second conductive layer and the contact, wherein the contact includes a portion overlapping the third insulating film in plan view.

7. The memory device according to claim 5, further comprising a fifth pillar and a sixth pillar, each including the first conductive film, the first semiconductor film, the second semiconductor film, the first insulating film, and the second insulating film, the fifth pillar and the sixth pillar being arranged in the third direction, wherein the first semiconductor layer is continuous with both of the second semiconductor film of the fifth pillar and the second semiconductor film of the sixth pillar.

8. The memory device according to claim 7, wherein the first conductive film of the fifth pillar and the first conductive film of the sixth pillar are electrically insulated from each other.

9. The memory device according to claim 7, further comprising a seventh pillar including the first conductive film, the first semiconductor film, the second semiconductor film, the first insulating film, and the second insulating film, the seventh pillar being arranged along with the fifth pillar and the sixth pillar in the third direction, wherein the first semiconductor layer is further continuous with the second semiconductor film of the seventh pillar.

10. The memory device according to claim 9, wherein the sixth pillar is adjacent to the fifth pillar and the seventh pillar in the third direction, and the contact is in contact with an upper surface of a portion of the first semiconductor layer between the fifth pillar and the sixth pillar and an upper surface of a portion of the first semiconductor layer between the sixth pillar and the seventh pillar.

11. The memory device according to claim 5, wherein the third direction and the fourth direction intersect each other.

12. The memory device according to claim 5, wherein the third direction and the fourth direction are parallel to each other.

13. The memory device according to claim 1, further comprising a fourth conductive layer and a fifth conductive layer provided above the first conductive layer and separated from each other, each intersecting the second semiconductor film and the first conductive film, wherein the second semiconductor film is provided between the first conductive film and each of the fourth conductive layer and the fifth conductive layer, and the first insulating film is provided between the second semiconductor film and each of the fourth conductive layer and the fifth conductive layer.

14. The memory device according to claim 13, wherein the first semiconductor film and the second semiconductor film are continuous with each other.

15. The memory device according to claim 13, further comprising a row decoder configured to independently apply a voltage to the fourth conductive layer and the fifth conductive layer.

16. The memory device according to claim 15, wherein the fourth conductive layer is provided between the first conductive layer and the fifth conductive layer, and the row decoder is configured to apply a first voltage to the fourth conductive layer and apply a second voltage lower than the first voltage to the fifth conductive layer in a write operation and a read operation.

17. The memory device according to claim 1, further comprising:

a fifth pillar and a sixth pillar, each including the first conductive film, the first semiconductor film, the second semiconductor film, the first insulating film, and the second insulating film, and arranged in the third direction;

a second conductive layer continuous with the first conductive film of the fifth pillar and extends in the second direction;

a sixth conductive layer continuous with the first conductive film of the sixth pillar and extending in the second direction; and a row decoder configured to independently apply a voltage to the first conductive film of the fifth pillar and the first conductive film of the sixth pillar, wherein the row decoder is configured to apply a third voltage to the first conductive film of the fifth pillar and apply a fourth voltage lower than the third voltage to the first conductive film of the sixth pillar during a write operation and a read operation.

18. The memory device according to claim 1, wherein the first insulating film includes a charge storage film.

19. The memory device according to claim 1, wherein the second semiconductor film surrounds the first conductive film viewed in the first direction.

* * * * *